United States Patent
Yamashita et al.

(10) Patent No.: US 9,520,465 B2
(45) Date of Patent: Dec. 13, 2016

(54) DIODE, SEMICONDUCTOR DEVICE, AND MOSFET

(75) Inventors: Yusuke Yamashita, Nagoya (JP); Satoru Machida, Nagakute (JP); Takahide Sugiyama, Nagakute (JP); Jun Saito, Nagoya (JP)

(73) Assignees: KABUSHIKI KAISHA TOYOTA CHUO KENKYUSHO, Nagakute (JP); TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 14/113,276

(22) PCT Filed: Jul. 27, 2012

(86) PCT No.: PCT/JP2012/004804
§ 371 (c)(1),
(2), (4) Date: Oct. 22, 2013

(87) PCT Pub. No.: WO2013/014943
PCT Pub. Date: Jan. 31, 2013

(65) Prior Publication Data
US 2014/0048847 A1    Feb. 20, 2014

(30) Foreign Application Priority Data

Jul. 27, 2011 (JP) ................................ 2011-164746
Jul. 27, 2012 (JP) ................................ 2012-166576

(51) Int. Cl.
*H01L 29/06* (2006.01)
*H01L 29/872* (2006.01)
(Continued)

(52) U.S. Cl.
CPC ....... *H01L 29/0642* (2013.01); *H01L 27/0629* (2013.01); *H01L 29/0619* (2013.01);
(Continued)

(58) Field of Classification Search
CPC .............. H01L 29/407; H01L 29/7397; H01L 26/7806; H01L 29/7813; H01L 29/872; H01L 29/0619; H01L 29/0623; H01L 29/08; H01L 29/8611; H01L 27/0629; H01L 29/0642; H01L 29/7393
(Continued)

(56) References Cited

U.S. PATENT DOCUMENTS 4,134,123 A    1/1979 Shannon
2005/0073030 A1    4/2005 Inoue et al.
(Continued)

FOREIGN PATENT DOCUMENTS

CN    1505173 A    6/2004
JP    H02-86173 A    3/1990
(Continued)

OTHER PUBLICATIONS

Nov. 11, 2014 Office Action issued in Japanese Patent Application No. 2012-166576.
(Continued)

*Primary Examiner* — Walter H Swanson
(74) *Attorney, Agent, or Firm* — Oliff PLC

(57) ABSTRACT

Disclosed is a technique capable of reducing loss at the time of switching in a diode. A diode disclosed in the present specification includes a cathode electrode, a cathode region made of a first conductivity type semiconductor, a drift region made of a low concentration first conductivity type semiconductor, an anode region made of a second conductivity type semiconductor, an anode electrode made of metal, a barrier region formed between the drift region and the anode region and made of a first conductivity type semiconductor having a concentration higher than that of the drift region, and a pillar region formed so as to connect the barrier region to the anode electrode and made of a first conduc- (Continued)

tivity type semiconductor having a concentration higher than that of the barrier region. The pillar region and the anode are connected through a Schottky junction.

6 Claims, 49 Drawing Sheets

(51) Int. Cl.
　　　H01L 29/739　　(2006.01)
　　　H01L 29/78　　(2006.01)
　　　H01L 27/06　　(2006.01)
　　　H01L 29/40　　(2006.01)
　　　H01L 29/08　　(2006.01)
　　　H01L 29/861　　(2006.01)
　　　H01L 29/36　　(2006.01)
　　　H01L 29/417　　(2006.01)
　　　H01L 29/10　　(2006.01)
　　　H01L 29/16　　(2006.01)
　　　H01L 29/20　　(2006.01)
(52) U.S. Cl.
　　　CPC .......... *H01L 29/0623* (2013.01); *H01L 29/08* (2013.01); *H01L 29/0878* (2013.01); *H01L 29/36* (2013.01); *H01L 29/407* (2013.01); *H01L 29/7393* (2013.01); *H01L 29/7397* (2013.01); *H01L 29/7806* (2013.01); *H01L 29/7813* (2013.01); *H01L 29/7839* (2013.01); *H01L 29/8611* (2013.01); *H01L 29/872* (2013.01); *H01L 29/0692* (2013.01); *H01L 29/0696* (2013.01); *H01L 29/0834* (2013.01); *H01L 29/0847* (2013.01); *H01L 29/1095* (2013.01); *H01L 29/1608* (2013.01); *H01L 29/20* (2013.01); *H01L 29/2003* (2013.01); *H01L 29/41766* (2013.01)

(58) Field of Classification Search
　　　USPC .......................................... 257/140, 288, 438
　　　See application file for complete search history.

(56) References Cited

U.S. PATENT DOCUMENTS

| 2006/0267129 A1 | 11/2006 | Inoue et al. |
| 2008/0035992 A1 | 2/2008 | Kawaguchi et al. |
| 2009/0166723 A1* | 7/2009 | Sung et al. ................. 257/328 |
| 2012/0080718 A1 | 4/2012 | Soeno |

FOREIGN PATENT DOCUMENTS

| JP | A-2000-323488 | 11/2000 |
| JP | A-2003-163357 | 6/2003 |
| JP | 2004186413 A | 7/2004 |
| JP | 2008-066708 A | 3/2008 |
| JP | 2009-267116 A | 11/2009 |
| JP | 2013051345 A | 3/2013 |
| JP | 2013051346 A | 3/2013 |
| JP | 2013222798 A | 10/2013 |
| WO | 2010/143288 A1 | 12/2010 |

OTHER PUBLICATIONS

International Search Report issued in International Patent Application No. PCT/JP2012/004804 dated Mar. 12, 2013.
Written Opinion issued in International Patent Application No. PCT/JP2012/004804 dated Mar. 12, 2013.
Jun. 2, 2015 Office Action issued in Japanese Application No. 2012-166576.
Jan. 28, 2016 Office Action issued in Chinese Patent Application No. 201280035577.5.

* cited by examiner

DIODE, SEMICONDUCTOR DEVICE, AND MOSFET

TECHNICAL FIELD

The present application relates to a diode, a semiconductor device, and a MOSFET.

BACKGROUND ART

A technique for reducing the switching loss by improving reverse recovery characteristics of a PN diode has been developed. Japanese Patent Application Laid-Open No. 2003-163357 discloses an MPS diode where a PIN diode is combined with a Schottky barrier diode. In the technique disclosed in Japanese Patent Application Laid-Open No. 2003-163357, injection of holes into an $n^-$ drift region from a p anode region is suppressed by reducing the size of the p anode region to a reach-through limit, and thus the switching loss is reduced. Japanese Patent Application Laid-Open No. 2000-323488 discloses a PIN diode provided with an n barrier region having an n type impurity with higher concentration than the concentration of an $n^-$ drift region between a p anode region and the $n^-$ drift region. In a technique disclosed in Japanese Patent Application Laid-Open No. 2000-323488, injection of holes into an $n^-$ drift region from a p anode region is suppressed by an n barrier region, and thus the switching loss is reduced.

Even in the technique disclosed in Japanese Patent Application Laid-Open No. 2003-163357 or Japanese Patent Application Laid-Open No. 2000-323488, despite only a few holes being injected into the $n^-$ drift region from the p anode region, the switching loss occurs. If injection of holes into the $n^-$ drift region is further suppressed, the switching loss of the diode may be further reduced.

SUMMARY OF INVENTION

The present specification provides a technique for solving the above problems. The present specification discloses a technique capable of reducing loss at the time of switching in a diode.

A diode disclosed in the present specification includes a cathode electrode; a cathode region made of a first conductivity type semiconductor; a drift region made of a low concentration first conductivity type semiconductor; an anode region made of a second conductivity type semiconductor; and an anode electrode made of metal. The diode includes a barrier region formed between the drift region and the anode region and made of a first conductivity type semiconductor having a concentration higher than that of the drift region; and a pillar region formed so as to connect the barrier region to the anode electrode and made of a first conductivity type semiconductor having a concentration higher than that of the barrier region. In the diode, the pillar region and the anode electrode are connected through a Schottky junction.

In the diode, when a forward bias is applied between the anode electrode and the cathode electrode, the anode electrode and the pillar region are short-circuited via the Schottky interface. The pillar region and the barrier region have substantially the same potential, and thus a potential difference between the barrier region and the anode electrode is nearly the same as voltage drop at the Schottky interface. Since the voltage drop at the Schottky interface is sufficiently smaller than a built-in voltage of a pn junction between the anode region and the barrier region, injection of holes into the drift region from the anode region is suppressed.

Next, when the voltage between the anode electrode and the cathode electrode is changed from the forward bias to a reverse bias, a reverse current is restricted by the Schottky interface between the anode electrode and the pillar region. In the diode, since injection of holes into the drift region from the anode region is suppressed when the forward bias is applied, a reverse recovery current is small, and reverse recovery time is short. According to the diode, it is possible to reduce the switching loss without performing lifetime control of the drift region.

In addition, in the diode, when the reverse bias is applied between the anode electrode and the cathode electrode, an electric field is distributed to not only a depletion layer growing from the Schottky interface between the pillar region and the anode electrode but also a depletion layer growing from the interface of the pn junction between the anode region and the barrier region. Thereby, an electric field applied to the Schottky interface between the pillar region and the anode electrode is reduced. According to the diode, it is possible to improve voltage resistance to the reverse bias.

Further, in the diode, the impurity concentration in the pillar region is higher than the impurity concentration in the barrier region. With this configuration, it is possible to decrease a potential difference between the barrier region and the anode electrode when the forward bias is applied, without reducing the thickness of the anode region. According to the diode, occurrence of reach-through for the reverse bias is suppressed, and thereby it is possible to reduce the switching loss without reducing voltage resistance.

The diode preferably further includes an electric field progress preventing region formed between the barrier region and the drift region and made of the second conductivity type semiconductor.

In the diode, when a reverse bias is applied between the anode electrode and the cathode electrode, a reverse current is restricted not only by the Schottky interface between the pillar region and the anode electrode but also by a pn junction between the drift region and the electric field progress preventing region. According to the diode, it is possible to reduce a leakage current when the reverse bias is applied.

In addition, in the diode, when the reverse bias is applied between the anode electrode and the cathode electrode, an electric field is distributed to not only a depletion layer growing from the Schottky interface between the pillar region and the anode electrode and a depletion layer growing from an interface of the pn junction between the anode region and the barrier region but also an interface of the pn junction between the drift region and the electric field progress preventing region. Thereby, an electric field applied to the Schottky interface between the pillar region and the anode electrode and an electric field applied to the pn junction between the anode region and the barrier region are reduced. According to the diode, it is possible to further improve voltage resistance to the reverse bias.

In the diode, preferably, a trench extending from the anode region to the drift region is formed, and a trench electrode which is coated with an insulating film is formed inside the trench.

In the diode, when the reverse bias is applied between the anode electrode and the cathode electrode, an electric field is concentrated on a portion around a front end of the trench electrode in the drift region, thereby reducing an electric field applied to the Schottky interface between the pillar region and the anode electrode or the interface of the pn junction between the anode region and the barrier region. According to the diode, it is possible to further improve voltage resistance to the reverse bias.

The diode preferably further includes a cathode short-circuit region partially formed in the cathode region and made of the second conductivity type semiconductor.

In the diode, when a forward bias is applied between the anode electrode and the cathode electrode, the cathode short-circuit region is formed, and thus injection of electrons into the drift region from the cathode region is suppressed. Thereby, a reverse recovery current becomes smaller when the forward bias is changed to the reverse bias, and thus reverse recovery time can be further shortened. According to the diode, it is possible to further reduce the switching loss.

The present specification discloses a semiconductor device in which the diode and an IGBT are integrally formed. In the semiconductor device, the IGBT includes a collector electrode; a collector region made of the second conductivity type semiconductor; a second drift region continuously formed from the drift region and made of a low concentration first conductivity type semiconductor; a body region made of the second conductivity type semiconductor; an emitter region made of the first conductivity type semiconductor; an emitter electrode made of metal; and a gate electrode opposite to the body region between the emitter region and the second drift region via an insulating film. In addition, in the semiconductor device, the IGBT includes a second barrier region formed between the second drift region and the body region and made of a first conductivity type semiconductor having a concentration higher than that of the second drift region; and a second pillar region formed so as to connect the second barrier region to the emitter electrode and made of a first conductivity type semiconductor having a concentration higher than that of the second barrier region. In the semiconductor device, the second pillar region and the emitter electrode are connected through a Schottky junction.

In the semiconductor device, it is possible to reduce the switching loss in both the diode and a parasitic diode of the IGBT and to thereby improve voltage resistance to the reverse bias.

The semiconductor device preferably further includes a second electric field progress preventing region formed between the second barrier region and the second drift region and made of the second conductivity type semiconductor.

In the semiconductor device, it is possible to further improve voltage resistance to the reverse bias in relation to a parasitic diode of the IGBT, and it is possible to reduce a leakage current when the reverse bias is applied. In addition, when the IGBT is driven, a current flowing from the collector electrode to the emitter electrode is suppressed by a pn junction between the electric field progress preventing region and the drift region, and thus it is possible to reduce a saturation current of the IGBT.

The present specification discloses a MOSFET. The MOSFET includes a drain electrode; a drain region made of a first conductivity type semiconductor; a drift region made of a low concentration first conductivity type semiconductor; a body region made of a second conductivity type semiconductor; a source region made of the first conductivity type semiconductor; a source electrode made of metal; a gate electrode opposite to the body region between the source region and the drift region via an insulating film; a barrier region formed between the drift region and the body region and made of a first conductivity type semiconductor having a concentration higher than that of the drift region; and a pillar region formed so as to connect the barrier region to the source electrode and made of a first conductivity type semiconductor having a concentration higher than that of the barrier region. In the MOSFET, the pillar region and the source electrode are connected through a Schottky junction.

According to the MOSFET, it is possible to reduce the switching loss of a parasitic diode and to improve voltage resistance to the reverse bias.

The MOSFET preferably further includes an electric field progress preventing region formed between the barrier region and the drift region and made of the second conductivity type semiconductor.

In the MOSFET, it is possible to further improve voltage resistance to the reverse bias and to thereby reduce a leakage current when the reverse bias is applied.

Another diode disclosed in the present specification includes a cathode electrode; a cathode region made of a first conductivity type semiconductor; a drift region made of a low concentration first conductivity type semiconductor; an anode region made of a second conductivity type semiconductor; and an anode electrode made of metal. The diode includes a barrier region formed between the drift region and the anode region and made of a first conductivity type semiconductor having a concentration higher than that of the drift region; and a pillar electrode formed so as to connect the barrier region to the anode electrode and made of metal. In the diode, the barrier region and the pillar electrode are connected through a Schottky junction.

In the diode, when a forward bias is applied between the anode electrode and the cathode electrode, the pillar electrode and the barrier region are short-circuited via the Schottky interface. At this time, a potential difference between the barrier region and the anode electrode is nearly the same as voltage drop at the Schottky interface. Since the voltage drop at the Schottky interface is sufficiently smaller than a built-in voltage of a pn junction between the anode region and the barrier region, injection of holes into the drift region from the anode region is suppressed.

Next, when the voltage between the anode electrode and the cathode electrode is changed from the forward bias to a reverse bias, a reverse current is restricted by the Schottky interface between the pillar electrode and the barrier region. In the diode, since injection of holes into the drift region from the anode region is suppressed when the forward bias is applied, a reverse recovery current is small, and reverse recovery time is short. According to the diode, it is possible to reduce the switching loss without performing lifetime control of the drift region.

In addition, in the diode, when the reverse bias is applied between the anode electrode and the cathode electrode, an electric field is distributed to not only a depletion layer growing from the Schottky interface between the barrier region and the pillar electrode but also a depletion layer growing from the interface of the pn junction between the anode region and the barrier region. Thereby, an electric field applied to the Schottky interface between the barrier region and the pillar electrode is reduced. According to the diode, it is possible to improve voltage resistance to the reverse bias.

In addition, in the diode, the pillar electrode is made of metal. With this configuration, it is possible to decrease a potential difference between the barrier region and the anode electrode when the forward bias is applied, without reducing the thickness of the anode region. According to the diode, occurrence of reach-through for the reverse bias is suppressed, and thereby it is possible to reduce the switching loss without reducing voltage resistance.

The diode preferably further includes an electric field progress preventing region formed between the barrier region and the drift region and made of the second conductivity type semiconductor.

In the diode, when a reverse bias is applied between the anode electrode and the cathode electrode, a reverse current is restricted not only by the Schottky interface between the barrier region and the pillar electrode but also by a pn junction between the drift region and the electric field progress preventing region. According to the diode, it is possible to reduce a leakage current when the reverse bias is applied.

In addition, in the diode, when the reverse bias is applied between the anode electrode and the cathode electrode, an electric field is distributed to not only a depletion layer growing from the Schottky interface between the barrier region and the pillar electrode and a depletion layer growing from an interface of the pn junction between the anode region and the barrier region but also an interface of the pn junction between the drift region and the electric field progress preventing region. Thereby, an electric field applied to the Schottky interface between the barrier region and the pillar electrode and an electric field applied to the pn junction between the anode region and the barrier region are reduced. According to the diode, it is possible to further improve voltage resistance to the reverse bias.

In the diode, preferably, a trench extending from the anode region to the drift region is formed, and a trench electrode which is coated with an insulating film is formed inside the trench.

In the diode, when the reverse bias is applied between the anode electrode and the cathode electrode, an electric field is concentrated on a portion around a front end of the trench electrode in the drift region, thereby reducing an electric field applied to the Schottky interface between the barrier region and the pillar electrode or the interface of the pn junction between the anode region and the barrier region. According to the diode, it is possible to further improve voltage resistance to the reverse bias.

The diode preferably further includes a cathode short-circuit region partially formed in the cathode region and made of the second conductivity type semiconductor.

In the diode, when a forward bias is applied between the anode electrode and the cathode electrode, the cathode short-circuit region is formed, and thus injection of electrons into the drift region from the cathode region is suppressed. Thereby, a reverse recovery current becomes smaller when the forward bias is changed to the reverse bias, and thus reverse recovery time can be further shortened. According to the diode, it is possible to further reduce the switching loss.

The present specification discloses another semiconductor device in which the diode and an IGBT are integrally formed. In the semiconductor device, the IGBT includes a collector electrode; a collector region made of the second conductivity type semiconductor; a second drift region continuously formed from the drift region and made of a low concentration first conductivity type semiconductor; a body region made of the second conductivity type semiconductor; an emitter region made of the first conductivity type semiconductor; an emitter electrode made of metal; and a gate electrode opposite to the body region between the emitter region and the second drift region via an insulating film. In the semiconductor device, the IGBT includes a second barrier region fainted between the second drift region and the body region and made of a first conductivity type semiconductor having a concentration higher than that of the second drift region; and a second pillar electrode formed so as to connect the second barrier region to the emitter electrode and made of metal. In the semiconductor device, the second barrier region and the second pillar electrode are connected through a Schottky junction.

In the semiconductor device, it is possible to reduce the switching loss in both the diode and a parasitic diode of the IGBT and to thereby improve voltage resistance to the reverse bias.

The semiconductor preferably further includes a second electric field progress preventing region formed between the second barrier region and the second drift region and made of the second conductivity type semiconductor.

In the semiconductor device, it is possible to further improve voltage resistance to the reverse bias in relation to a parasitic diode of the IGBT, and to reduce a leakage current when the reverse bias is applied. In addition, when the IGBT is driven, a current flowing from the collector electrode to the emitter electrode is suppressed by a pn junction between the electric field progress preventing region and the drift region, and thus it is possible to reduce a saturation current of the IGBT.

The present specification discloses a MOSFET. The MOSFET includes a drain electrode; a drain region made of a first conductivity type semiconductor; a drift region made of a low concentration first conductivity type semiconductor; a body region made of a second conductivity type semiconductor; a source region made of the first conductivity type semiconductor; a source electrode; and a gate electrode opposite to the body region between the source region and the drift region via an insulating film. The MOSFET includes a barrier region formed between the drift region and the body region and made of a first conductivity type semiconductor having a concentration higher than that of the drift region; and a pillar electrode formed so as to connect the barrier region to the source electrode and made of metal. In the MOSFET, the barrier region and the pillar electrode are connected through a Schottky junction.

According to the MOSFET, it is possible to reduce the switching loss of a parasitic diode and to improve voltage resistance to the reverse bias.

The MOSFET preferably further includes an electric field progress preventing region formed between the barrier region and the drift region and made of the second conductivity type semiconductor.

In the MOSFET, it is possible to further improve voltage resistance to the reverse bias and to thereby reduce a leakage current when the reverse bias is applied.

According to the technique disclosed in the present specification, it is possible to reduce loss at the time of switching in a diode.

DESCRIPTION OF EMBODIMENTS (Embodiment 1)

Figure 1:
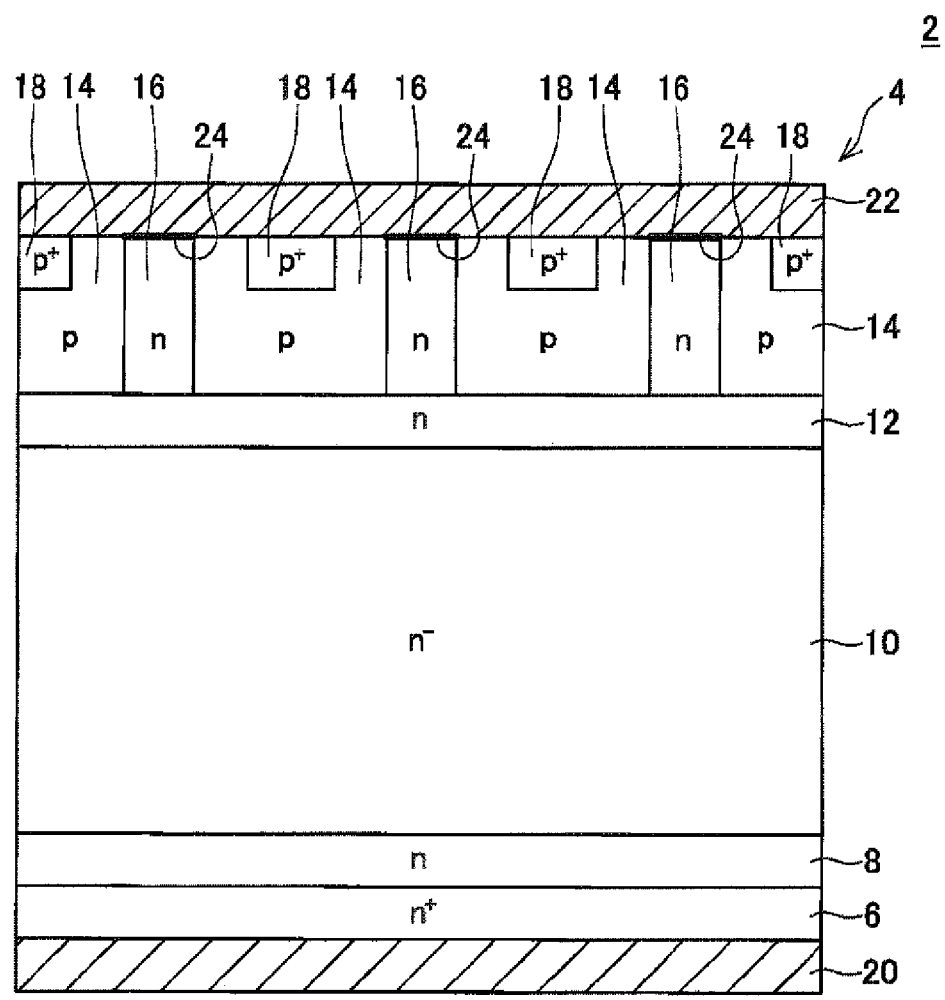
FIG. 1 is a diagram schematically illustrating a configuration of a diode 2 according to Embodiment 1.

As shown in FIG. 1, a diode 2 in this Embodiment is formed using a semiconductor substrate 4 of silicon. An $n^+$ cathode region 6 which is a high concentration n type semiconductor region, an n buffer region 8 which is an n type semiconductor region, an $n^-$ drift region 10 which is a low concentration n type semiconductor region, an n barrier region 12 which is an n type semiconductor region, and p anode regions 14 which are p type semiconductor regions are sequentially laminated on the semiconductor substrate 4. In this Embodiment, for example, phosphorous is added in the n type semiconductor region as an impurity, and, for example, boron is added in the p type semiconductor region as an impurity. In this Embodiment, an impurity concentration of the n$^+$ cathode region 6 is approximately $1\times10^{17}$ to $5\times10^{20}$ [cm$^{-3}$], the impurity concentration of the n buffer region 8 is approximately $1\times10^{16}$ to $1\times10^{19}$ [cm$^{-3}$], the impurity concentration of the n$^-$ drift region 10 is approximately $1\times10^{12}$ to $1\times10^{15}$ [cm$^{-3}$], the impurity concentration of the n barrier region 12 is $1\times10^{15}$ to $1\times10^{18}$ [cm$^{-3}$], and the impurity concentration of the p anode regions 14 is approximately $1\times10^{16}$ to $1\times10^{19}$ [cm$^{-3}$]. In addition, a thickness of the n barrier region 12 is approximately 0.5 to 3.0 [um].

On an upper surface of the semiconductor substrate 4, a plurality of n pillar regions 16 which are n type semiconductor regions is formed spaced apart from each other with a predetermined gap. The impurity concentration of the n pillar regions 16 is approximately $1\times10^{16}$ to $1\times10^{19}$ [cm$^{-3}$]. The n pillar regions 16 are formed so as to penetrate through the p anode regions 14 and reach an upper surface of the n barrier region 12. In addition, a plurality of p$^+$ contact regions 18 which are high concentration p type semiconductor regions is formed spaced apart from each other with a predetermined gap on an upper surface of the p anode regions 14. The impurity concentration of the p$^+$ contact regions 18 is approximately $1\times10^{17}$ to $1\times10^{20}$ [cm$^{-3}$]. The p anode regions 14, the n pillar regions 16, and the p$^+$ contact regions 18 are exposed on the upper surface of the semiconductor substrate 4.

A cathode electrode 20 made of metal is formed on a lower surface of the semiconductor substrate 4. The cathode electrode 20 is connected to the n$^+$ cathode region 6 through an ohmic junction. An anode electrode 22 made of metal is formed on the upper surface of the semiconductor substrate 4. The anode electrode 22 is connected to the n pillar regions 16 through Schottky junctions via Schottky interfaces 24. In this Embodiment, a barrier height of the Schottky junction is approximately 0.2 to 1.0 [eV]. The anode electrode 22 is connected to the p anode regions 14 and the p$^+$ contact regions 18 through ohmic junctions.

An operation of the diode 2 will be described. When a forward bias is applied between the anode electrode 22 and the cathode electrode 20, the anode electrode 22 and the n pillar regions 16 are short-circuited via the Schottky interfaces 24. The n pillar regions 16 and the n barrier region 12 have almost the same potential, and thus a potential difference between the n barrier region 12 and the anode electrode 22 is nearly the same as voltage drop at the Schottky interfaces 24. Since the voltage drop at the Schottky interfaces 24 is sufficiently smaller than a built-in voltage of a pn junction between the p anode regions 14 and the n barrier region 12, injection of holes into the n$^-$ drift region 10 from the p$^+$ contact regions 18 or the p anode regions 14 is suppressed. Between the anode electrode 22 and the cathode electrode 20, a forward current mainly flows via the Schottky interfaces 24 between the anode electrode 22 and the n pillar regions 16, the n pillar regions 16, the n barrier region 12, the n$^-$ drift region 10, the n buffer region 8, and the n$^+$ cathode region 6 in this order.

Next, when the voltage between the anode electrode 22 and the cathode electrode 20 is changed from the forward bias to a reverse bias, a reverse current is restricted by the Schottky interfaces 24 between the anode electrode 22 and the n pillar regions 16. As described above, in the diode 2 according to this Embodiment, since the injection of holes into the n$^-$ drift region 10 from the p$^+$ contact regions 18 and the p anode regions 14 is suppressed when the forward bias is applied, a reverse recovery current is small, and reverse recovery time is short. According to the diode 2 of this Embodiment, it is possible to reduce the switching loss without performing lifetime control of the n$^-$ drift region 10.

In the diode 2 of this Embodiment, when the reverse bias is applied between the anode electrode 22 and the cathode electrode 20, an electric field is distributed to not only depletion layers growing from the Schottky interfaces 24 between the n pillar regions 16 and the anode electrode 22 but also depletion layers growing from the interfaces of the pn junctions between the p anode regions 14 and the n barrier region 12. Thereby, an electric field applied to the Schottky interfaces 24 between the n pillar regions 16 and the anode electrode 22 is reduced. According to the diode 2 of this Embodiment, it is possible to improve voltage resistance to the reverse bias.

Figure 2:
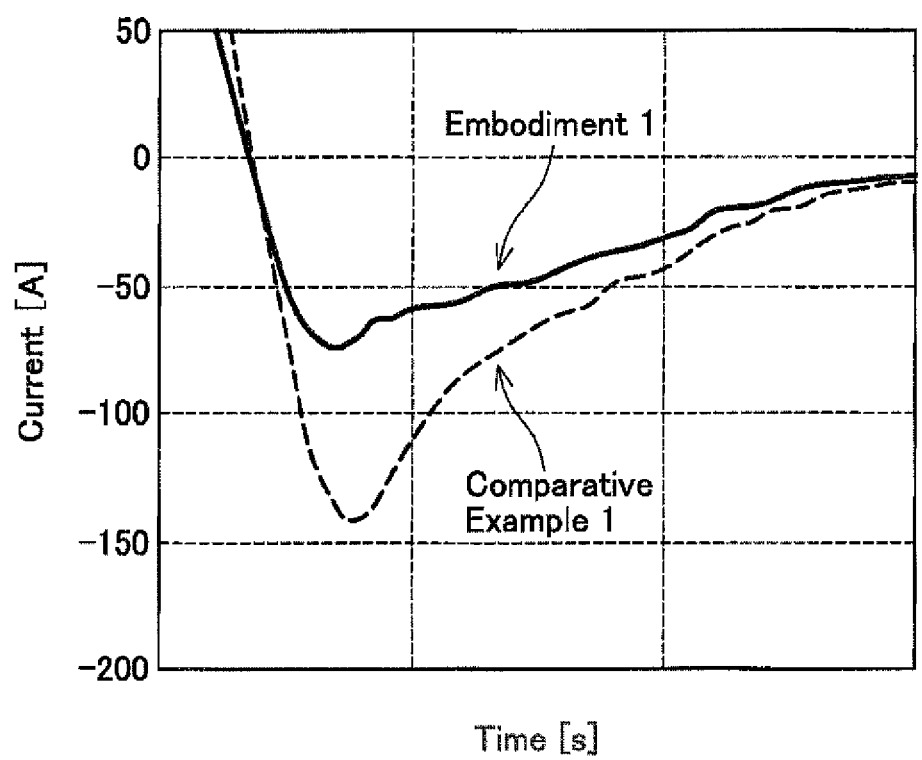
FIG. 2 is a graph for comparing the reverse recovery characteristics of the diode 2 according to Embodiment 1 and a diode 26 according to Comparative Example 1.

FIG. 2 shows a comparison of the reverse recovery characteristics of the diode 2 according to Embodiment 1 and a diode 26 of Comparative Example 1 in the related art.

Figure 3:
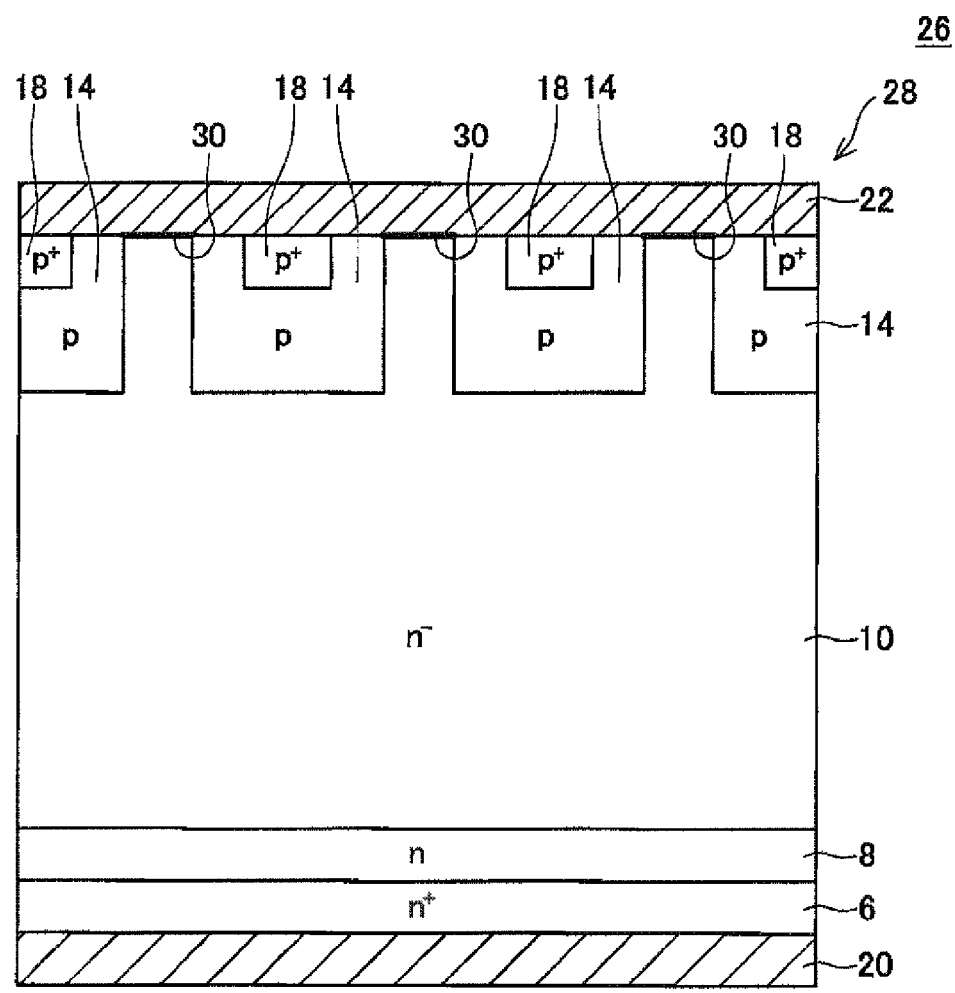
FIG. 3 is a diagram schematically illustrating a configuration of the diode 26 according to Comparative Example 1.

FIG. 3 shows a structure of the diode 26 according to Comparative Example 1. The diode 26 is formed on a semiconductor substrate 28 of silicon on which an n$^+$ cathode region 6 which is a high concentration n type semiconductor region, an n buffer region 8 which is an n type semiconductor region, and an n$^-$ drift region 10 which is a low concentration n type semiconductor region are sequentially laminated. On a surface of the n$^-$ drift region 10, a plurality of p anode regions 14 which are p type semiconductor regions is formed spaced apart from each other with a predetermined gap. In addition, a plurality of p$^+$ contact regions 18 which are high concentration p type semiconductor regions is formed spaced apart from each other with a predetermined gap on an upper surface of the p anode regions 14. A cathode electrode 20 made of metal is formed on a lower surface of the semiconductor substrate 28. The cathode electrode 20 is connected to the n$^+$ cathode region 6 through an ohmic junction. An anode electrode 22 made of metal is formed on the upper surface of the semiconductor substrate 28. The anode electrode 22 is connected to the n$^-$ drift region 10 through Schottky junctions via Schottky interfaces 30. The anode electrode 22 is connected to the p anode regions 14 and the p$^+$ contact regions 18 through ohmic junctions. In other words, the diode 26 according to Comparative Example 1 is different from the diode 2 according to Embodiment 1 in that the n barrier region 12 and the n pillar regions 16 are not provided.

As is clear from FIG. 2, the diode 2 according to Embodiment 1 has a smaller reverse recovery current and shorter reverse recovery time than the diode 26 according to Comparative Example 1. According to the diode 2 of this Embodiment, it is possible to reduce the switching loss.

In the diode 2 of this Embodiment, the impurity concentration in the n pillar regions 16 is higher than the impurity concentration in the n barrier region 12. With this configuration, it is possible to decrease a potential difference between the n barrier region 12 and the anode electrode 22 when the forward bias is applied, without reducing the thickness of the p anode region 14. According to the diode 2 of this Embodiment, occurrence of reach-through for the reverse bias is suppressed, and thereby it is possible to reduce the switching loss without reducing voltage resistance.

(Embodiment 2)

Figure 4:
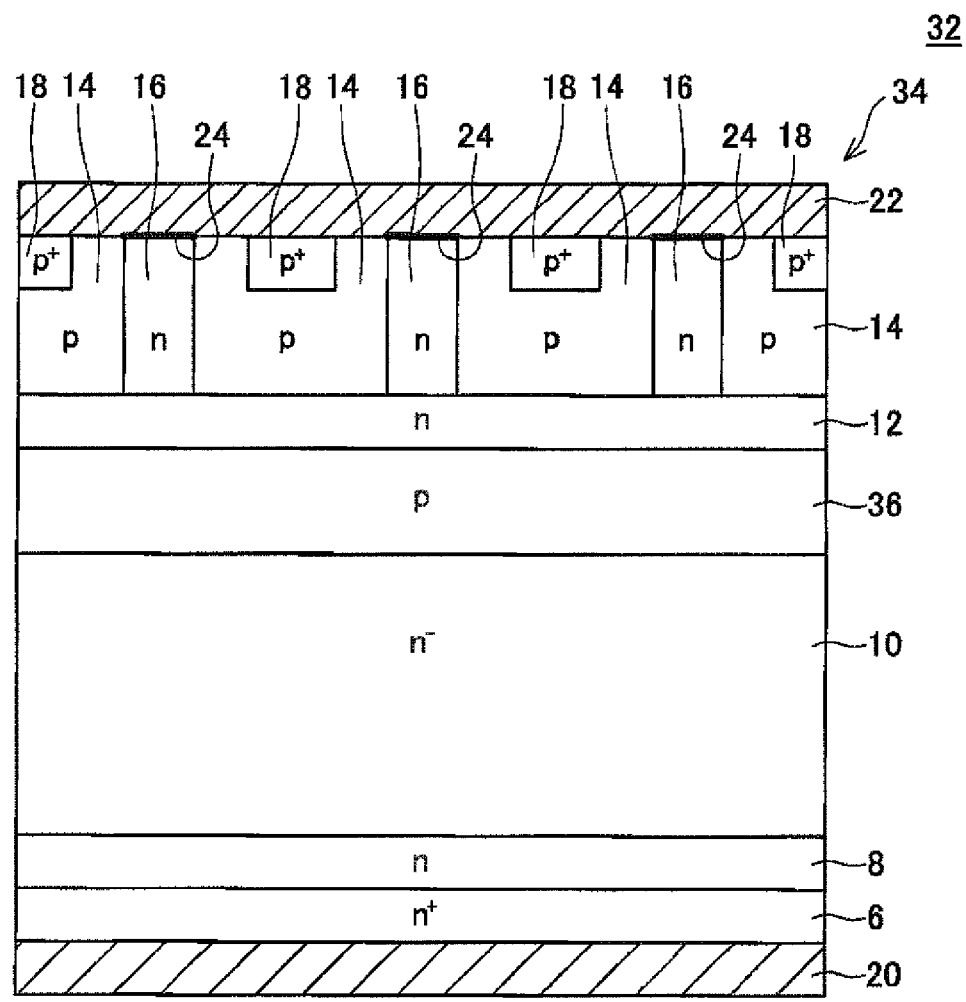
FIG. 4 is a diagram schematically illustrating a configuration of a diode 32 according to Embodiment 2.

As shown in FIG. 4, a diode 32 in this Embodiment is formed using a semiconductor substrate 34 of silicon. On the semiconductor substrate 34, an n⁺ cathode region 6 which is a high concentration n type semiconductor region, an n buffer region 8 which is an n type semiconductor region, an n⁻ drift region 10 which is a low concentration n type semiconductor region, a p electric field progress preventing region 36 which is a p type semiconductor region, an n barrier region 12 which is an n type semiconductor region, and p anode regions 14 which are p type semiconductor regions are sequentially laminated. In this Embodiment, the impurity concentration of the p electric field progress preventing region 36 is approximately $1 \times 10^{15}$ to $1 \times 10^{19}$ [cm⁻³]. Further, the thickness of the p electric field progress preventing region 36 is approximately 0.5 to 3.0 [um].

On an upper surface of the semiconductor substrate 34, a plurality of n pillar regions 16 which are n type semiconductor regions is formed spaced apart from each other with a predetermined gap. The n pillar regions 16 are formed so as to penetrate through the p anode regions 14 and reach an upper surface of the n barrier region 12. In addition, a plurality of p⁺ contact regions 18 which are high concentration p type semiconductor regions is formed spaced apart from each other with a predetermined gap on an upper surface of the p anode regions 14. The p anode regions 14, the n pillar regions 16, and the p⁺ contact regions 18 are exposed on the upper surface of the semiconductor substrate 34.

A cathode electrode 20 made of metal is formed on a lower surface of the semiconductor substrate 34. The cathode electrode 20 is connected to the n⁺ cathode region 6 through an ohmic junction. An anode electrode 22 made of metal is formed on the upper surface of the semiconductor substrate 34. The anode electrode 22 is connected to the n pillar regions 16 through Schottky junctions via Schottky interfaces 24. The anode electrode 22 is connected to the p anode regions 14 and the p⁺ contact regions 18 through ohmic junctions.

An operation of the diode 32 will be described. When a forward bias is applied between the anode electrode 22 and the cathode electrode 20, the anode electrode 22 and the n pillar regions 16 are short-circuited via the Schottky interfaces 24. The n pillar regions 16 and the n barrier region 12 have almost the same potential, and thus a potential difference between the n barrier region 12 and the anode electrode 22 is nearly the same as voltage drop at the Schottky interfaces 24. Since the voltage drop at the Schottky interfaces 24 is sufficiently smaller than a built-in voltage of a pn junction between the p anode regions 14 and the n barrier region 12, injection of holes into the n⁻ drift region 10 from the p⁺ contact regions 18 or the p anode regions 14 is suppressed. Between the anode electrode 22 and the cathode electrode 20, a forward current mainly flows via the Schottky interfaces 24 between the anode electrode 22 and the n pillar regions 16, the n pillar regions 16, the n barrier region 12, the p electric field progress preventing region 36, the n⁻ drift region 10, the n buffer region 8, and the n⁺ cathode region 6 in this order. In addition, although there is a pn junction between the n barrier region 12 and the p electric field progress preventing region 36, since a p type impurity concentration of the p electric field progress preventing region 36 is low and the thickness of the p electric field progress preventing region 36 is small, the pn junction has less influence on a forward current between the anode electrode 22 and the cathode electrode 20.

Next, when the voltage between the anode electrode 22 and the cathode electrode 20 is changed from a forward bias to a reverse bias, a reverse current is restricted by the Schottky interfaces 24 between the anode electrode 22 and the n pillar regions 16. In addition, the reverse current is also restricted by a pn junction between the n⁻ drift region 10 and the p electric field progress preventing region 36. As described above, in the diode 32 according to this Embodiment, since injection of holes into the n⁻ drift region 10 from the p⁺ contact regions 18 and the p anode regions 14 is suppressed when the forward bias is applied, a reverse recovery current is small, and reverse recovery time is short. According to the diode 32 of this Embodiment, it is possible to reduce the switching loss without performing lifetime control of the n⁻ drift region 10.

In the diode 32 of this Embodiment, when the reverse bias is applied between the anode electrode 22 and the cathode electrode 20, an electric field is distributed to not only depletion layers growing from the Schottky interfaces 24 between the n pillar regions 16 and the anode electrode 22 but also depletion layers growing from the interfaces of the pn junctions between the p anode regions 14 and the n barrier region 12 and an interface of the pn junction between the n⁻ drift region 10 and the p electric field progress preventing region 36. Thereby, an electric field applied to the Schottky interfaces 24 between the n pillar regions 16 and the anode electrode 22 and an electric field applied to the pn junction between the p anode regions 14 and the n barrier region 12 are reduced. According to the diode 32 of this Embodiment, it is possible to improve voltage resistance to the reverse bias.

Figure 5:
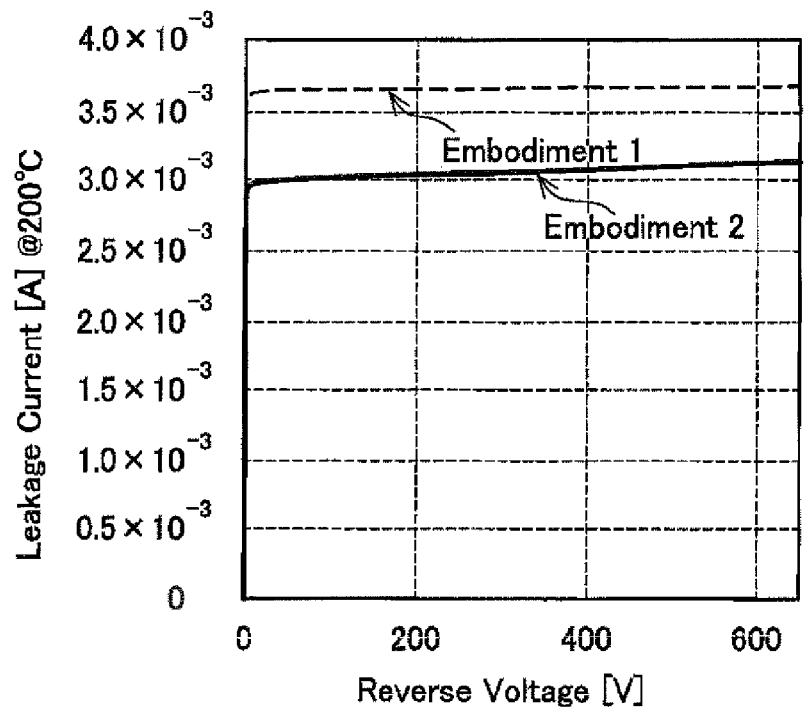
FIG. 5 is a graph for comparing leakage currents when a reverse bias is applied to the diode 2 according to Embodiment 1 and the diode 32 according to Embodiment 2.

FIG. 5 shows a comparison of leakage currents when the reverse bias is applied to the diode 2 according to Embodiment 1 and the diode 32 according to Embodiment 2. As is clear from FIG. 5, leakage currents when the reverse bias is applied are reduced more in the diode 32 according to Embodiment 2 than in the diode 2 according to Embodiment 1.

Figure 6:
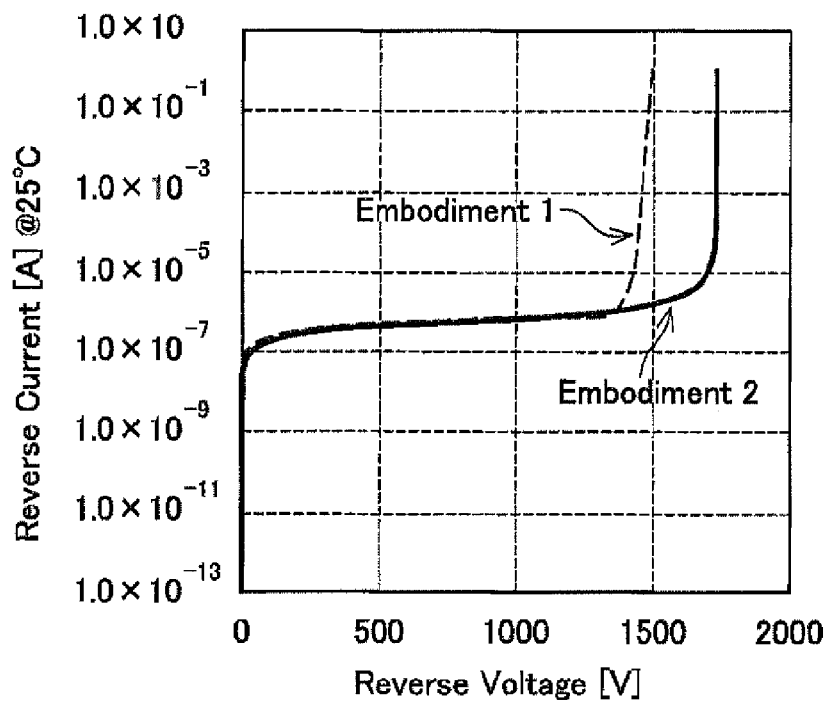
FIG. 6 is a graph for comparing voltage resistance when a reverse bias is applied to the diode 2 according to Embodiment 1 and the diode 32 according to Embodiment 2.

FIG. 6 shows a comparison of voltage resistance when the reverse bias is applied to the diode 2 according to Embodiment 1 and the diode 32 according to Embodiment 2. As is clear from FIG. 6, voltage resistance when the reverse bias is applied is improved more in the diode 32 according to Embodiment 2 than in the diode 2 according to Embodiment 1.

(Embodiment 3)

Figure 7:
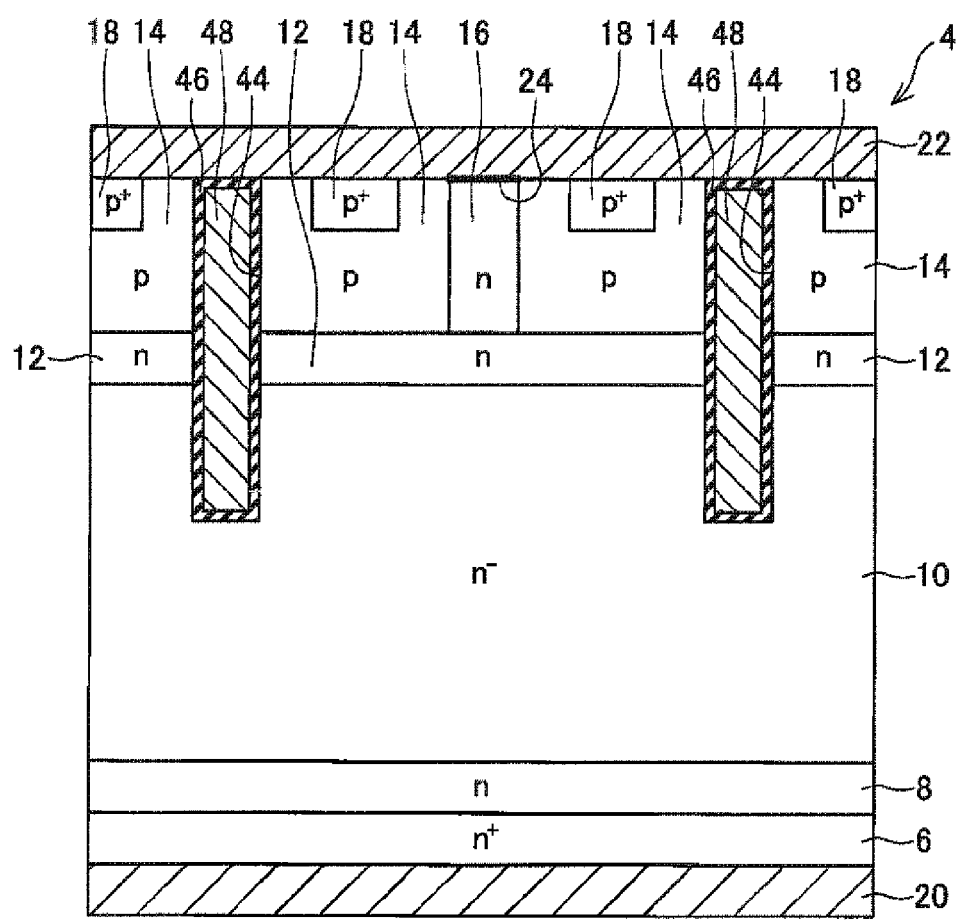
FIG. 7 is a diagram schematically illustrating a configuration of a diode 42 according to Embodiment 3.

As shown in FIG. 7, a diode 42 in this Embodiment is formed using a semiconductor substrate 4 of silicon in the same manner as the diode 2 according to Embodiment 1. On the semiconductor substrate 4, an n⁺ cathode region 6 which is a high concentration n type semiconductor region, an n buffer region 8 which is an n type semiconductor region, an n⁻ drift region 10 which is a low concentration n type semiconductor region, an n barrier region 12 which is an n type semiconductor region, and p anode regions 14 which are p type semiconductor regions are sequentially laminated. On an upper surface of the semiconductor substrate 4, a plurality of n pillar regions 16 which are n type semiconductor regions is formed spaced apart from each other with a predetermined gap. The n pillar regions 16 are formed so as to penetrate through the p anode regions 14 and reach an upper surface of the n barrier region 12. In addition, a plurality of trenches 44 is formed with a predetermined gap on the upper side of the semiconductor substrate 4. Each of the trenches 44 penetrates through the n barrier region 12 from the upper surface of the p anode regions 14 and reaches the inside of the n⁻ drift region 10. The inside of each of the trenches 44 is filled with a trench electrode 48 coated with an insulating film 46. In addition, a plurality of p⁺ contact regions 18 which are high concentration p type semiconductor regions is formed spaced apart from each other with a predetermined gap on an upper surface of the p anode regions 14.

A cathode electrode 20 made of metal is formed on a lower surface of the semiconductor substrate 4. The cathode electrode 20 is connected to the n⁺ cathode region 6 through an ohmic junction. An anode electrode 22 made of metal is formed on the upper surface of the semiconductor substrate 4. The anode electrode 22 is connected to the n pillar regions 16 through Schottky junctions via Schottky interfaces 24. The anode electrode 22 is connected to the p anode regions 14 and the p⁺ contact regions 18 through ohmic junctions.

An operation of the diode 42 of this Embodiment is almost the same as the operation of the diode 2 of Embodiment 1. In the diode 42 according to this Embodiment, when a reverse bias is applied between the anode electrode 22 and the cathode electrode 20, a voltage applied to the trench electrodes 48 is adjusted, thereby improving voltage resistance. For example, if a voltage applied to the trench electrodes 48 are adjusted such that the trench electrodes 48 have almost the same potential as the anode electrode 22 when the reverse bias is applied, an electric field is concentrated on portions around front ends of the trench electrodes 48 in the n⁻ drift region 10, and thereby an electric field applied to the Schottky interfaces 24 between the n pillar regions 16 and the anode electrode 22 or interfaces of pn junction between the p anode regions 14 and the n barrier region 12 is reduced. In addition, a potential of the trench electrodes 48 is not necessarily the same as that of the anode electrode 22. When the reverse bias is applied, a potential of the trench electrodes 48 is made to be lower than a potential of the cathode electrode 20 such that an electric field is concentrated on portions around the front ends of the trench electrodes 48, thereby reducing an electric field applied to the Schottky interfaces 24 between the n pillar regions 16 and the anode electrode 22 or the interfaces of the pn junctions between the p anode regions 14 and the n barrier region 12. According to the diode 42 of this Embodiment, it is possible to improve voltage resistance to the reverse bias.
(Embodiment 4)

Figure 8:
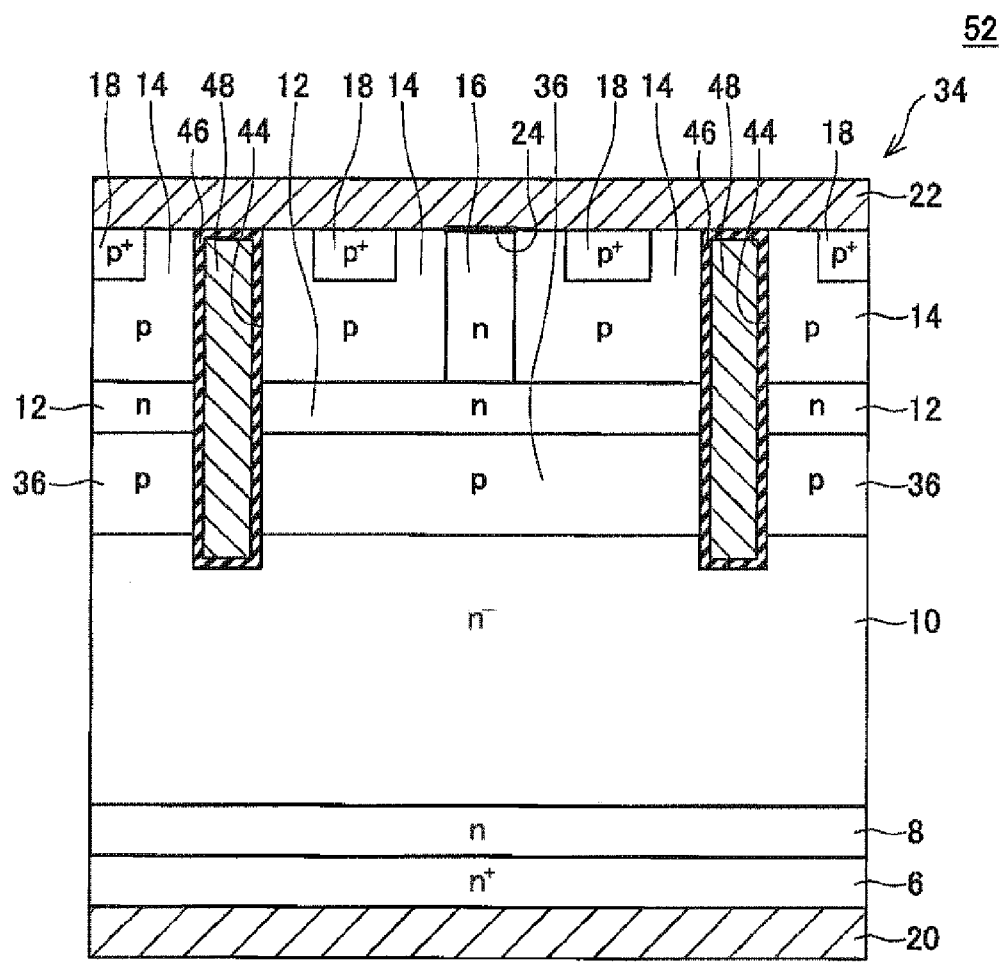
FIG. 8 is a diagram schematically illustrating a configuration of a diode 52 according to Embodiment 4.

As shown in FIG. 8, a diode 52 according to this Embodiment is formed using the semiconductor substrate 34 of silicon in the same manner as the diode 32 of Embodiment 2. On the semiconductor substrate 34, an n⁺ cathode region 6 which is a high concentration n type semiconductor region, an n buffer region 8 which is an n type semiconductor region, an n⁻ drift region 10 which is a low concentration n type semiconductor region, a p electric field progress preventing region 36 which is a p type semiconductor region, an n barrier region 12 which is an n type semiconductor region, and p anode regions 14 which are p type semiconductor regions are sequentially laminated. On an upper surface of the semiconductor substrate 34, a plurality of n pillar regions 16 which are n type semiconductor regions is formed spaced apart from each other with a predetermined gap. The n pillar regions 16 are formed so as to penetrate through the p anode regions 14 and reach an upper surface of the n barrier region 12. In addition, a plurality of trenches 44 is formed with a predetermined gap on the upper side of the semiconductor substrate 34. Each of the trenches 44 penetrates through the n barrier region 12 and the p electric field progress preventing region 36 from the upper surface of the p anode regions 14 and reaches the inside of the n⁻ drift region 10. The inside of each of the trenches 44 is filled with a trench electrode 48 coated with an insulating film 46. In addition, a plurality of p⁺ contact regions 18 which are high concentration p type semiconductor regions is formed spaced apart from each other with a predetermined gap on an upper surface of the p anode regions 14.

A cathode electrode 20 made of metal is formed on a lower surface of the semiconductor substrate 34. The cathode electrode 20 is connected to the n⁺ cathode region 6 through an ohmic junction. An anode electrode 22 made of metal is formed on the upper surface of the semiconductor substrate 34. The anode electrode 22 is connected to the n pillar regions 16 through Schottky junctions via Schottky interfaces 24. The anode electrode 22 is connected to the p anode regions 14 and the p⁺ contact regions 18 through ohmic junctions.

An operation of the diode 52 of this Embodiment is almost the same as the operation of the diode 32 of Embodiment 2. In the diode 52 according to this Embodiment, in the same manner as the diode 42 according to Embodiment 3, when a reverse bias is applied between the anode electrode 22 and the cathode electrode 20, a voltage applied to the trench electrodes 48 is adjusted, thereby improving voltage resistance. For example, if a voltage applied to the trench electrodes 48 are adjusted such that the trench electrodes 48 have almost the same potential as the anode electrode 22 when the reverse bias is applied, an electric field is concentrated on portions around front ends of the trench electrodes 48 in the n⁻ drift region 10, and thereby an electric field applied to the Schottky interfaces 24 between the n pillar regions 16 and the anode electrode 22, interfaces of pn junction between the p anode regions 14 and the n barrier region 12, or an interface of pn junction between the n⁻ drift region 10 and the p electric field progress preventing region 36 is reduced. According to the diode 52 of this Embodiment, it is possible to improve voltage resistance to the reverse bias.

Figure 9:
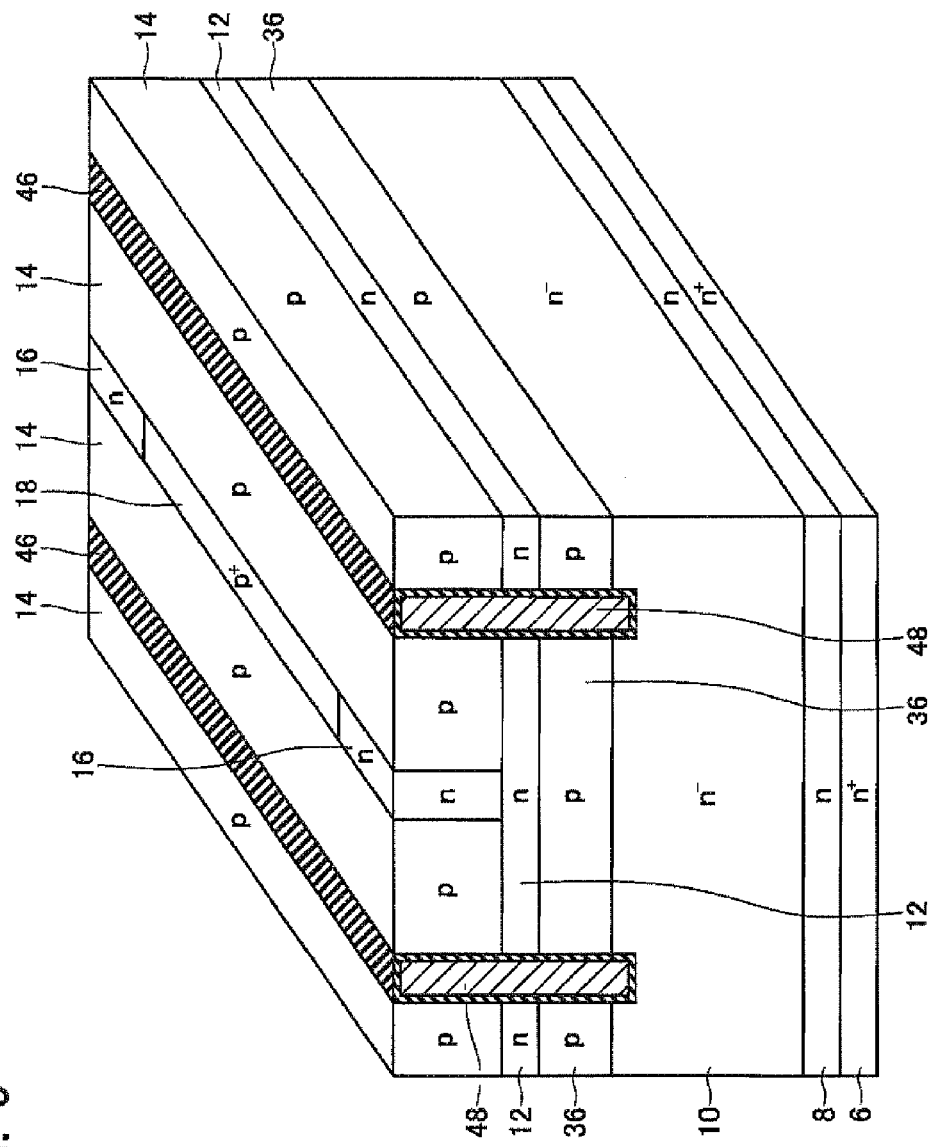
FIG. 9 is a diagram schematically illustrating another configuration of the diode 52 according to Embodiment 4.

In addition, the respective constituent elements of the diode 52 of this Embodiment may be disposed in a three-dimensional manner as shown in FIG. 9. In FIG. 9, the cathode electrode 20 and the anode electrode 22 are not shown in order to clarify the disposition of the respective constituent elements.
(Embodiment 5)

Figure 10:
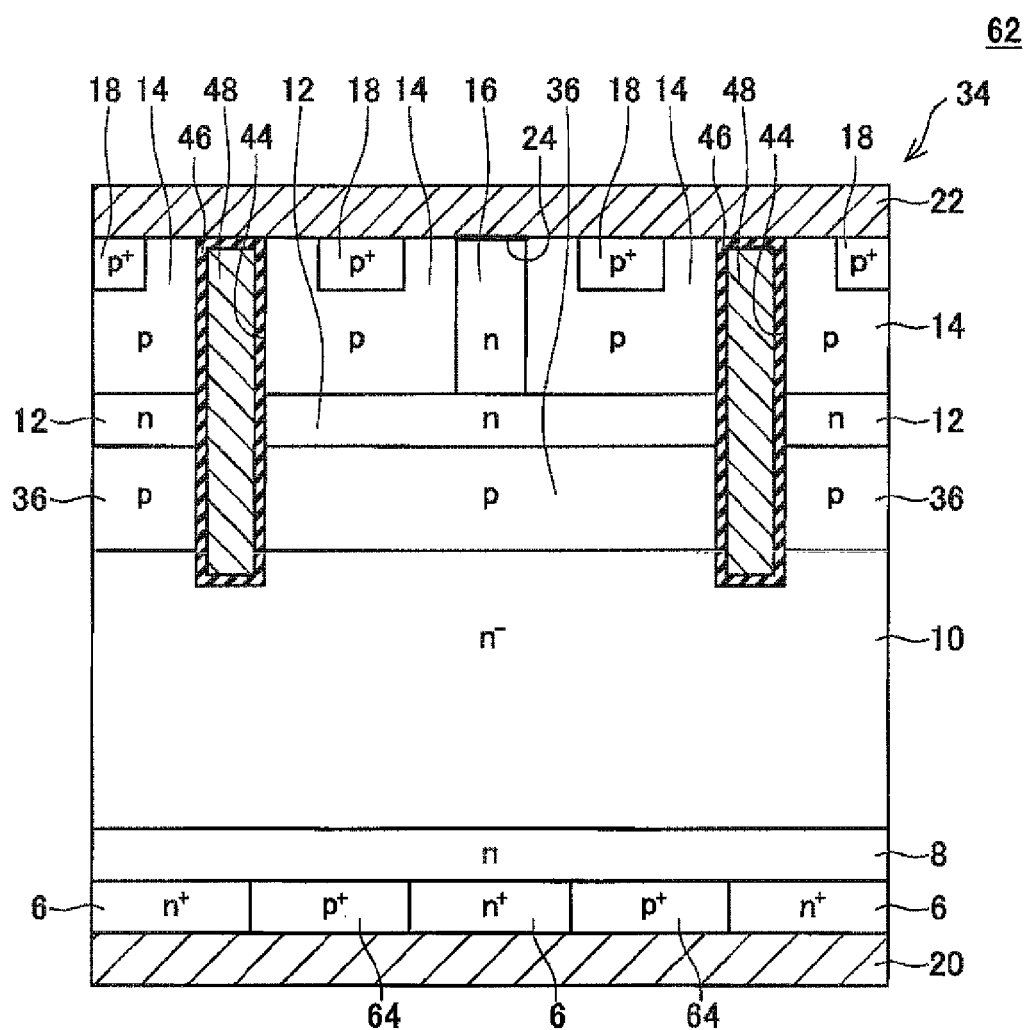
FIG. 10 is a diagram schematically illustrating a configuration of a diode 62 according to Embodiment 5.

As shown in FIG. 10, a diode 62 of this Embodiment has almost the same configuration as that of the diode 52 of Embodiment 4. The diode 62 of this Embodiment is different from the diode 52 of Embodiment 4 in that a plurality of p⁺ cathode short-circuit regions 64 which are high concentration p type semiconductor regions is formed spaced apart from each other with a predetermined gap in the n⁺ cathode region 6. In this Embodiment, the impurity concentration of the p⁺ cathode short-circuit regions 64 is approximately $1 \times 10^{17}$ to $5 \times 10^{20}$ [cm⁻³].

An operation of the diode 62 of this Embodiment is almost the same as that of the diode 52 of Embodiment 4. In the diode 62 of this Embodiment, when a forward bias is applied between the anode electrode 22 and the cathode electrode 20, the p⁺ cathode short-circuit regions 64 are formed, and thus injection of electrons into the n⁻ drift region 10 from the n⁺ cathode region 6 is suppressed. According to the diode 62 of this Embodiment, when the forward bias is applied, since not only injection of holes into the n⁻ drift region 10 from the p⁺ contact regions 18 and the p anode regions 14 is suppressed, but also injection of electrons into the n⁻ drift region 10 from the n⁺ cathode region 6 is suppressed, a reverse recovery current becomes smaller, and reverse recovery time can be further shortened. According to the diode 62 of this Embodiment, it is possible to further reduce the switching loss.

In addition, the improvement in the reverse recovery characteristics achieved by providing the p+ cathode short-circuit regions 64 as described above is also effective with diodes in other embodiments. In other words, as in a diode 66 shown in FIG. 11, in the diode 2 of Embodiment 1, the p+ cathode short-circuit regions 64 may be provided in the n+ cathode region 6. As in a diode 68 shown in FIG. 12, in the diode 32 of Embodiment 2, the p+ cathode short-circuit regions 64 may be provided in the n+ cathode region 6, and, as in a diode 70 shown in FIG. 13, in the diode 42 of this Embodiment 3, the p+ cathode short-circuit regions 64 may be provided in the n+ cathode region 6.

(Embodiment 6)

Figure 14:
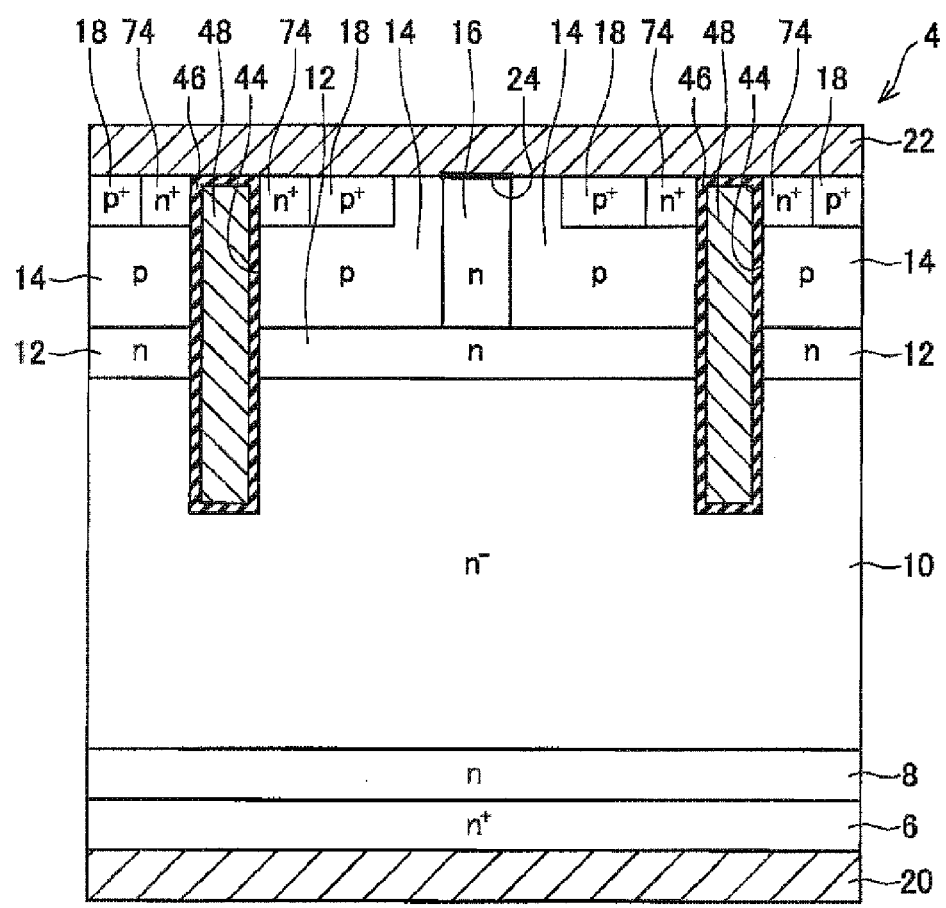
FIG. 14 is a diagram schematically illustrating a configuration of a semiconductor device 72 according to Embodiment 6.

As shown in FIG. 14, a semiconductor device 72 of this Embodiment has almost the same configuration as that of the diode 42 of Embodiment 3. In the semiconductor device 72, n+ emitter regions 74 which are high concentration n type semiconductor regions are formed at portions adjacent to the trenches 44 in the upper surface of the p anode regions 14. In this Embodiment, the impurity concentration of the n+ emitter regions 74 is approximately $1\times10^{17}$ to $5\times10^{20}$ [cm$^{-3}$]. The n+ emitter regions 74 are connected to the anode electrode 22 through ohmic junctions.

The semiconductor device 72 according to this Embodiment has a vertical MOSFET structure which includes the cathode electrode 20 corresponding to a drain electrode, the n+ cathode region 6 corresponding to a drain region, the n buffer region 8, the n− drift region 10, the p anode regions 14 corresponding to a body region, the n+ emitter regions 74 corresponding to a source region, the anode electrode 22 corresponding to a source electrode, and the trench electrodes 48, corresponding to a gate electrode, opposite to the p anode regions 14 between the n+ emitter regions 74 and the n− drift region 10 with the insulating films 46 interposed therebetween.

In the same manner as the diode 42 of Embodiment 3, according to the semiconductor device 72 of this Embodiment, the switching loss can be reduced by improving reverse recovery characteristics of a parasitic diode of the MOSFET. In addition, in the same manner as the diode 42 of Embodiment 3, according to the semiconductor device 72 of this Embodiment, it is possible to improve voltage resistance to the reverse bias.

(Embodiment 7)

Figure 15:
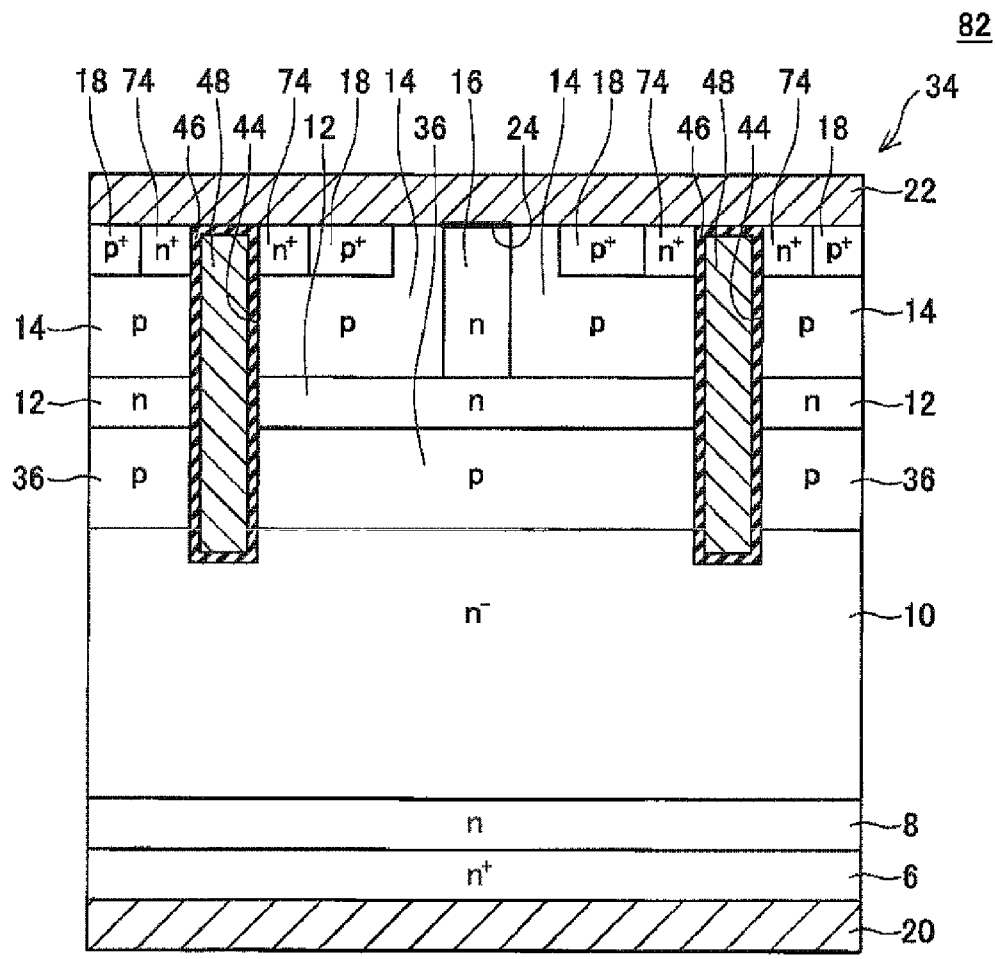
FIG. 15 is a diagram schematically illustrating a configuration of a semiconductor device 82 according to Embodiment 7.

As shown in FIG. 15, a semiconductor device 82 of this Embodiment has almost the same configuration as that of the diode 52 of Embodiment 4. In the semiconductor device 82, n+ emitter regions 74 are formed at portions adjacent to the trenches 44 in the upper surface of the p anode regions 14. The n+ emitter regions 74 are connected to the anode electrode 22 through ohmic junctions.

The semiconductor device 82 according to this Embodiment has a vertical MOSFET structure which includes the cathode electrode 20 corresponding to a drain electrode, the n+ cathode region 6 corresponding to a drain region, the n buffer region 8, the n− drift region 10, the p anode regions 14 corresponding to a body region, the n+ emitter regions 74 corresponding to a source region, the anode electrode 22 corresponding to a source electrode, and the trench electrodes 48, corresponding to a gate electrode, opposite to the p anode regions 14 between the n+ emitter regions 74 and the n− drift region 10 with the insulating films 46 interposed therebetween.

In the same manner as the diode 52 of Embodiment 4, according to the semiconductor device 82 of this Embodiment, the switching loss can be reduced by improving reverse recovery characteristics of a parasitic diode of the MOSFET. In addition, in the same manner as the diode 52 of Embodiment 4, according to the semiconductor device 82 of this Embodiment, it is possible to improve voltage resistance to the reverse bias and to thereby suppress a leakage current when the reverse bias is applied.

(Embodiment 8)

Figure 16:
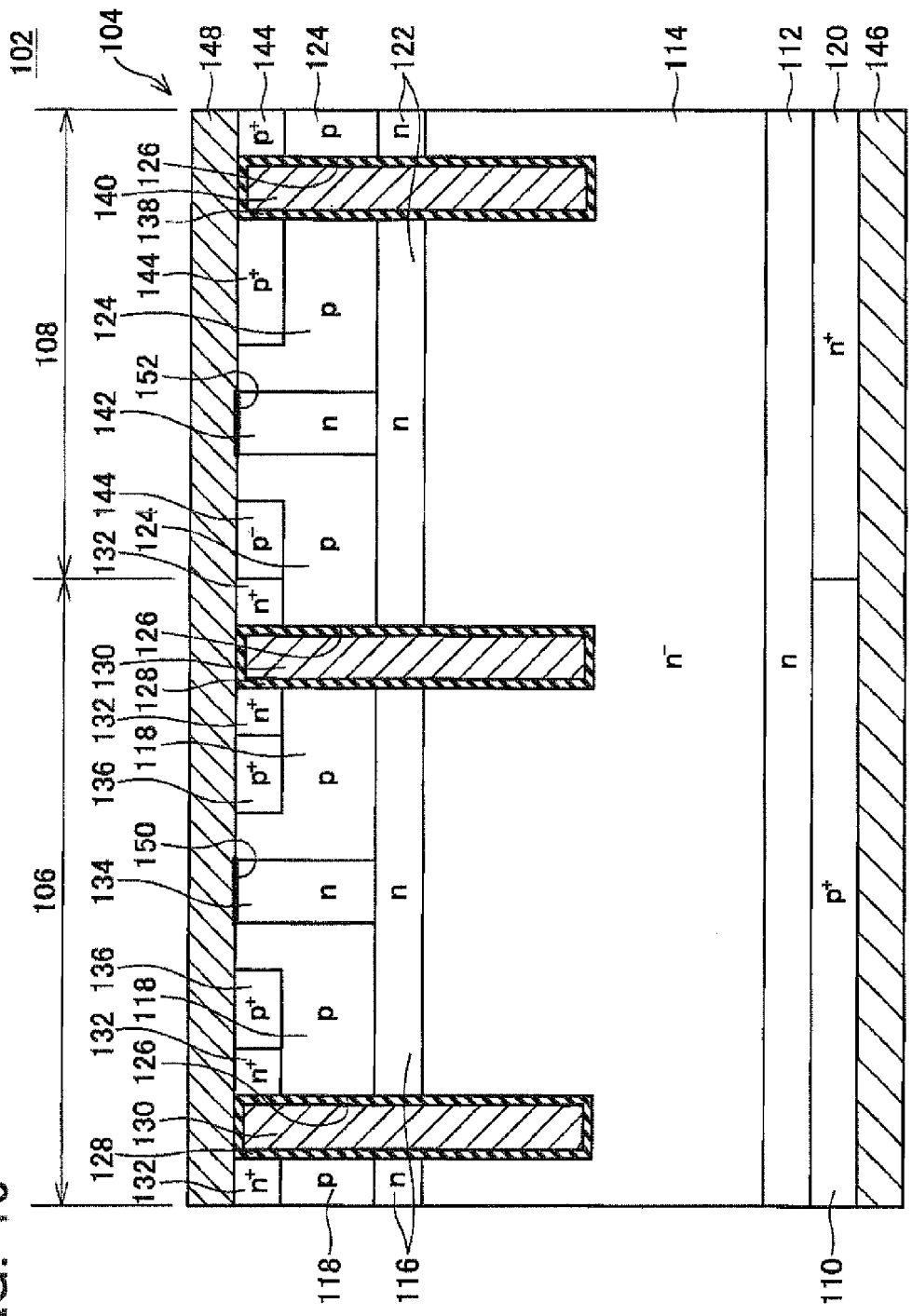
FIG. 16 is a diagram schematically illustrating a configuration of a semiconductor device 102 according to Embodiment 8.

As shown in FIG. 16, a semiconductor device 102 of this Embodiment is formed using a semiconductor substrate 104 of silicon. The semiconductor device 102 includes an IGBT region 106 and a diode region 108. In the IGBT region 106, on the semiconductor substrate 104, a p+ collector region 110 which is a high concentration p type semiconductor region, an n buffer region 112 which is an n type semiconductor region, an n− drift region 114 which is a low concentration n type semiconductor region, n barrier regions 116 which are n type semiconductor regions, and p body regions 118 which are p type semiconductor regions are sequentially laminated. In this Embodiment, the impurity concentration of the p+ collector region 110 is approximately $1\times10^{17}$ to $5\times10^{20}$ [cm$^{-3}$], the impurity concentration of the n buffer region 112 is approximately $1\times10^{16}$ to $1\times10^{19}$ [cm$^{-3}$], the impurity concentration of the n− drift region 114 is approximately $1\times10^{12}$ to $1\times10^{15}$ [cm$^{-3}$], the impurity concentration of the n barrier regions 116 is approximately $1\times10^{15}$ to $1\times10^{18}$ [cm$^{-3}$], and the impurity concentration of the p body regions 118 is approximately $1\times10^{16}$ to $1\times10^{19}$ [cm$^{-3}$]. In addition, the thickness of the n barrier region 116 is approximately 0.5 to 3.0 [um]. In the diode region 108, on the semiconductor substrate 104, an n+ cathode region 120 which is a high concentration n type semiconductor region, the n buffer region 112, the n− drift region 114, n barrier regions 122, and p anode regions 124 which are p type semiconductor regions are sequentially laminated. In this Embodiment, the impurity concentration of the n+ cathode region 120 is approximately $1\times10^{17}$ to $5\times10^{20}$ [cm$^{-3}$], the impurity concentration of the n barrier regions 122 is approximately $1\times10^{15}$ to $1\times10^{18}$ [cm$^{-3}$], and the impurity concentration of the p anode regions 124 is approximately $1\times10^{16}$ to $1\times10^{19}$ [cm$^3$]. In addition, the thickness of the n barrier region 122 is approximately 0.5 to 3.0 [um]. A plurality of trenches 126 is formed with a predetermined gap on the upper side of the semiconductor device 104.

In the IGBT region 106, the trenches 126 penetrate through the n barrier regions 116 from the upper surface of the p body regions 118 and reach the inside of the n− drift region 114. The inside of each of the trenches 126 is filled with a gate electrode 130 coated with an insulating film 128. On the upper surfaces of the p body regions 118, n+ emitter regions 132 which are high concentration n type semiconductor regions are formed at portions adjacent to the trenches 126. The impurity concentration of the n+ emitter regions 132 is approximately $1\times10^{17}$ to $5\times10^{20}$ [cm$^{-3}$]. An n pillar region 134 which is an n type semiconductor region is formed on the upper surfaces of the p body regions 118. The impurity concentration of the n pillar region 134 is approximately $1\times10^{16}$ to $1\times10^{19}$ [cm$^{-3}$]. The n pillar region 134 is formed so as to penetrate through the p body regions 118 and reach the upper surface of the n barrier region 116. In addition, p+ contact regions 136 which are high concentration p type semiconductor region are formed on the upper surfaces of the p body regions 118. The impurity concentration of the p+ contact regions 136 is approximately $1\times10^{17}$ to $1\times10^{20}$ [cm$^{-3}$].

In the diode region 108, the trenches 126 penetrates through the n barrier regions 122 from the upper surface of the p anode regions 124 and reaches the inside of the n− drift region 114. The inside of each of the trenches 126 is filled with a gate electrode 140 coated with an insulating film 138. An n pillar region 142 which is an n type semiconductor region is formed on the upper surfaces of the p anode regions 124. The impurity concentration of the n pillar region 142 is approximately $1\times10^{16}$ to $1\times10^{19}$ [cm$^{-3}$]. The n pillar region 142 is formed so as to penetrate through the p anode regions 124 and reach the upper surface of the n barrier region 122. In addition, p$^+$ contact regions 144 which are high concentration p type semiconductor region are formed on the upper surfaces of the p anode regions 124. The impurity concentration of the p$^+$ contact regions 144 is approximately $1\times10^{17}$ to $1\times10^{20}$ [cm$^{-3}$].

On the lower surface of the semiconductor substrate 104, a collector/cathode electrode 146 made of metal is formed. The collector/cathode electrode 146 is connected to the p$^+$ collector region 110 and the n$^+$ cathode region 120 through ohmic junctions. The collector/cathode electrode 146 functions as a collector electrode in the IGBT region 106, and functions as a cathode electrode in the diode region 108.

On the upper surface of the semiconductor substrate 104, an emitter/anode electrode 148 made of metal is formed. The emitter/anode electrode 148 is connected to the n pillar region 134 through a Schottky junction via a Schottky interface 150, and connected to the n pillar region 142 through a Schottky junction via a Schottky interface 152. In this Embodiment, the barrier height of each of the Schottky interface 150 and the Schottky interface 152 is 0.2 to 1.0 [eV]. In addition, the emitter/anode electrode 148 is connected to the n$^+$ emitter regions 132 and the p$^+$ contact regions 136 of the IGBT region 106 and the p$^+$ contact regions 144 of the diode region 108 through ohmic junctions. The emitter/anode electrode 148 functions as an emitter electrode in the IGBT region 106, and functions as an anode electrode in the diode region 108.

The gate electrode 130 of the IGBT region 106 is electrically connected to a first gate electrode terminal (not shown). The gate electrode 140 of the diode region 108 is electrically connected to a second gate electrode terminal (not shown).

As described above, the semiconductor device 102 has a structure in which the IGBT region 106 functioning as a trench type IGBT and the diode region 108 functioning as a free-wheeling diode are connected in reverse parallel to each other.

An operation of the semiconductor device 102 will be described. In a case where a voltage is not applied to the gate electrodes 130 and thus the IGBT region 106 is not driven, the IGBT region 106 functions as a parasitic diode. In this state, when a forward bias is applied between the emitter/anode electrode 148 and the collector/cathode electrode 146, the emitter/anode electrode 148 and the n pillar region 142 are short-circuited via the Schottky interface 152 in the diode region 108. The n pillar region 142 has almost the same potential as that of the n barrier regions 122, and thus a potential difference between the n barrier regions 122 and the emitter/anode electrode 148 is nearly the same as voltage drop at the Schottky interface 152. Since the voltage drop at the Schottky interface 152 is sufficiently smaller than a built-in voltage of a pn junction between the p anode regions 124 and the n barrier regions 122, injection of holes into the n$^-$ drift region 114 from the p$^+$ contact regions 144 or the p anode regions 124 is suppressed. In the IGBT region 106, the emitter/anode electrode 148 and the n pillar region 134 are short-circuited via the Schottky interface 150. The n pillar region 134 has almost the same potential as that of the n barrier regions 116, and thus a potential difference between the n barrier regions 116 and the emitter/anode electrode 148 is nearly the same as voltage drop at the Schottky interface 150. Since the voltage drop at the Schottky interface 150 is sufficiently smaller than a built-in voltage of a pn junction between the p body regions 118 and the n barrier regions 116, injection of holes into the n$^-$ drift region 114 from the p$^+$ contact regions 136 or the p body regions 118 is suppressed. Between the emitter/anode electrode 148 and the collector/cathode electrode 146, mainly, a forward current flows via the Schottky interface 152, the n pillar region 142, the n barrier regions 122, the n$^-$ drift region 114, the n buffer region 112, and the n$^+$ cathode region 120 of the diode region 108 in this order, and a forward current flows via the Schottky interface 150, the n pillar region 134, the n barrier regions 116, the n$^-$ drift region 114, the n buffer region 112, and the n$^+$ cathode region 120 of the IGBT region 106 in this order.

Next, when the voltage between the emitter/anode electrode 148 and the collector/cathode electrode 146 is changed from the forward bias to a reverse bias, a reverse current is restricted by the Schottky interface 152 in the diode region 108, and the Schottky interface 150 in the IGBT region 106. As described above, in the diode region 108, when the forward bias is applied, injection of holes into the n$^-$ drift region 114 from the p$^+$ contact regions 144 and the p anode regions 124 is suppressed, and, in the IGBT region 106, when the forward bias is applied, injection of holes into the n$^-$ drift region 114 from the p$^+$ contact regions 136 and the p body regions 118 is suppressed. Therefore, in the semiconductor device 102, a reverse recovery current is small, and reverse recovery time is short. According to the semiconductor device 102 of this Embodiment, it is possible to reduce the switching loss without performing lifetime control of the n$^-$ drift region 114.

In the semiconductor device 102 of this Embodiment, when the reverse bias is applied between the emitter/anode electrode 148 and the collector/cathode electrode 146, in the IGBT region 106, an electric field is distributed to not only a depletion layer growing from the Schottky interface 150 but also depletion layers growing from the interfaces of the pn junctions between the p body regions 118 and the n barrier regions 116. In addition, since an electric field is concentrated on the vicinity of the front end portions of the trenches 126 of the n$^-$ drift region 114, an electric field applied to the Schottky interface 150 and an electric field applied to the pn junctions between the p body regions 118 and the n barrier regions 116 are reduced. Similarly, in the diode region 108, an electric field is distributed to not only a depletion layer growing from the Schottky interface 152 but also depletion layers growing from the interfaces of the pn junctions between the p anode regions 124 and the n barrier regions 122. In addition, since an electric field is concentrated on the vicinity of the front end portions of the trenches 126 of the n$^-$ drift region 114, an electric field applied to the Schottky interface 152 and an electric field applied to the pn junctions between the p anode regions 124 and the n barrier regions 122 are reduced. According to the semiconductor device 102 of this Embodiment, it is possible to improve voltage resistance to the reverse bias.

Figure 43:
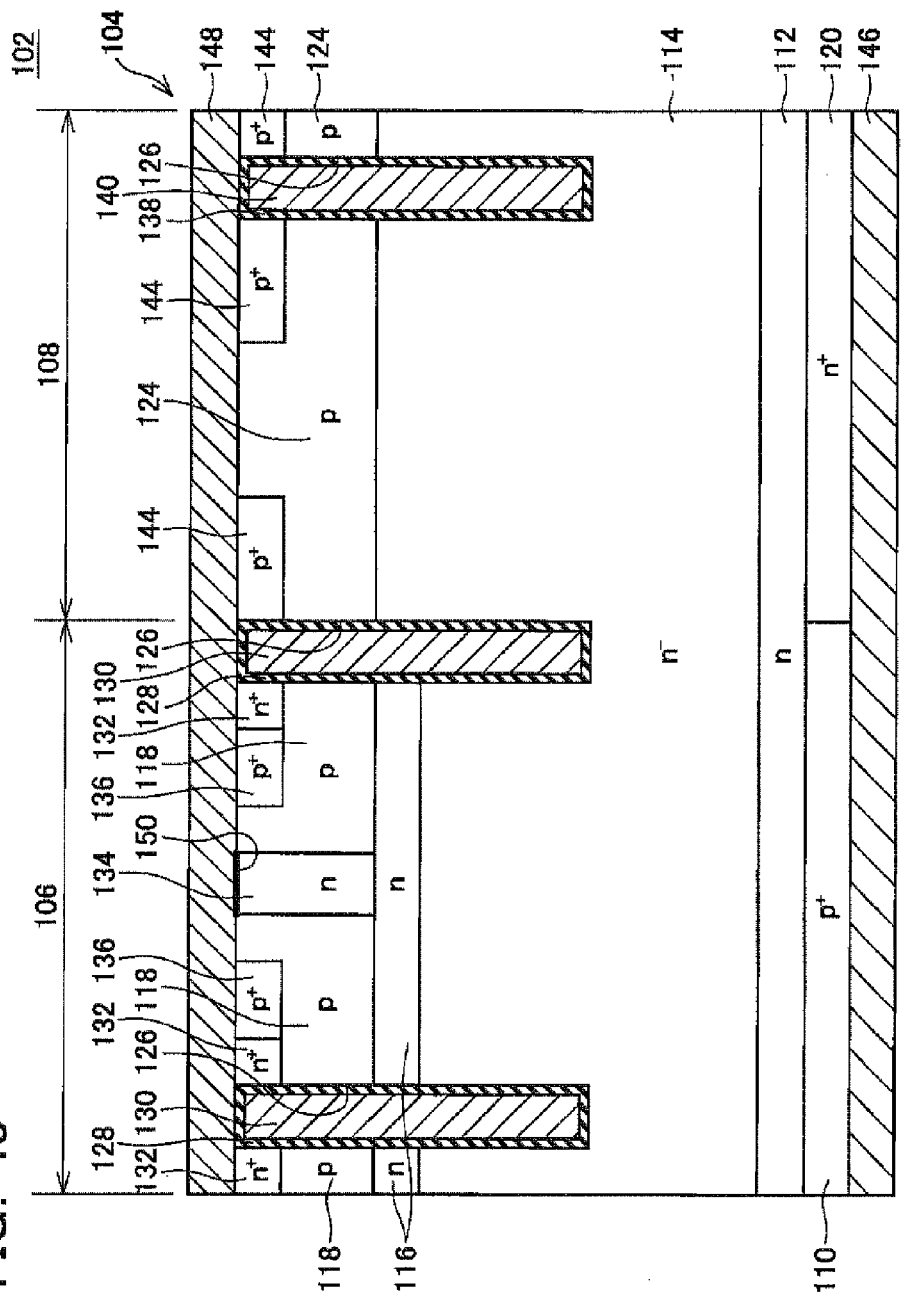
FIG. 43 is a diagram schematically illustrating another configuration of the semiconductor device 102 according to Embodiment 8.

In addition, as shown in FIG. 43, in the semiconductor device 102 of this Embodiment, there may be a configuration in which the n barrier regions 116 and the n pillar region 134 are formed in the IGBT region 106, but the n barrier regions 122 and the n pillar region 142 are not formed in the diode region 108. With this configuration as well, it is possible to reduce the switching loss in the IGBT region 106 and to thereby improve voltage resistance to the reverse bias.

(Embodiment 9)

Figure 17:
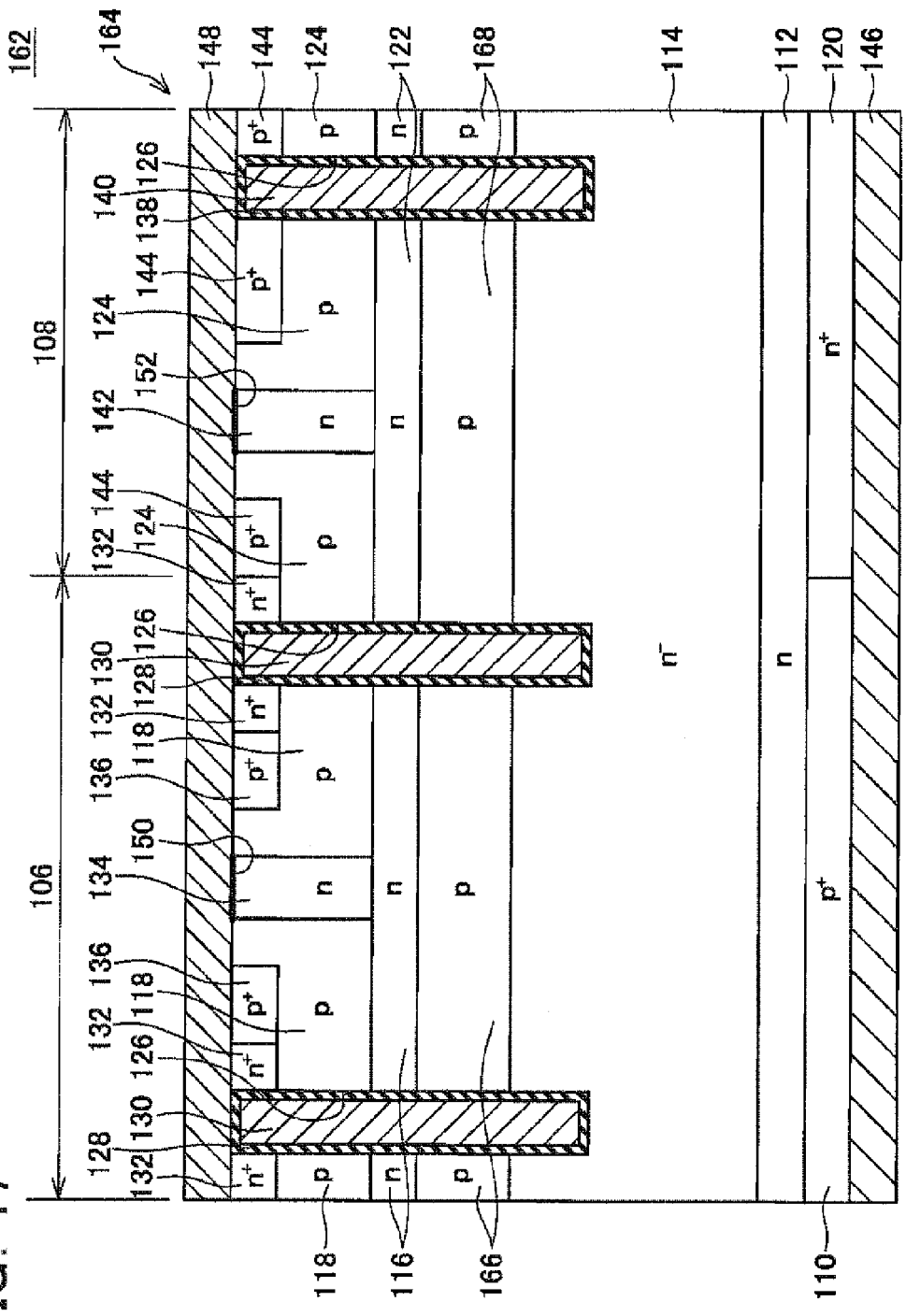
FIG. 17 is a diagram schematically illustrating a configuration of a semiconductor device 162 according to Embodiment 9.

As shown in FIG. 17, a semiconductor device 162 of this Embodiment has almost the same configuration as that of the semiconductor device 102 of Embodiment 8. A semiconductor device 162 is formed using a semiconductor substrate 164 of silicon. The semiconductor substrate 164 has almost the same configuration as that of the semiconductor substrate 104 of Embodiment 8. On the semiconductor substrate 164, in the IGBT region 106, p electric field progress preventing regions 166 which are p type semiconductor regions are formed between the n⁻ drift region 114 and the n barrier regions 116, and, in the diode region 108, p electric field progress preventing regions 168 which are p type semiconductor regions are formed between the n⁻ drift region 114 and the n barrier regions 122. The impurity concentration of the p electric field progress preventing regions 166 and the p electric field progress preventing regions 168 is approximately $1\times10^{15}$ to $1\times10^{19}$ [cm$^{-3}$]. In addition, each thickness of the p electric field progress preventing regions 166 and the p electric field progress preventing regions 168 is approximately 0.5 to 3.0 [um]. In the IGBT region 106, the trenches 126 penetrate through the n barrier regions 116 and the p electric field progress preventing regions 166 from the upper surface of the p body regions 118 and reach the inside of the n⁻ drift region 114. In the diode region 108, the trench 126 penetrates through the n barrier regions 122 and the p electric field progress preventing regions 168 from the upper surface of the p anode regions 124 and reaches the inside of the n⁻ drift region 114.

According to the semiconductor device 162 of this Embodiment, in the same manner as the semiconductor device 102 of Embodiment 8, when the forward bias is applied between the emitter/anode electrode 148 and the collector/cathode electrode 146, in the diode region 108, injection of holes into the n⁻ drift region 114 from the p⁺ contact regions 144 and the p anode regions 124 is suppressed, and, in the IGBT region 106, injection of holes into the n⁻ drift region 114 from the p⁺ contact regions 136 and the p body regions 118 is suppressed. Therefore, when the forward bias is changed to the reverse bias, it is possible to reduce a reverse recovery current and to thereby shorten reverse recovery time. Accordingly, it is possible to reduce the switching loss.

In the semiconductor device 162 of this Embodiment, when the reverse bias is applied between the emitter/anode electrode 148 and the collector/cathode electrode 146, in the IGBT region 106, an electric field is distributed to not only a depletion layer growing from the Schottky interface 150 and depletion layers growing from the interfaces of the pn junctions between the p body regions 118 and the n barrier regions 116 but also depletion layers growing from the interfaces of the pn junctions between the n⁻ drift region 114 and the p electric field progress preventing regions 166. In addition, since an electric field is concentrated on the vicinity of the front end portions of the trenches 126 of the n⁻ drift region 114, an electric field applied to the Schottky interface 150, an electric field applied to the pn junctions between the p body regions 118 and the n barrier regions 116, and an electric field applied to the interfaces of the pn junctions between the n⁻ drift region 114 and the p electric field progress preventing regions 166 are reduced. Similarly, in the diode region 108, an electric field is distributed to not only a depletion layer growing from the Schottky interface 152 and depletion layers growing from the interfaces of the pn junctions between the p anode regions 124 and the n barrier regions 122 but also depletion layers growing from the interfaces of the pn junctions between the n⁻ drift region 114 and the p electric field progress preventing regions 168. In addition, since an electric field is concentrated on the vicinity of the front end portions of the trenches 126 of the n⁻ drift region 114, an electric field applied to the Schottky interface 152, an electric field applied to the pn junctions between the p anode regions 124 and the n barrier regions 122, and an electric field applied to the pn junctions between the n⁻ drift region 114 and the p electric field progress preventing regions 168 are reduced. According to the semiconductor device 162 of this Embodiment, it is possible to improve voltage resistance to the reverse bias.

In addition, according to the semiconductor device 162 of this Embodiment, when the reverse bias is applied between the emitter/anode electrode 148 and the collector/cathode electrode 146, in the diode region 108, a reverse current is restricted by the pn junctions between the p electric field progress preventing regions 168 and the n⁻ drift region 114, and thus a leakage current passing through the Schottky interface 152 is reduced, and, in the IGBT region 106, a reverse current is restricted by the pn junctions between the p electric field progress preventing regions 166 and the n⁻ drift region 114, a leakage current passing through the Schottky interface 150 is reduced. According to the semiconductor device 162 of this Embodiment, it is possible to reduce a leakage current when the reverse bias is applied.

In addition, in the semiconductor device 162 of this Embodiment, in a case where the IGBT region 106 is driven by applying a voltage to the gate electrodes 130 of the IGBT region 106, a current flowing from the collector/cathode electrode 146 to the emitter/anode electrode 148 is suppressed by the p electric field progress preventing regions 166 in the IGBT region 106, and thus it is possible to reduce a saturation current of the IGBT region 106.

Figure 18:
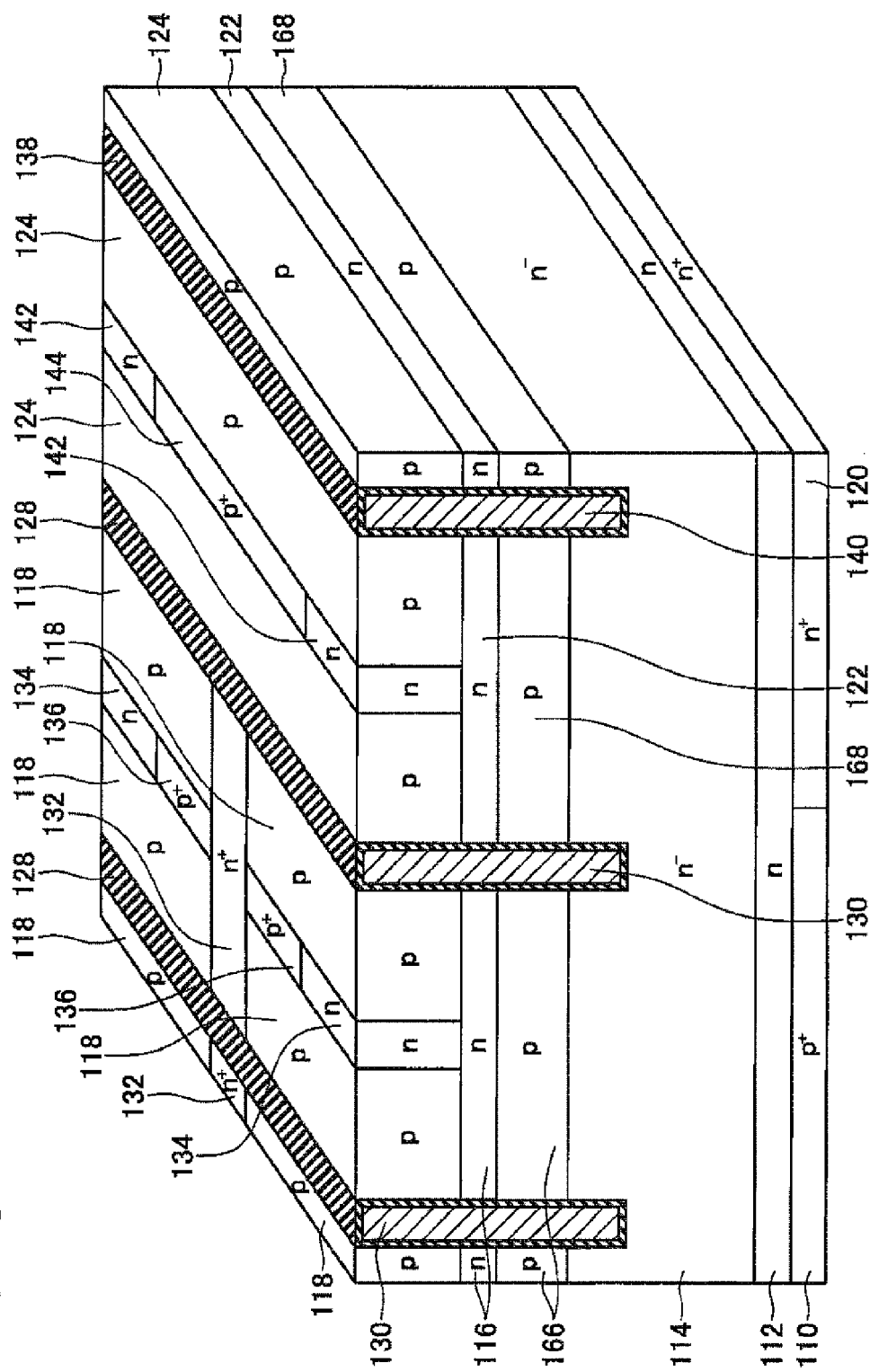
FIG. 18 is a diagram schematically illustrating another configuration of the semiconductor device 162 according to Embodiment 9.
Figure 47:
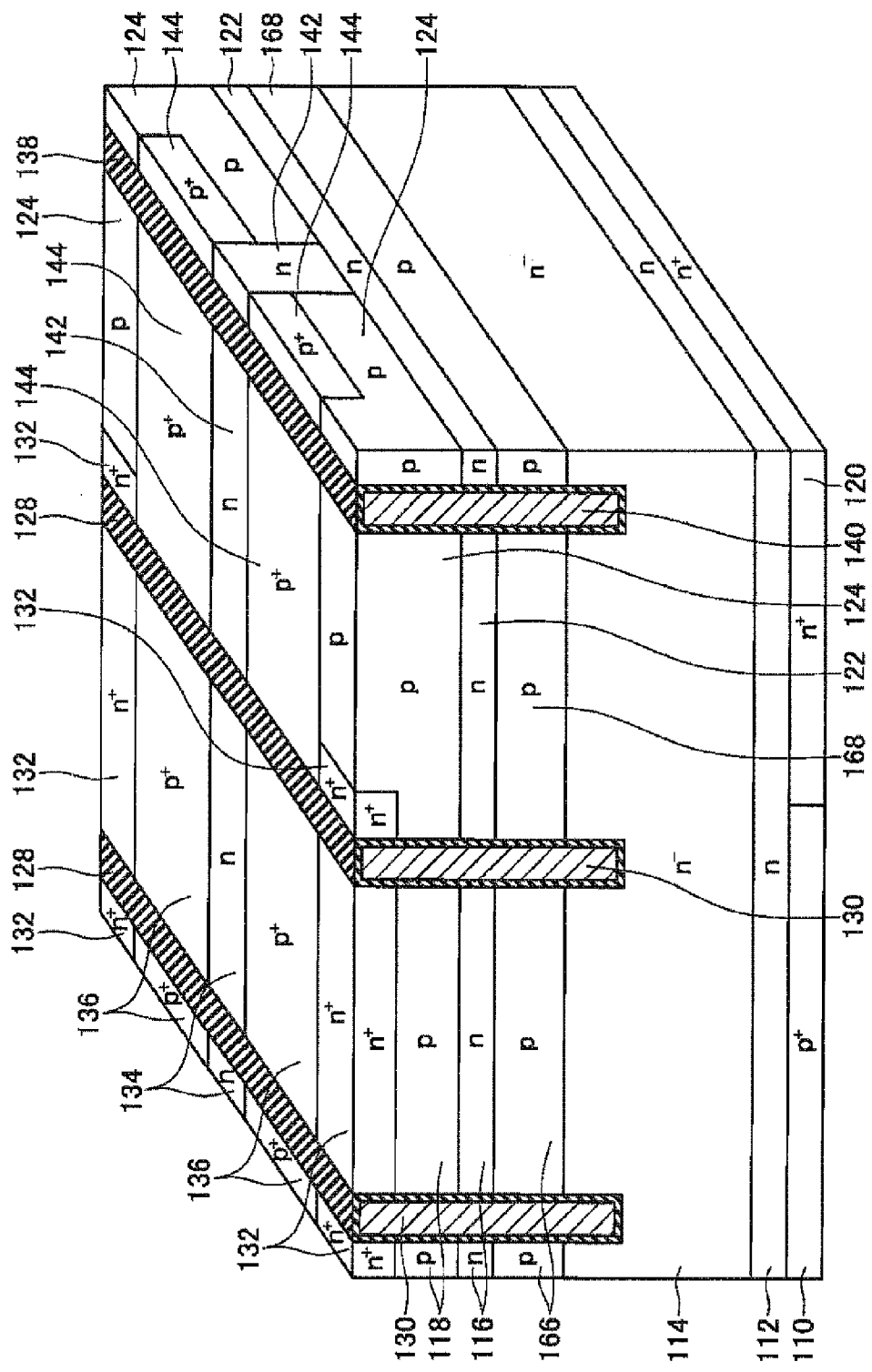
FIG. 47 is a diagram schematically illustrating another configuration of the semiconductor device 162 according to Embodiment 9.

In addition, the respective constituent elements of the semiconductor device 162 according to this Embodiment may be disposed in a three-dimensional manner as shown in FIGS. 18 and 47. In FIGS. 18 and 47, the collector/cathode electrode 146 and the emitter/anode electrode 148 are not shown in order to clarify the disposition of the respective constituent elements.

Figure 48:
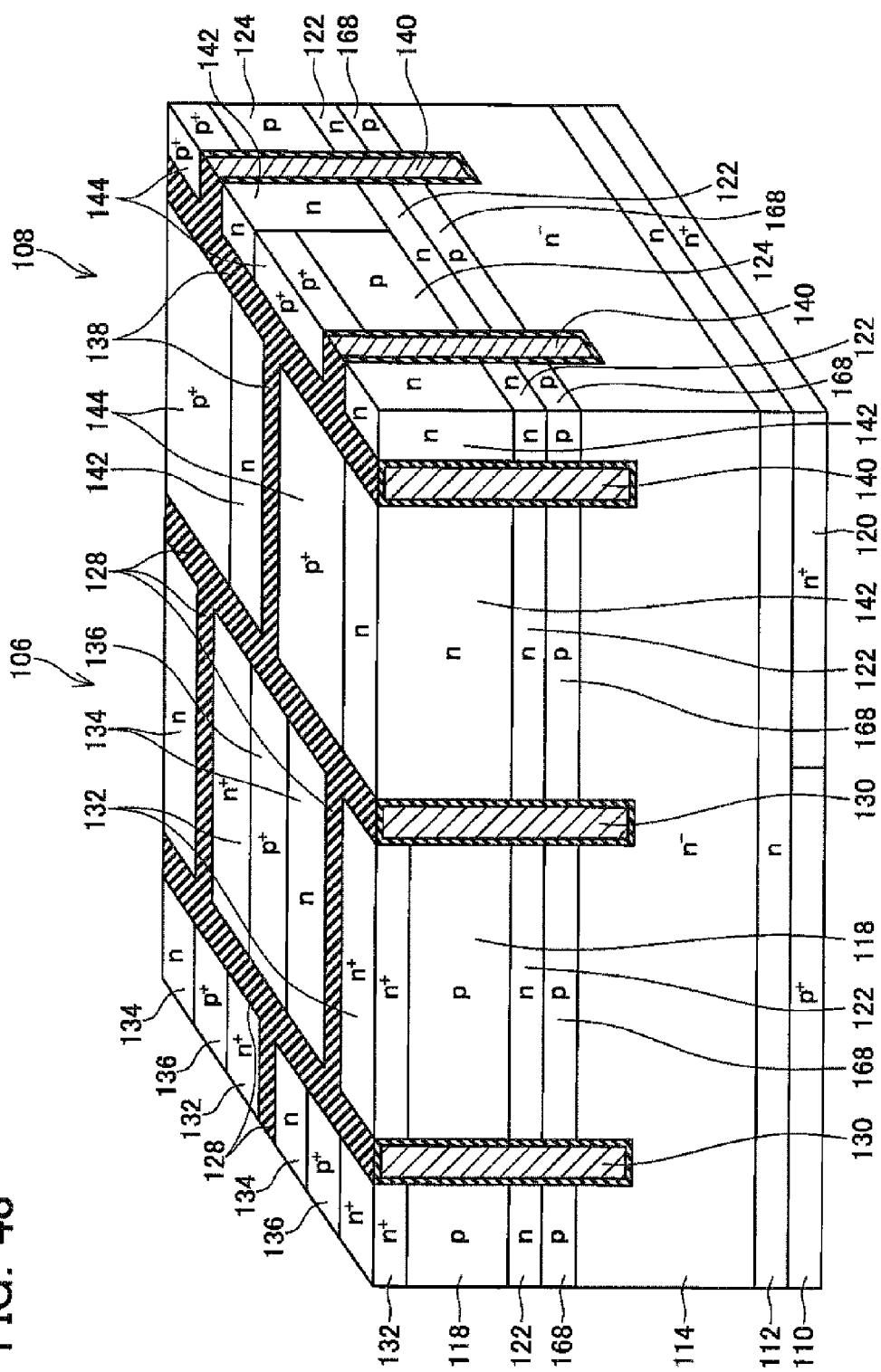
FIG. 48 is a diagram schematically illustrating another configuration of the semiconductor device 162 according to Embodiment 9.
Figure 49:
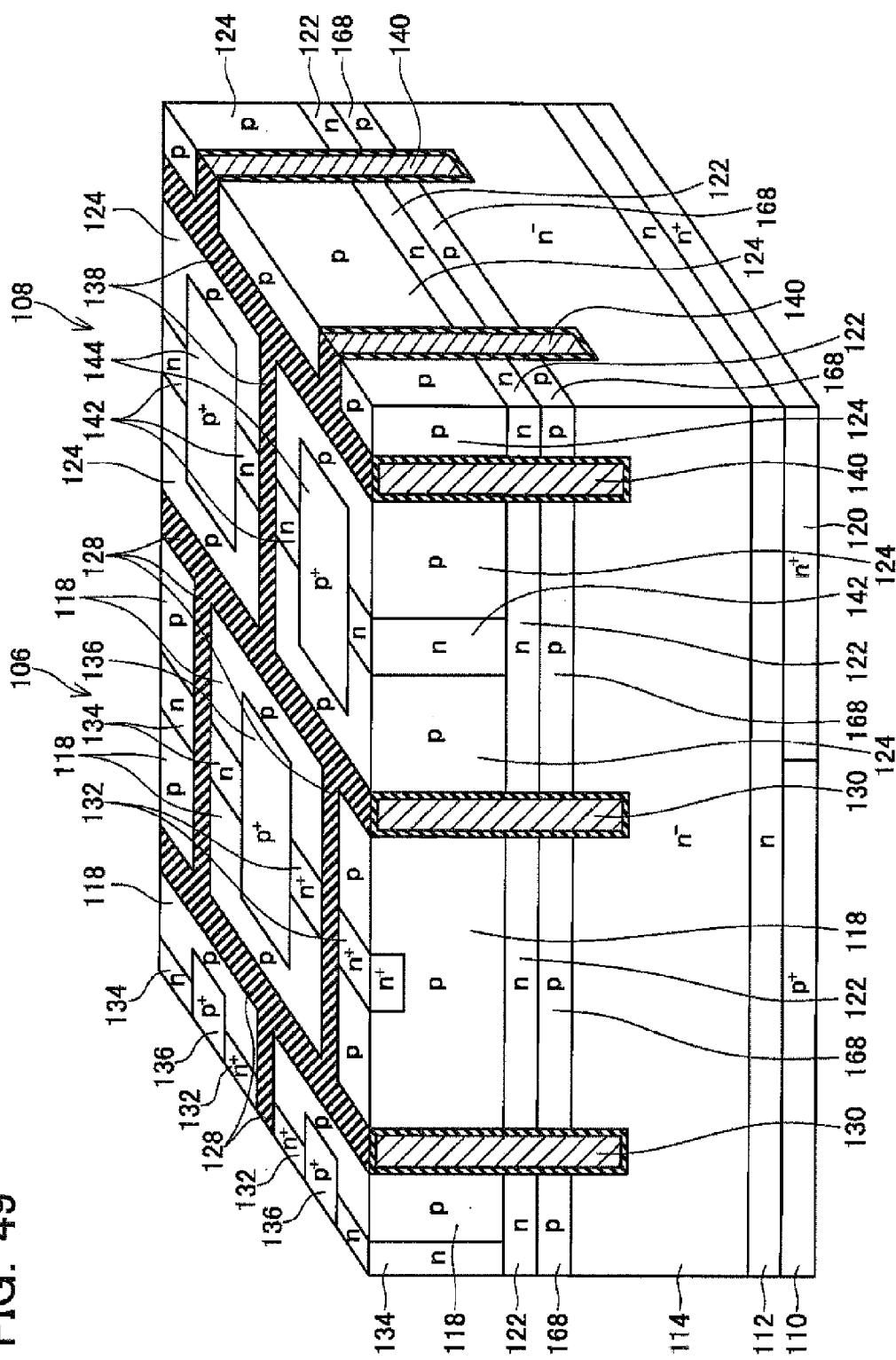
FIG. 49 is a diagram schematically illustrating another configuration of the semiconductor device 162 according to Embodiment 9.
Figure 50:
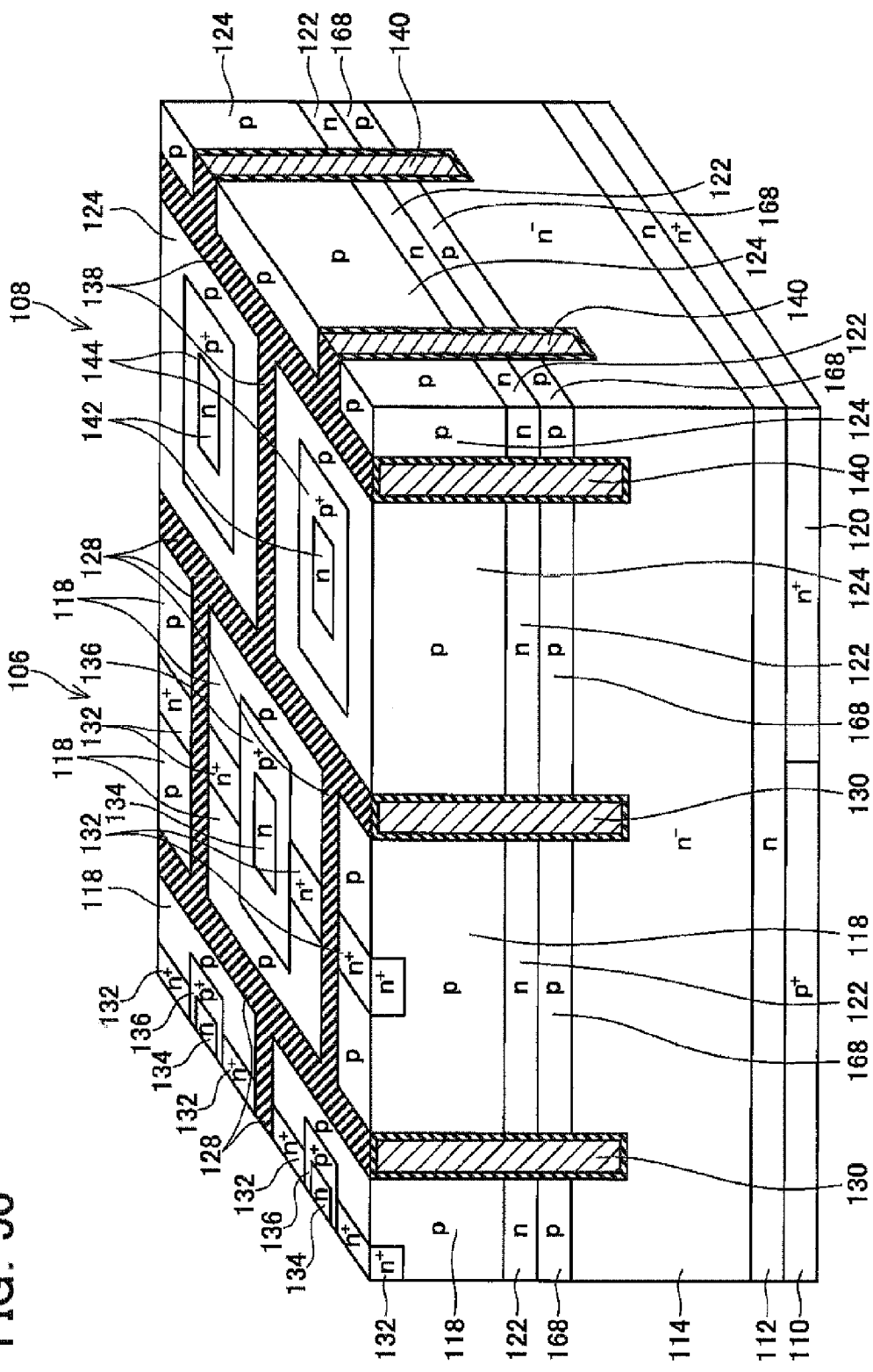
FIG. 50 is a diagram schematically illustrating another configuration of the semiconductor device 162 according to Embodiment 9.

In addition, the respective constituent elements of the semiconductor device 162 according to this Embodiment may be disposed in a three-dimensional manner as shown in FIGS. 48, 49 and 50. In FIGS. 48, 49 and 50, the collector/cathode electrode 146 and the emitter/anode electrode 148 are not shown in order to clarify the disposition of the respective constituent elements. In the dispositions shown in FIGS. 48, 49 and 50, when the semiconductor device 162 is in plan view from the top surface, the gate electrodes 130 or the gate electrodes 140 intersect each other longitudinally and transversely, and the p body regions 118 and the p anode regions 124 are disposed so as to be opposite to the inner corner portions of the gate electrodes 130, 140 with the insulating films 128, 138 interposed therebetween. With this configuration, when an ON current flows through the IGBT region 106 or the diode region 108, a hole concentration of the n⁻ drift regions 114 around the inner corner portions of the gate electrodes 130, 140 is increased, and thus it is possible to improve a conductivity modulation effect. It is possible to reduce the ON resistance of the IGBT region 106 or the diode region 108.

Figure 44:
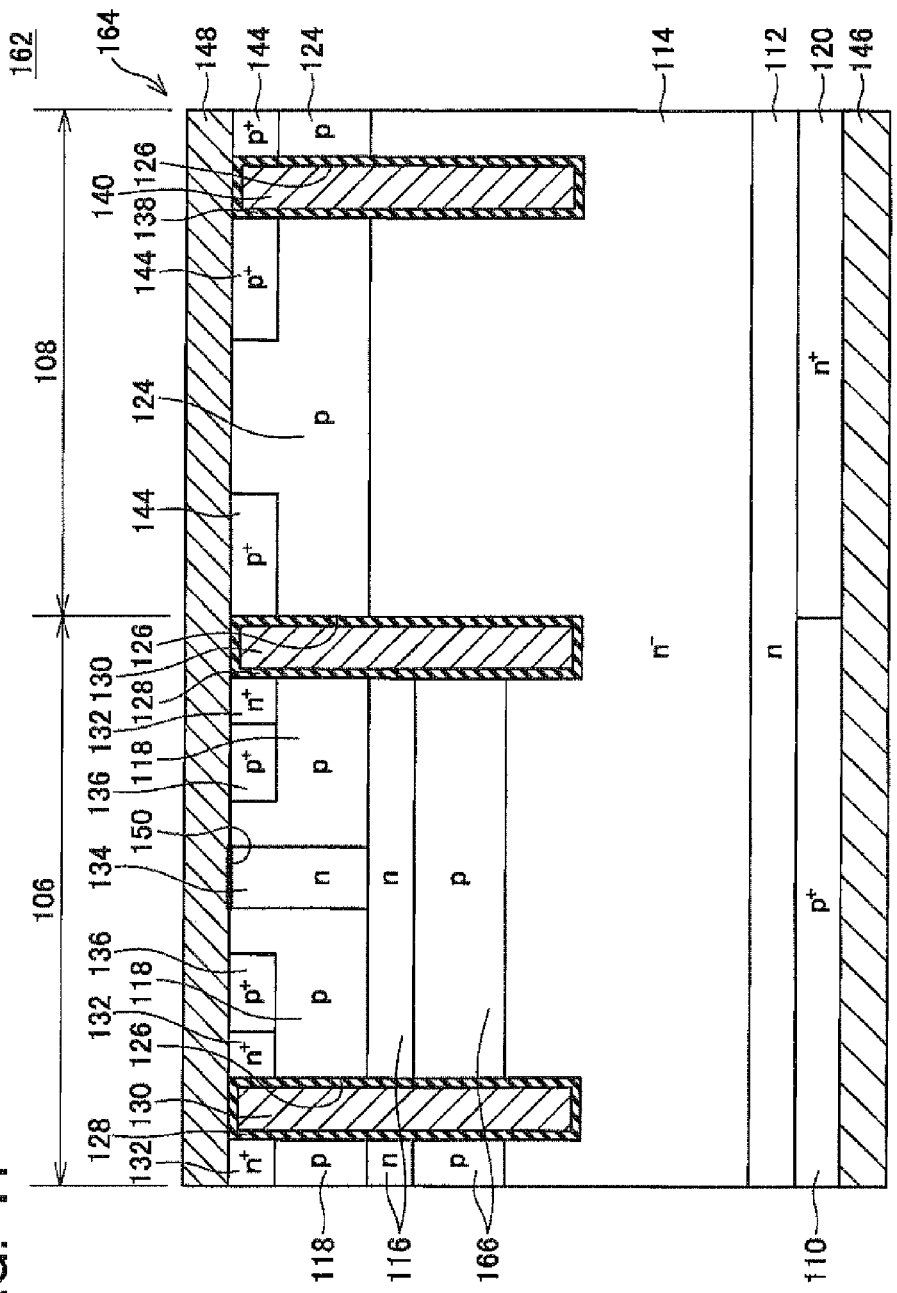
FIG. 44 is a diagram schematically illustrating another configuration of the semiconductor device 162 according to Embodiment 9.

In addition, as shown in FIG. 44, in the semiconductor device 162 of this Embodiment, there may be a configuration in which the p electric field progress preventing regions 166, the n barrier regions 116, and the n pillar region 134 are formed in the IGBT region 106, but the p electric field progress preventing regions 168, the n barrier regions 122, and the n pillar region 142 are not formed in the diode region 108. With this configuration as well, it is possible to reduce the switching loss in the IGBT region 106 and to thereby improve voltage resistance to the reverse bias. In addition, it is possible to reduce a leakage current when the reverse bias is applied in the IGBT region 106 and to thereby reduce a saturation current.

(Embodiment 10)

Figure 19:
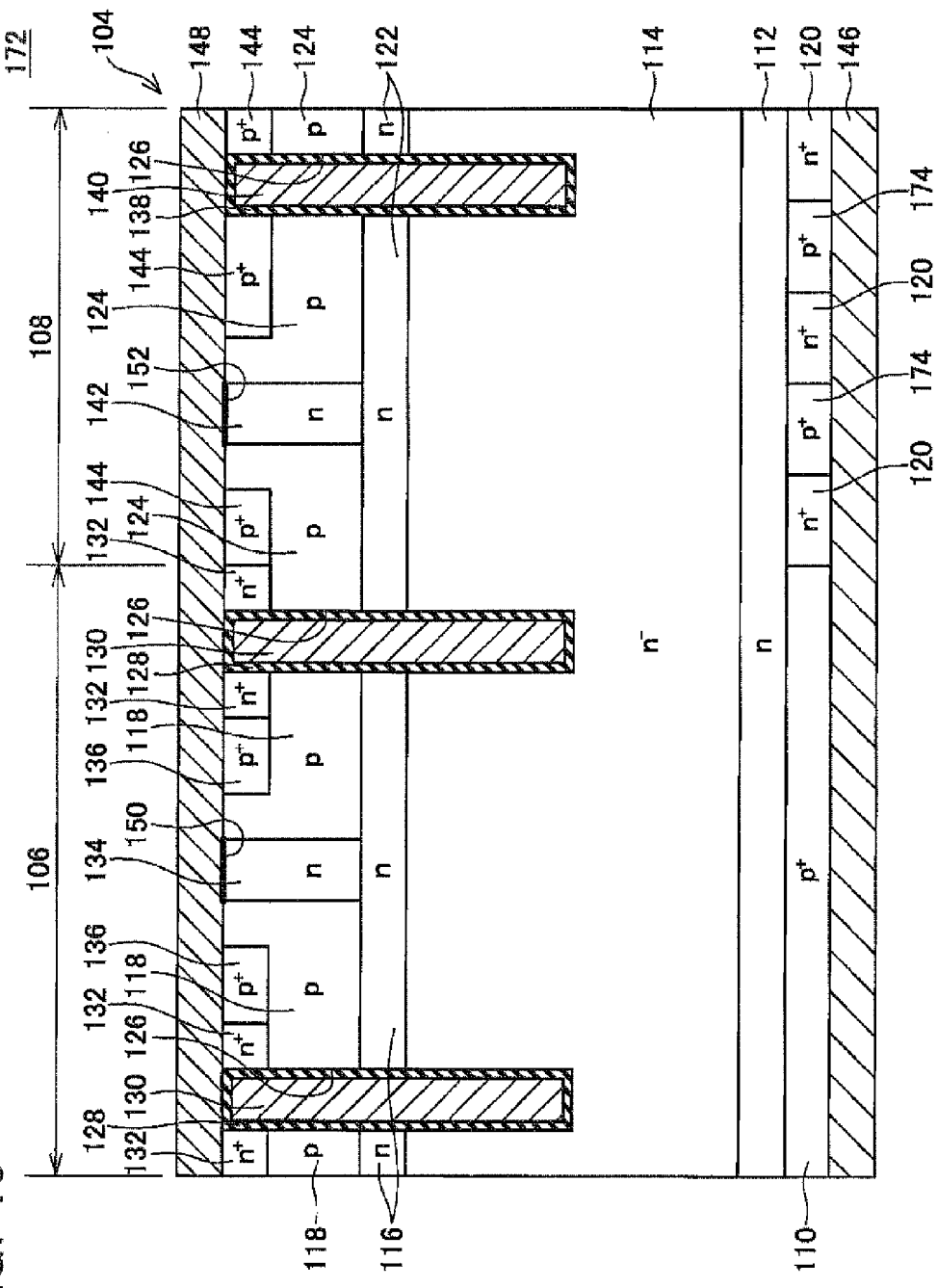
FIG. 19 is a diagram schematically illustrating a configuration of a semiconductor device 172 according to Embodiment 10.

As shown in FIG. 19, a semiconductor device 172 of this Embodiment has almost the same configuration as that of the semiconductor device 102 of Embodiment 8. The semiconductor device 172 of this Embodiment is different from the semiconductor device 102 of Embodiment 8 in that a plurality of $p^+$ cathode short-circuit regions 174 which are high concentration p type semiconductor regions is formed spaced apart from each other with a predetermined gap in the $n^+$ cathode region 120 of the diode region 108. In this Embodiment, the impurity concentration of the $p^+$ cathode short-circuit regions 174 is approximately $1\times10^{17}$ to $5\times10^{20}$ [cm$^{-3}$]. According to the semiconductor device 172 of this Embodiment, when the forward bias is applied, since injection of electrons into the $n^-$ drift region 114 from the $n^+$ cathode region 120 is suppressed, a reverse recovery current may further be reduced, and reverse recovery time may be further shortened than in the semiconductor device 102 of Embodiment 8. According to the semiconductor device 172 of this Embodiment, it is possible to further reduce the switching loss.

(Embodiment 11)

Figure 20:
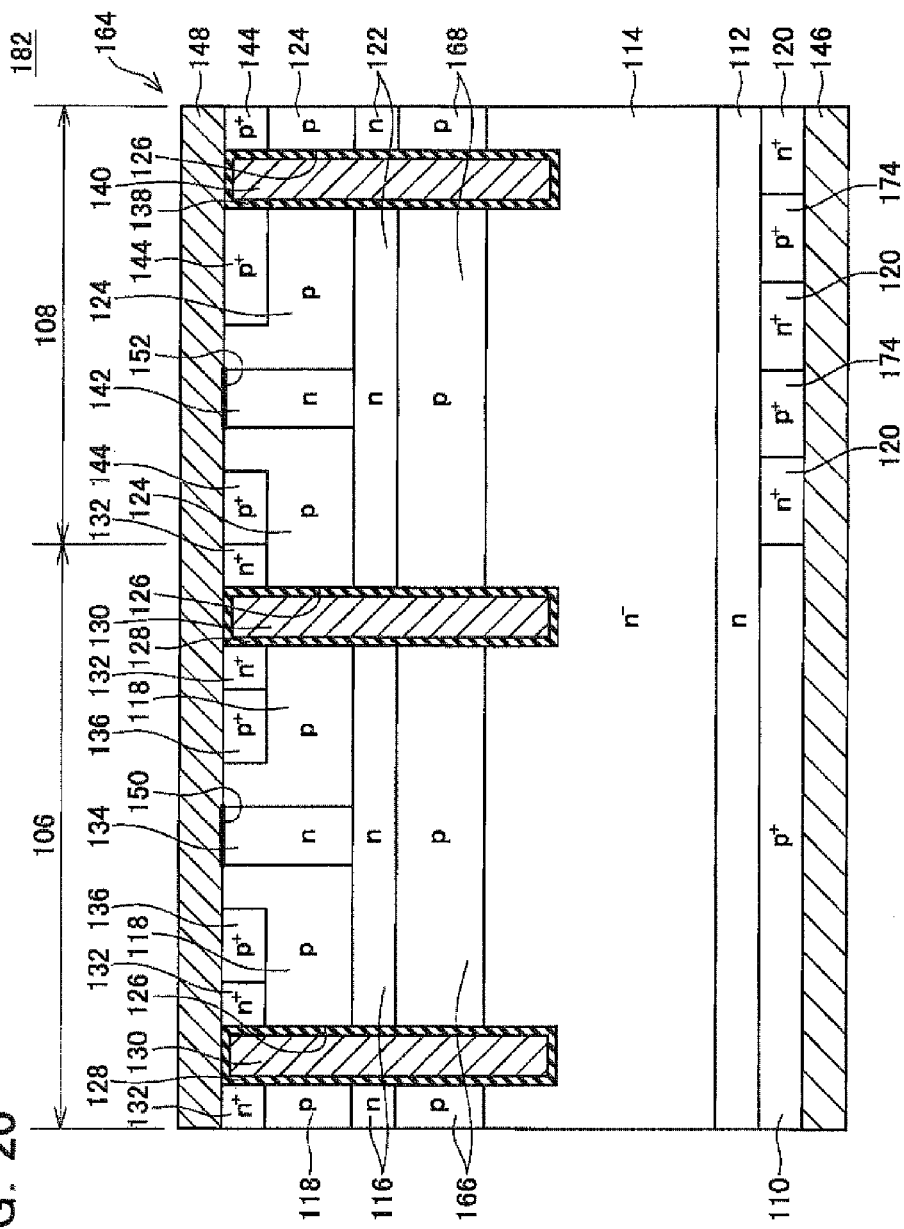
FIG. 20 is a diagram schematically illustrating a configuration of a semiconductor device 182 according to Embodiment 11.

As shown in FIG. 20, a semiconductor device 182 of this Embodiment has almost the same configuration as that of the semiconductor device 162 of Embodiment 9. The semiconductor device 182 of this Embodiment is different from the semiconductor device 162 of Embodiment 9 in that a plurality of $p^+$ cathode short-circuit regions 174 is formed spaced apart from each other with a predetermined gap in the $n^+$ cathode region 120 of the diode region 108. According to the semiconductor device 182 of this Embodiment, when the forward bias is applied, since injection of electrons into the $n^-$ drift region 114 from the $n^+$ cathode region 120 is suppressed, a reverse recovery current may further be reduced, and reverse recovery time may be further shortened than in the semiconductor device 162 of Embodiment 9. According to the semiconductor device 182 of this Embodiment, it is possible to further reduce the switching loss.

(Embodiment 12)

Figure 21:
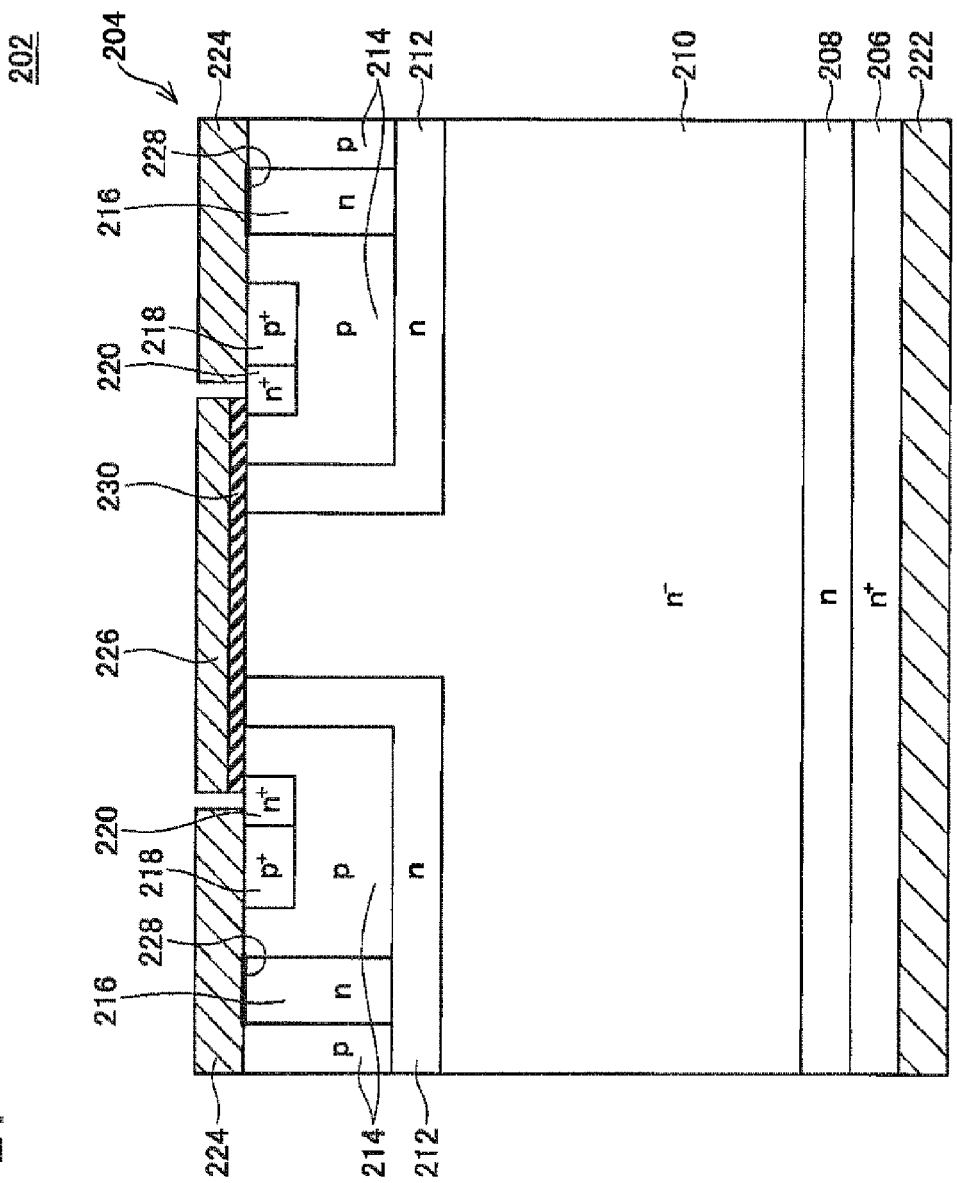
FIG. 21 is a diagram schematically illustrating a configuration of a semiconductor device 202 according to Embodiment 12.

As shown in FIG. 21, a semiconductor device 202 in this Embodiment is formed using a semiconductor substrate 204 of silicon. On the semiconductor substrate 204, an $n^+$ cathode region 206 which is a high concentration n type semiconductor region, an n buffer region 208 which is an n type semiconductor region, and an $n^-$ drift region 210 which is a low concentration n type semiconductor region are sequentially laminated. In this Embodiment, the impurity concentration of the $n^+$ cathode region 206 is approximately $1\times10^{17}$ to $5\times10^{20}$ [cm$^3$], the impurity concentration of the n buffer region 208 is approximately $1\times10^{16}$ to $1\times10^{19}$ [cm$^3$], and the impurity concentration of the $n^-$ drift region 210 is approximately $1\times10^{12}$ to $1\times10^{15}$ [cm$^{-3}$].

On the upper surface of the $n^-$ drift region 210, a plurality of n barrier regions 212 which are n type semiconductor regions is formed spaced apart from each other with a predetermined gap. On the upper type surfaces of the n barrier regions 212, p anode regions 214 which are p type semiconductor regions are partially formed. On the upper surfaces of the p anode regions 214, n pillar regions 216 which are n type semiconductor regions are formed. The n pillar regions 216 penetrate through the p anode regions 214 and reach the upper surfaces of the n barrier regions 212. In addition, on the upper surfaces of the p anode regions 214, $p^+$ contact regions 218 which are high concentration p type semiconductor regions and $n^+$ emitter regions 220 which are high concentration n type semiconductor regions are formed. In this Embodiment, the impurity concentration of the n barrier regions 212 is approximately $1\times10^{15}$ to $1\times10^{18}$ [cm$^{-3}$], the impurity concentration of the p anode regions 214 is approximately $1\times10^{16}$ to $1\times10^{19}$ [cm$^{-3}$], the impurity concentration of the n pillar regions 216 is approximately $1\times10^{16}$ to $1\times10^{19}$ [cm$^3$], the impurity concentration of the $p^+$ contact regions 218 is approximately $1\times10^{17}$ to $1\times10^{20}$ [cm$^{-3}$], and the impurity concentration of the $n^+$ emitter regions 220 is approximately $1\times10^{17}$ to $1\times10^{20}$ [cm$^{-3}$]. In addition, the thickness of each of the n barrier regions 212 is approximately 0.5 to 3.0 [um].

A cathode electrode 222 made of metal is formed on a lower surface of the semiconductor substrate 204. The cathode electrode 222 is connected to the $n^+$ cathode region 206 through an ohmic junction. Anode electrodes 224 made of metal and a gate electrode 226 made of metal are formed on the upper surface of the semiconductor substrate 204. The anode electrodes 224 are connected to the n pillar regions 216 through Schottky junctions via Schottky interfaces 228. In this Embodiment, a barrier height of the Schottky junctions is approximately 0.2 to 1.0 [eV]. The anode electrodes 224 are connected to the p anode regions 214, the $p^+$ contact regions 218, and parts of the $n^+$ emitter regions 220 through ohmic junctions. The gate electrode 226 is disposed so as to be opposite to the $n^-$ drift region 210, the n barrier regions 212, the p anode regions 214, and parts of the $n^+$ emitter regions 220 via an insulating film 230. The gate electrode 226 is electrically connected to a gate electrode terminal (not shown).

The semiconductor device 202 according to this Embodiment has a vertical MOSFET structure which includes the cathode electrode 222 corresponding to a drain electrode, the $n^+$ cathode region 206 corresponding to a drain region, the n buffer region 208, the drift region 210, the p anode regions 214 corresponding to a body region, the $n^+$ emitter regions 220 corresponding to a source region, the anode 224 corresponding to a source electrode, and the gate electrode 226 opposite to the p anode regions 214 between the $n^+$ emitter regions 220 and the $n^-$ drift region 210 with the insulating films 230 interposed therebetween.

In the semiconductor device 202 of this Embodiment, the n barrier regions 212 are formed between the $n^-$ drift region 210 and the p anode regions 214, and the n barrier regions 212 are electrically connected to the anode electrodes 224 via the n pillar regions 216 which are connected to the anode electrodes 224 through Schottky junctions via the Schottky interfaces 228. With this configuration, reverse recovery characteristics are improved with respect to parasitic diodes between the anode electrodes 224 and the cathode electrode 222, and thus it is possible to reduce the switching loss. In addition, it is possible to improve voltage resistance to a reverse bias between the anode electrodes 224 and the cathode electrode 222.

(Embodiment 13)

Figure 22:
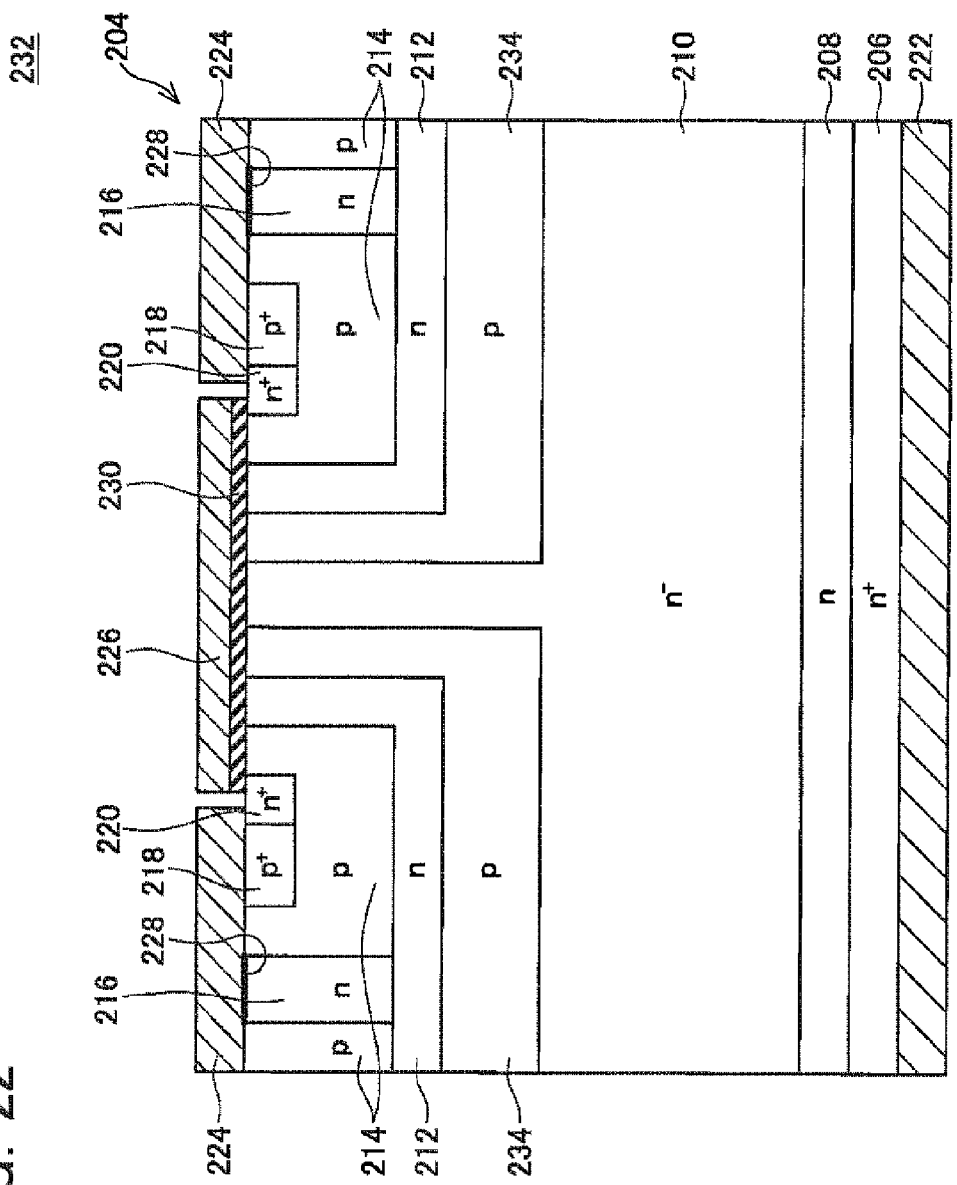
FIG. 22 is a diagram schematically illustrating a configuration of a semiconductor device 232 according to Embodiment 13.

As shown in FIG. 22, a semiconductor device 232 of this Embodiment has almost the same configuration as that of the semiconductor device 202 of Embodiment 12. The semiconductor device 232 of this Embodiment also has the vertical MOSFET structure in the same manner as the semiconductor device 202 of Embodiment 12. In the semiconductor device 232 of this Embodiment, p electric field progress preventing regions 234 which are p type semiconductor regions are formed between the n⁻ drift region 210 and the n barrier regions 212. The impurity concentration of the p electric field progress preventing regions 234 is approximately $1\times10^{15}$ to $1\times10^{19}$ [cm⁻³]. In addition, the thickness of the p electric field progress preventing regions 234 is 0.5 to 3.0 [um].

According to the semiconductor device 232 of this Embodiment, in the same manner as the semiconductor device 202 of Embodiment 12, reverse recovery characteristics are improved with respect to parasitic diodes between the anode electrodes 224 and the cathode electrode 222, and thus it is possible to reduce the switching loss.

In addition, in the semiconductor device 232 of this Embodiment, since the p electric field progress preventing regions 234 are formed between the n⁻ drift region 210 and the n barrier regions 212, voltage resistance to a reverse bias between the anode electrodes 224 and the cathode electrode 222 is improved and thus a leakage current when the reverse bias is applied can be reduced as compared with the semiconductor device 202 of Embodiment 12.

(Embodiment 14)

Figure 23:
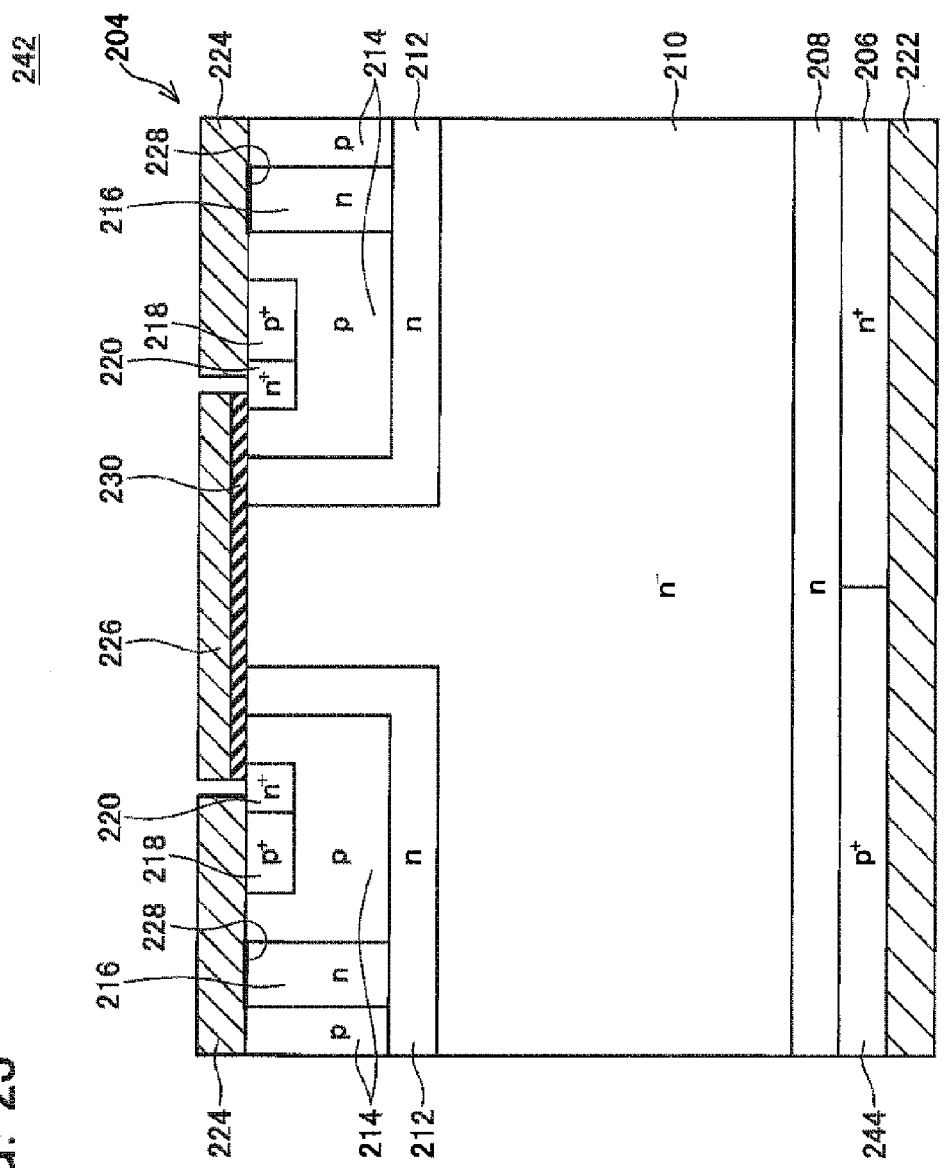
FIG. 23 is a diagram schematically illustrating a configuration of a semiconductor device 242 according to Embodiment 14.

As shown in FIG. 23, a semiconductor device 242 of this Embodiment has almost the same configuration as that of the semiconductor device 202 of Embodiment 12. In the semiconductor device 242 of this Embodiment, a p⁺ collector region 244 which is a high concentration p type semiconductor region is partially formed in the n⁺ cathode region 206. In this Embodiment, the impurity concentration of the p⁺ collector region 244 is approximately $1\times10^{17}$ to $5\times10^{20}$ [cm⁻³].

The semiconductor device 242 has a structure in which a planar IGBT and a free-wheeling diode are connected in reverse parallel. In other words, the planar IGBT is constituted by the cathode electrode 222 corresponding to a collector electrode, the p⁺ collector region 244, the n buffer region 208, the n⁻ drift region 210, the p anode regions 214, the n⁺ emitter regions 220, the anode electrodes 224 corresponding to a emitter electrode, the insulating film 230, and the gate electrode 226. The free-wheeling diode is constituted by the cathode electrode 222, the n⁺ cathode region 206, the n buffer region 208, the n⁻ drift region 210, the p anode regions 214, the p⁺ contact regions 218, and the anode electrodes 224. In the above-described IGBT and diode, the semiconductor device 242 of this Embodiment has a configuration in which there are further provided the n barrier regions 212 formed between the n⁻ drift region 210 and the p anode regions 214, and the n pillar regions 216 which are formed so as to connect the n barrier regions 212 to the anode electrodes 224 and connected to the anode electrodes 224 through Schottky junctions.

In the semiconductor device 242 of this Embodiment, when a forward bias is applied between the anode electrodes 224 and the cathode electrode 222, injection of holes into the n⁻ drift region 210 from the p anode regions 214 and the p⁺ contact regions 218 is suppressed. Therefore, reverse recovery characteristics are improved and thereby it is possible to reduce the switching loss.

In the semiconductor device 242 of this Embodiment, when the reverse bias is applied between the anode electrodes 224 and the cathode electrode 222, an electric field is distributed to not only depletion layers growing from the Schottky interfaces 228 but also depletion layers growing from the interfaces of the pn junctions between the p anode regions 214 and the n barrier regions 212. Therefore, it is possible to improve voltage resistance to the reverse bias.

(Embodiment 15)

Figure 24:
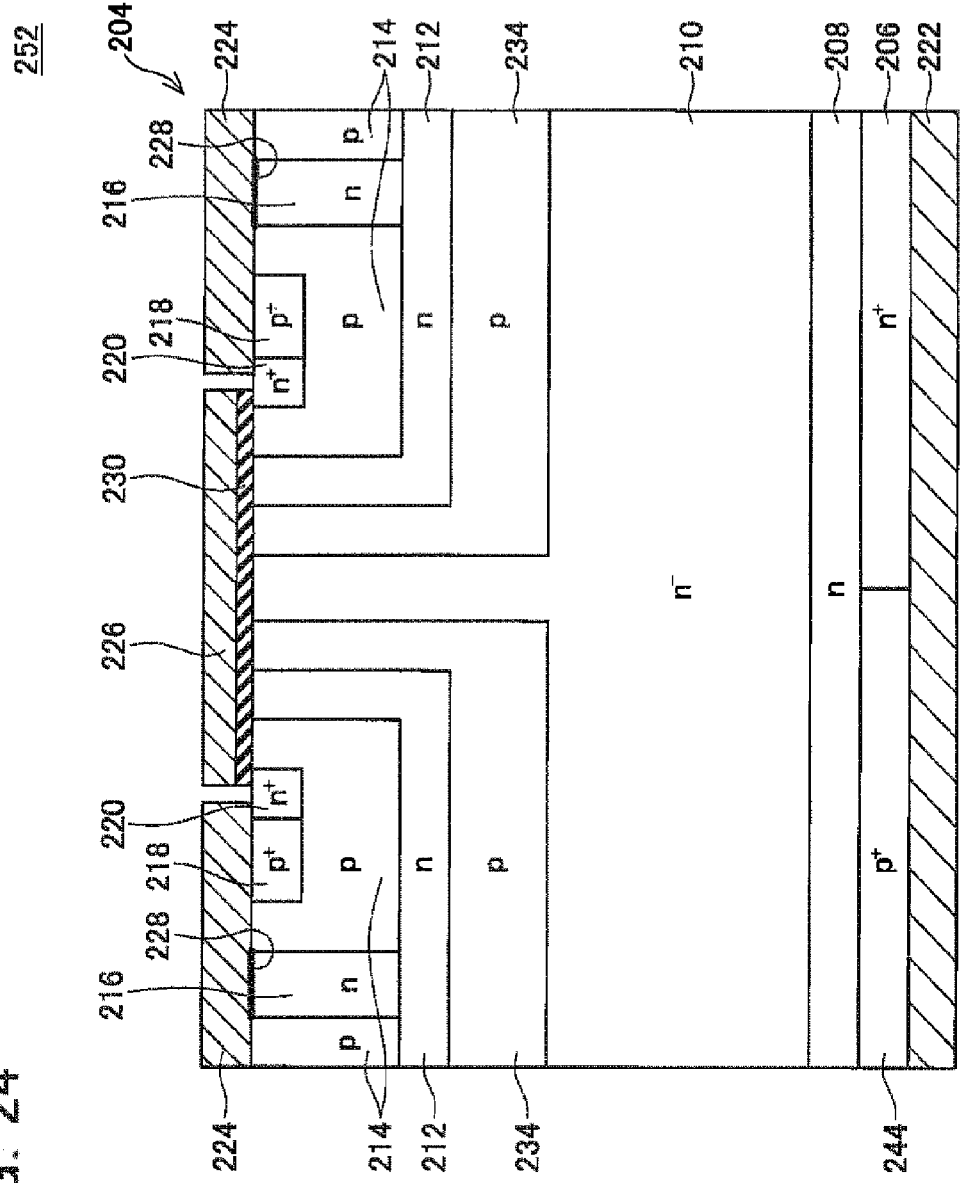
FIG. 24 is a diagram schematically illustrating a configuration of a semiconductor device 252 according to Embodiment 15.

As shown in FIG. 24, a semiconductor device 252 of this Embodiment has almost the same configuration as that of the semiconductor device 242 of Embodiment 14. In the semiconductor device 252 of this Embodiment, p electric field progress preventing regions 234 which are p type semiconductor regions are formed between the n⁻ drift region 210 and the n barrier regions 212. The impurity concentration of the p electric field progress preventing regions 234 is approximately $1\times10^{15}$ to $1\times10^{19}$ [cm⁻³]. In addition, the thickness of the p electric field progress preventing regions 234 is 0.5 to 3.0 [um]. The semiconductor device 252 has a structure in which a planar IGBT and a free-wheeling diode are connected in reverse parallel.

In the semiconductor device 252 of this Embodiment, when a forward bias is applied between the anode electrodes 224 and the cathode electrode 222, injection of holes into the n⁻ drift region 210 from the p anode regions 214 and the p⁺ contact regions 218 is suppressed. Therefore, reverse recovery characteristics are improved and thereby it is possible to reduce the switching loss.

In the semiconductor device 252 of this Embodiment, when the reverse bias is applied between the anode electrodes 224 and the cathode electrode 222, an electric field is distributed to not only depletion layers growing from the Schottky interfaces 228 and depletion layers growing from interfaces of pn junctions between the p anode regions 214 and the n barrier regions 212 but also depletion layers growing from the interfaces of the pn junctions between the p electric field progress preventing regions 234 and the n⁻ drift region 210. Therefore, it is possible to improve voltage resistance to the reverse bias.

In addition, in the semiconductor device 252 of this Embodiment, a reverse current is restricted by the pn junctions between the p electric field progress preventing regions 234 and the n⁻ drift region 210. Therefore, a leakage current passing through the Schottky interfaces 228 is reduced.

In addition, in the semiconductor device 252 of this Embodiment, in a case where the IGBT is driven by applying a voltage to the gate electrodes 226, a current flowing from the cathode electrode 222 corresponding to a collector electrode to the anode electrodes 224 corresponding to emitter electrodes is suppressed by the p electric field progress preventing regions 234, and thus it is possible to reduce a saturation current of the IGBT.

(Embodiment 16)

Figure 25:
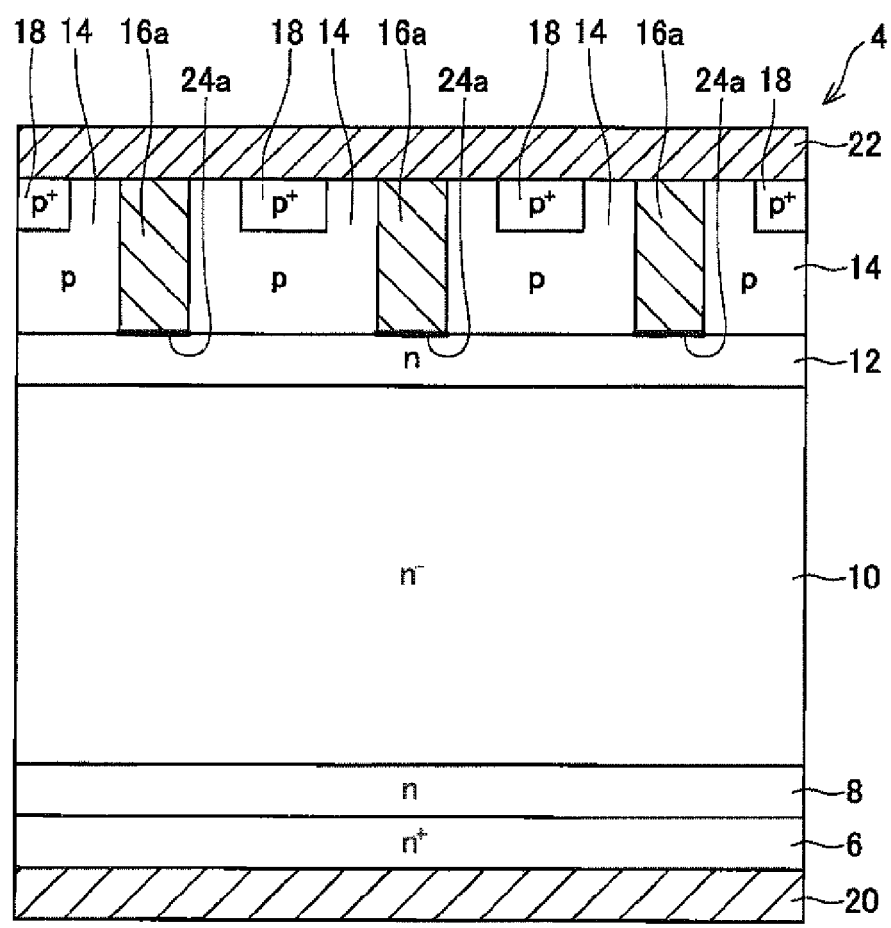
FIG. 25 is a diagram schematically illustrating a configuration of a diode 302 according to Embodiment 16.

As shown in FIG. 25, a diode 302 of this Embodiment has almost the same configuration as that of the diode 2 of Embodiment 1. The diode 302 of this Embodiment includes pillar electrodes 16a made of metal instead of the n pillar regions 16. The pillar electrodes 16a are formed by forming trenches on the upper surface of the semiconductor substrate 4 which penetrate through the p anode regions 14 and reach the n barrier region 12 and by filling the trenches with metal. The pillar electrodes 16a are electrically connected to the anode electrode 22 and connected to the n barrier region 12 through Schottky junctions via Schottky interfaces 24a.

In the diode 302 of this Embodiment, when a forward bias is applied between the anode electrode 22 and the cathode electrode 20, the pillar electrodes 16a and the n barrier region 12 are short-circuited via the Schottky interfaces 24a. At this time, a potential difference between the n barrier region 12 and the anode electrode 22 is nearly the same as voltage drop at the Schottky interfaces 24a. Since the voltage drop at the Schottky interfaces 24a is sufficiently smaller than a built-in voltage of a pn junction between the p anode regions 14 and the n barrier region 12, injection of holes into the n⁻ drift region 10 from the p⁺ contact regions 18 or the p anode regions 14 is suppressed.

Next, when the voltage between the anode electrode 22 and the cathode electrode 20 is changed from the forward bias to a reverse bias, a reverse current is restricted by the Schottky interfaces 24a between the pillar electrodes 16a and the n barrier region 12. In the diode 302 according to this Embodiment, since injection of holes into the n⁻ drift region 10 from the p⁺ contact regions 18 and the p anode regions 14 is suppressed when the forward bias is applied, a reverse recovery current is small, and reverse recovery time is short. According to the diode 302 of this Embodiment, it is possible to reduce the switching loss without performing lifetime control of the n⁻ drift region 10.

In the diode 302 of this Embodiment, when the reverse bias is applied between the anode electrode 22 and the cathode electrode 20, an electric field is distributed to not only depletion layers growing from the Schottky interfaces 24a between the n barrier region 12 and the pillar electrodes 16a but also depletion layers growing from the interfaces of the pn junctions between the p anode regions 14 and the n barrier region 12. Thereby, an electric field applied to the Schottky interfaces 24a between the n barrier region 12 and the pillar electrodes 16a is reduced. According to the diode 302 of this Embodiment, it is possible to improve voltage resistance to the reverse bias.

In the diode 302 of this Embodiment, a potential difference between the n barrier region 12 and the anode electrode 22 when the forward bias is applied can be made to be smaller than that in the diode 2 of Embodiment 1. The injection of holes into the n⁻ drift region 10 from the p⁺ contact regions 18 or the p anode regions 14 is further suppressed, and thus it is possible to further reduce the switching loss.

(Embodiment 17)

Figure 26:
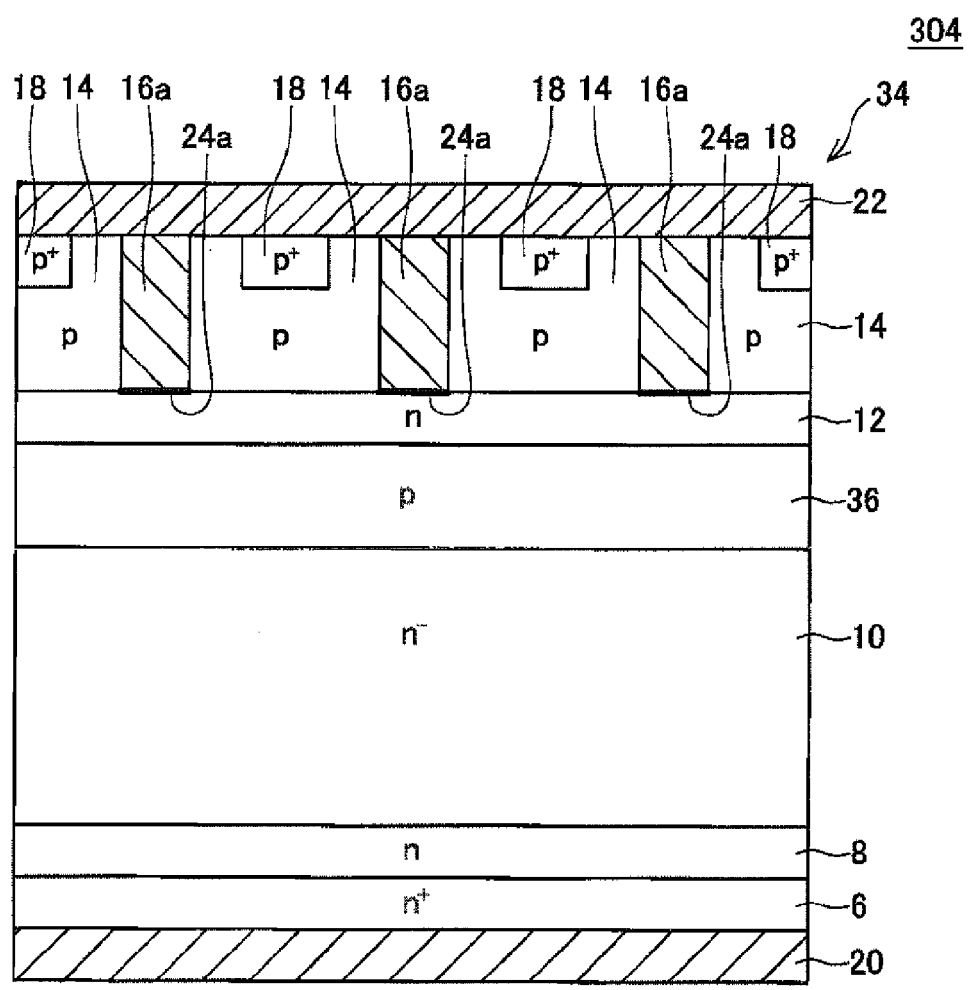
FIG. 26 is a diagram schematically illustrating a configuration of a diode 304 according to Embodiment 17.

As shown in FIG. 26, a diode 304 of this Embodiment has almost the same configuration as that of the diode 32 of Embodiment 2. The diode 304 of this Embodiment includes pillar electrodes 16a made of metal instead of the n pillar regions 16. The pillar electrodes 16a are formed by forming trenches on the upper surface of the semiconductor substrate 34 which penetrate through the p anode regions 14 and reach the n barrier region 12 and by filling the trenches with metal. The pillar electrodes 16a are electrically connected to the anode electrode 22 and connected to the n barrier region 12 through Schottky junctions via Schottky interfaces 24a.

An operation of the diode 304 will be described. When a forward bias is applied between the anode electrode 22 and the cathode electrode 20, the pillar electrodes 16a and the n barrier region 12 are short-circuited via the Schottky interfaces 24a. At this time, a potential difference between the n barrier region 12 and the anode electrode 22 is nearly the same as voltage drop at the Schottky interfaces 24a. Since the voltage drop at the Schottky interfaces 24a is sufficiently smaller than a built-in voltage of a pn junction between the p anode regions 14 and the n barrier region 12, injection of holes into the n⁻ drift region 10 from the p⁺ contact regions 18 or the p anode regions 14 is suppressed. In addition, although there is a pn junction between the n barrier region 12 and the p electric field progress preventing region 36, since a p type impurity concentration of the p electric field progress preventing region 36 is low and the thickness of the p electric field progress preventing region 36 is small, the pn junction has less influence on a forward current between the anode electrode 22 and the cathode electrode 20.

Next, when the voltage between the anode electrode 22 and the cathode electrode 20 is changed from the forward bias to a reverse bias, a reverse current is restricted by the Schottky interfaces 24a between the pillar electrodes 16a and the n barrier region 12. In addition, the reverse current is also restricted by a pn junction between the n⁻ drift region 10 and the p electric field progress preventing region 36. As described above, in the diode 304 according to this Embodiment, since injection of holes into the n⁻ drift region 10 from the p⁺ contact regions 18 and the p anode regions 14 is suppressed when the forward bias is applied, a reverse recovery current is small, and reverse recovery time is short. According to the diode 304 of this Embodiment, it is possible to reduce the switching loss without performing lifetime control of the n⁻ drift region 10.

In the diode 304 of this Embodiment, when the reverse bias is applied between the anode electrode 22 and the cathode electrode 20, an electric field is distributed to not only depletion layers growing from the Schottky interfaces 24a between the n barrier region 12 and the pillar electrodes 16a and depletion layers growing from the interfaces of the pn junctions between the p anode regions 14 and the n barrier region 12 but also an interface of the pn junction between the n⁻ drift region 10 and the p electric field progress preventing region 36. Thereby, an electric field applied to the Schottky interfaces 24a between the n barrier region 12 and the pillar electrodes 16a and an electric field applied to the pn junction between the p anode regions 14 and the n barrier region 12 are reduced. According to the diode 304 of this Embodiment, it is possible to improve voltage resistance to the reverse bias.

In the diode 304 of this Embodiment, a potential difference between the n barrier region 12 and the anode electrode 22 when the forward bias is applied can be made to be smaller than that in the diode 32 of Embodiment 2. The injection of holes into the n⁻ drift region 10 from the p⁺ contact regions 18 or the p anode regions 14 is further suppressed, and thus it is possible to further reduce the switching loss.

(Other Embodiments)

Figure 11:
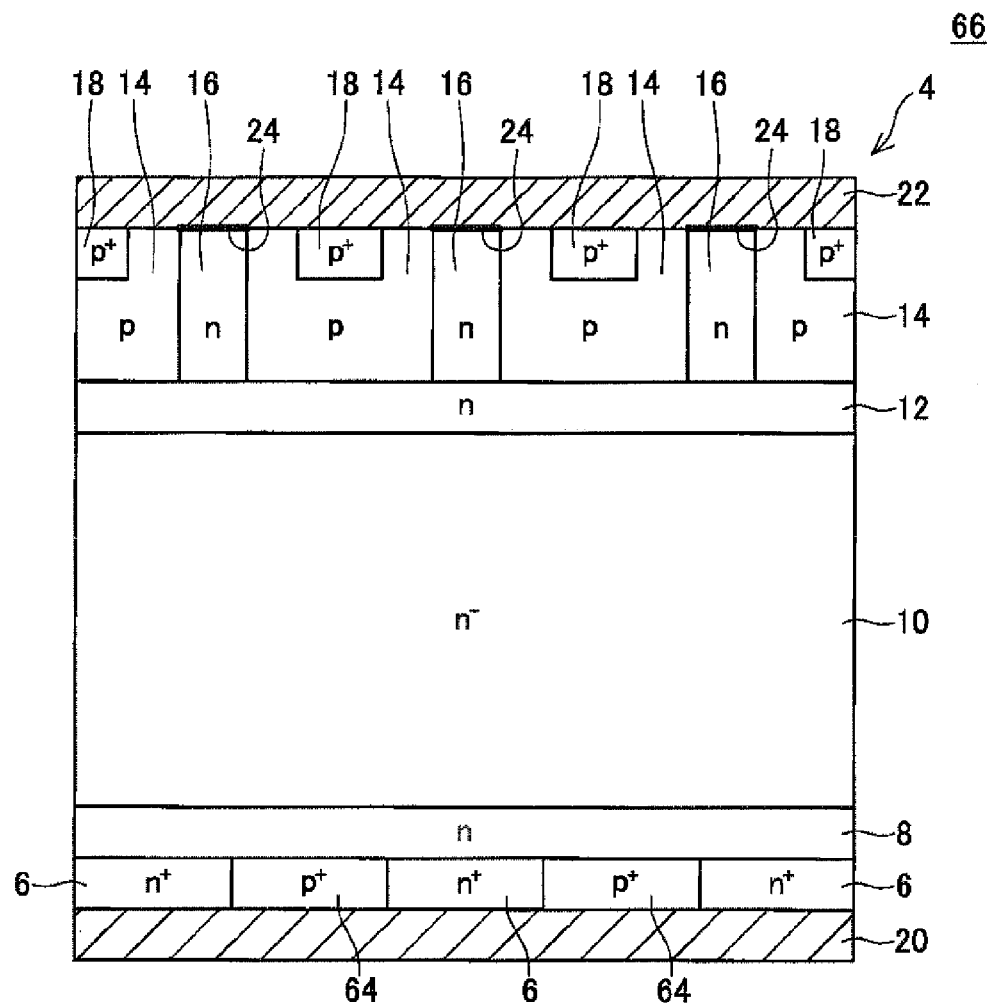
FIG. 11 is a diagram schematically illustrating a configuration of a diode 2 according to a modified example of Embodiment 1.
Figure 12:
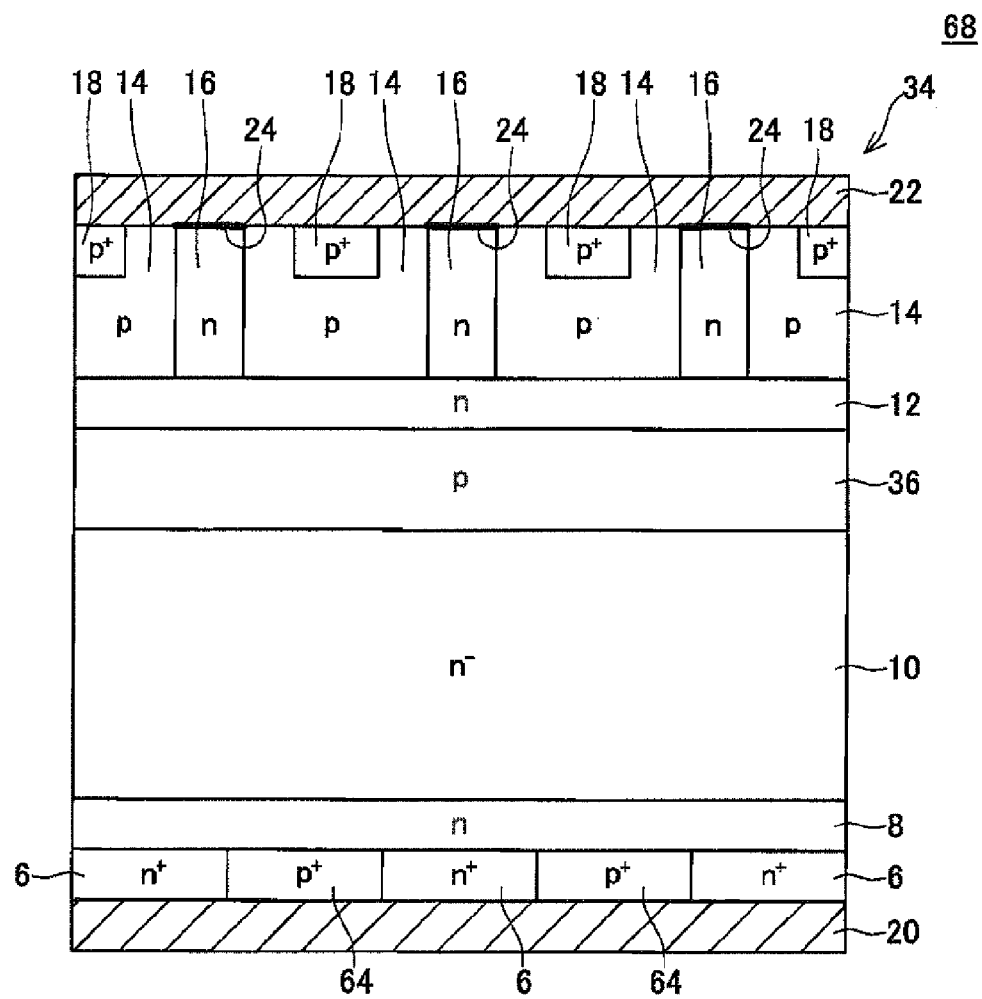
FIG. 12 is a diagram schematically illustrating a configuration of a diode 32 according to a modified example of Embodiment 2.
Figure 13:
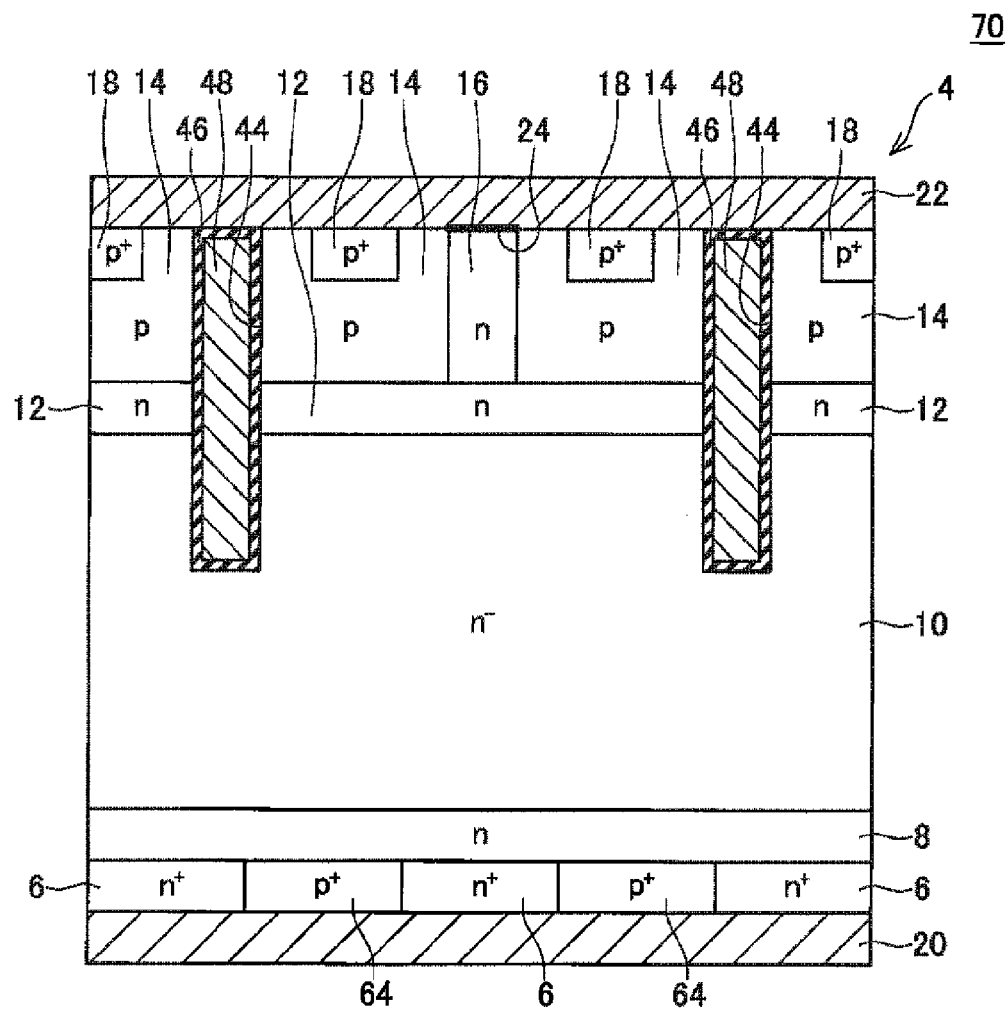
FIG. 13 is a diagram schematically illustrating a configuration of a diode 42 according to a modified example of Embodiment 3.
Figure 27:
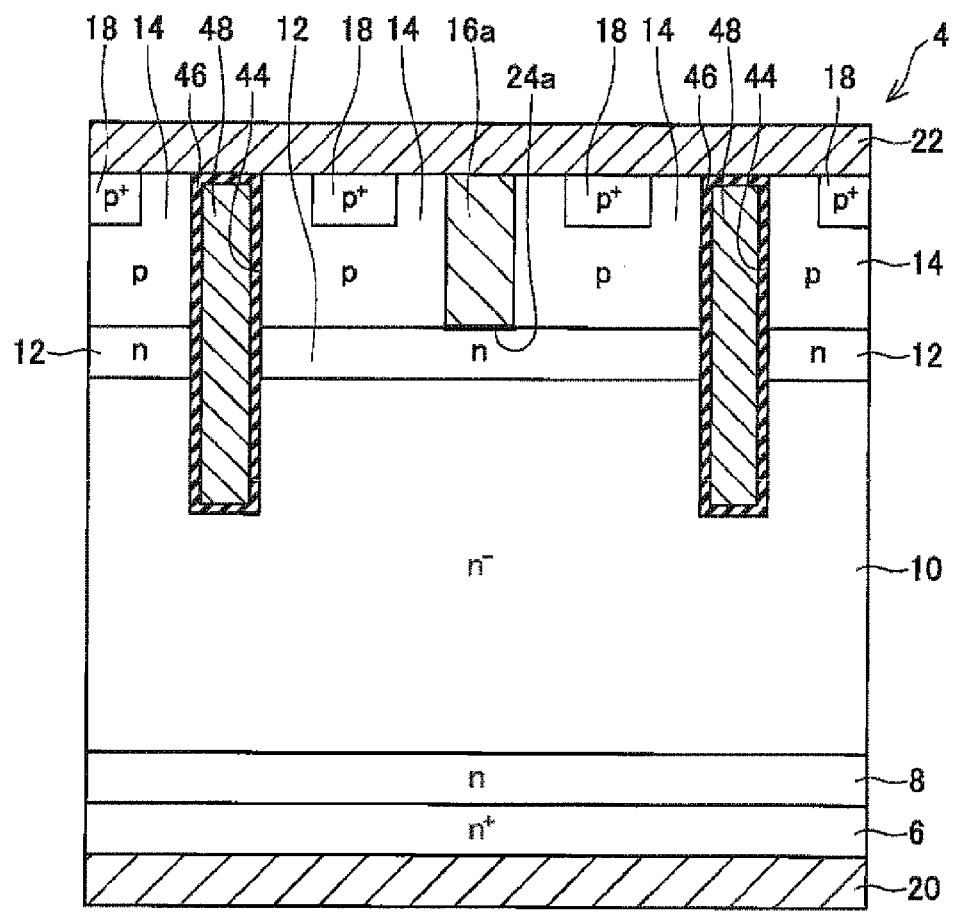
FIG. 27 is a diagram schematically illustrating a configuration of a diode 306 according to another Embodiment.
Figure 28:
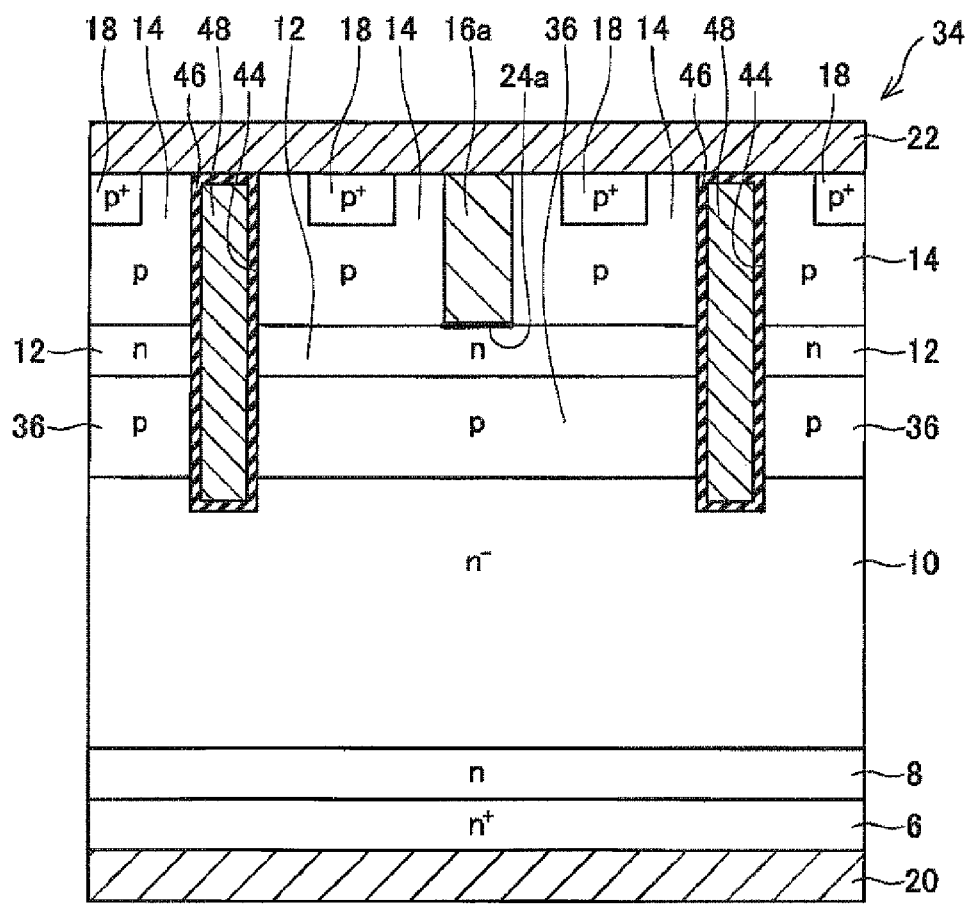
FIG. 28 is a diagram schematically illustrating a configuration of a diode 308 according to another Embodiment.
Figure 29:
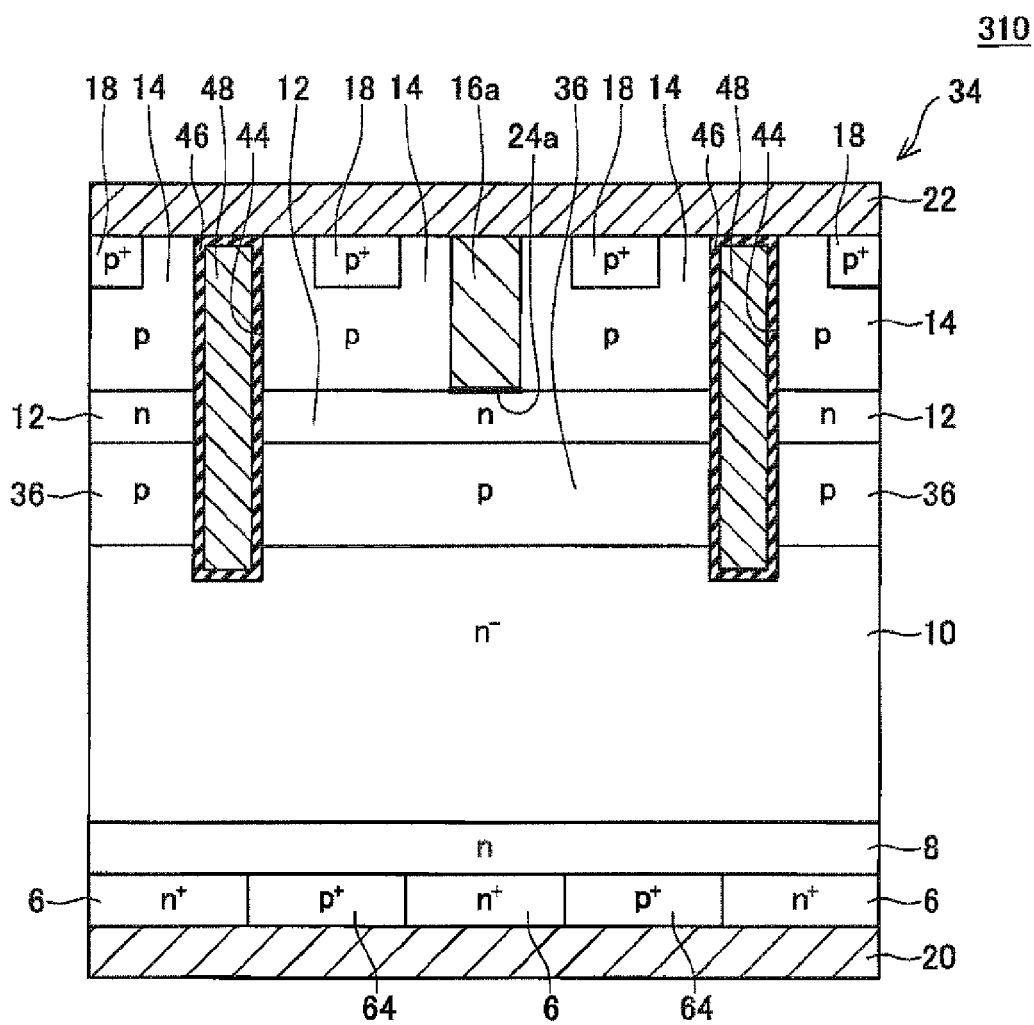
FIG. 29 is a diagram schematically illustrating a configuration of a diode 310 according to another Embodiment.
Figure 30:
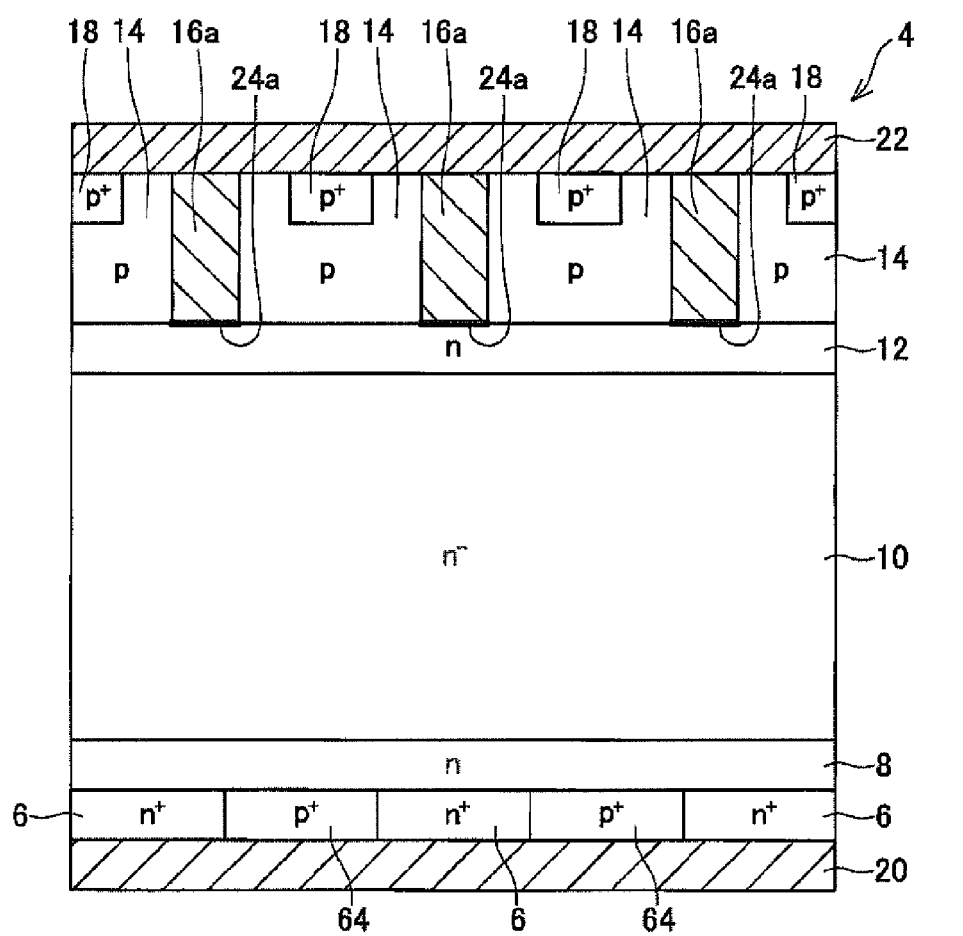
FIG. 30 is a diagram schematically illustrating a configuration of a diode 312 according to another Embodiment.
Figure 31:
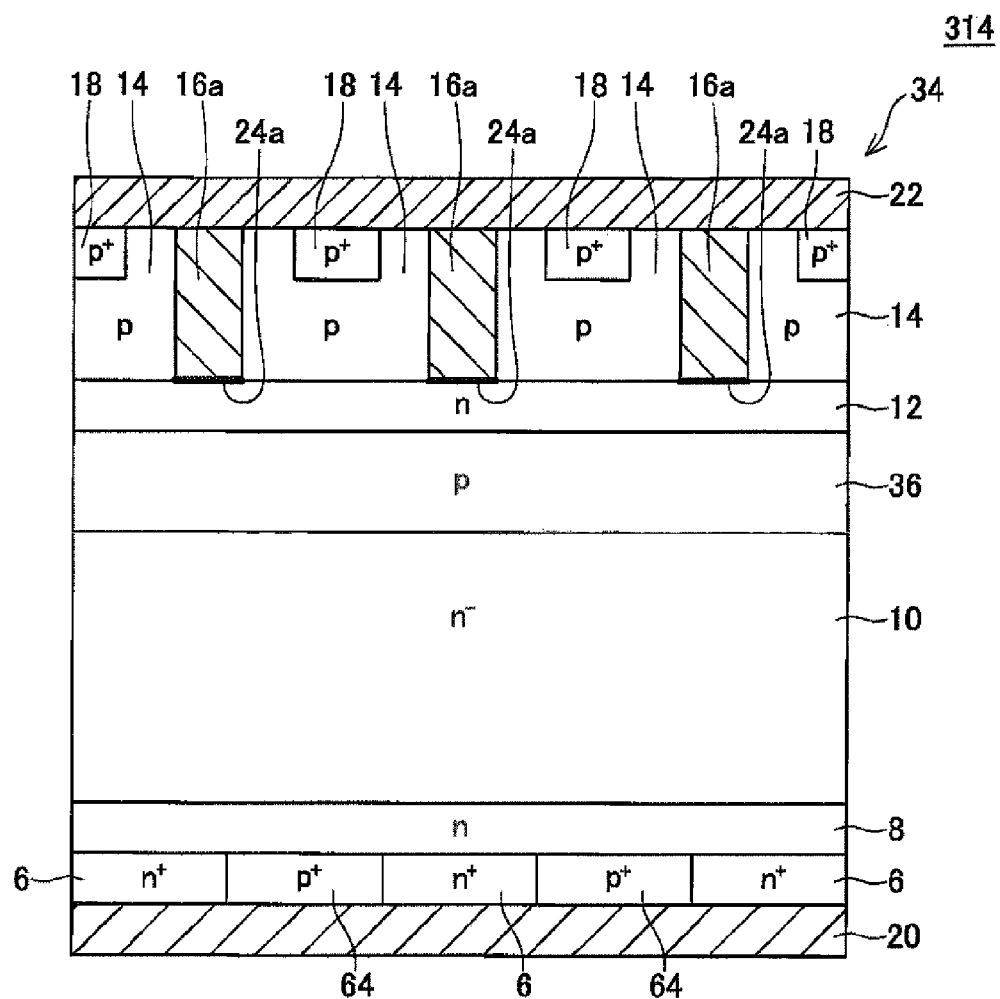
FIG. 31 is a diagram schematically illustrating a configuration of a diode 314 according to another Embodiment.
Figure 32:
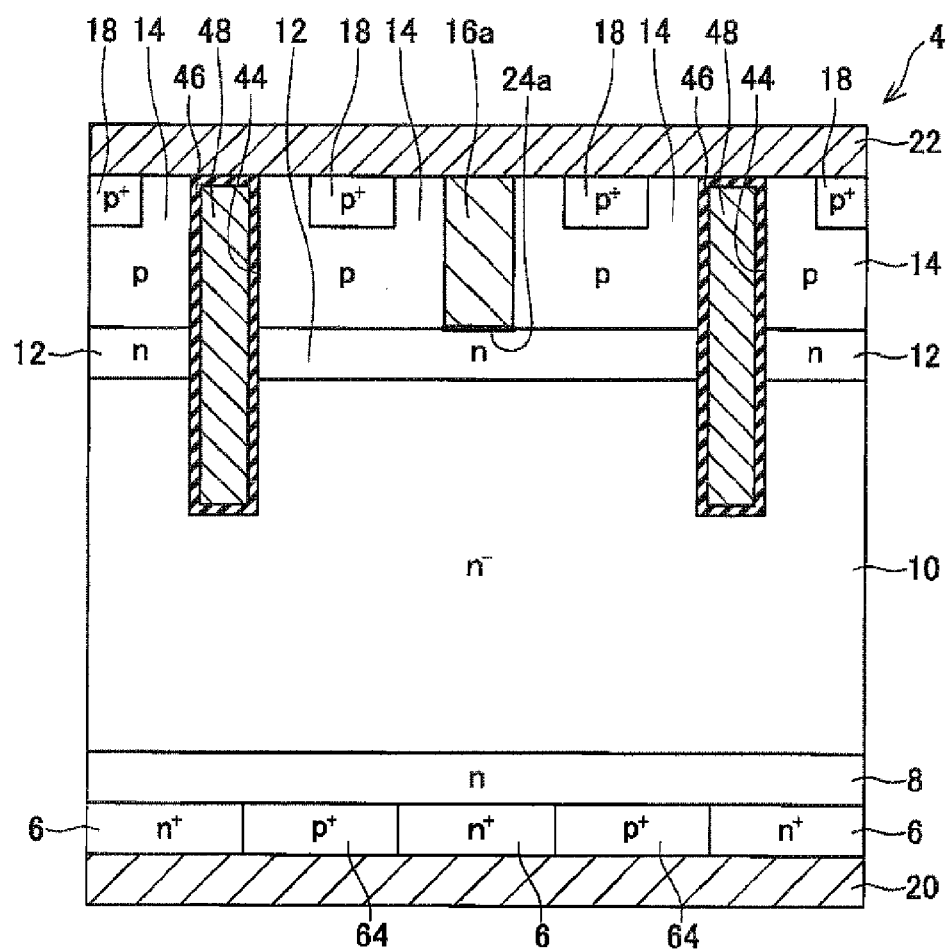
FIG. 32 is a diagram schematically illustrating a configuration of a diode 316 according to another Embodiment.

The diode 42 shown in FIG. 7, the diode 52 shown in FIG. 8, the diode 62 shown in FIG. 10, the diode 66 shown in FIG. 11, the diode 68 shown in FIG. 12, and the diode 70 shown in FIG. 13 may be respectively configured as a diode 306 shown in FIG. 27, a diode 308 shown in FIG. 28, a diode 310 shown in FIG. 29, a diode 312 shown in FIG. 30, a diode 314 shown in FIG. 31, and a diode 316 shown in FIG. 32, by replacing the n pillar regions 16 with the above-described pillar electrodes 16a.

Figure 33:
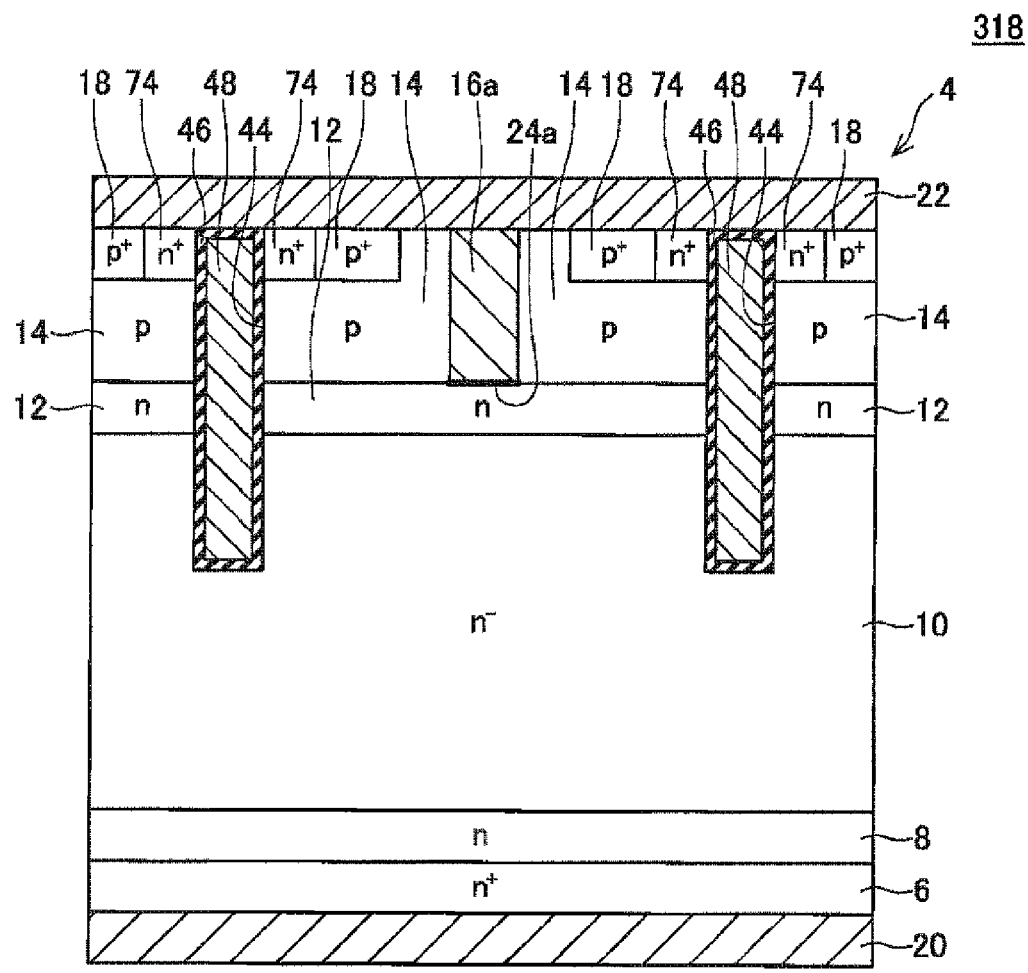
FIG. 33 is a diagram schematically illustrating a configuration of a semiconductor device 318 according to another Embodiment.
Figure 34:
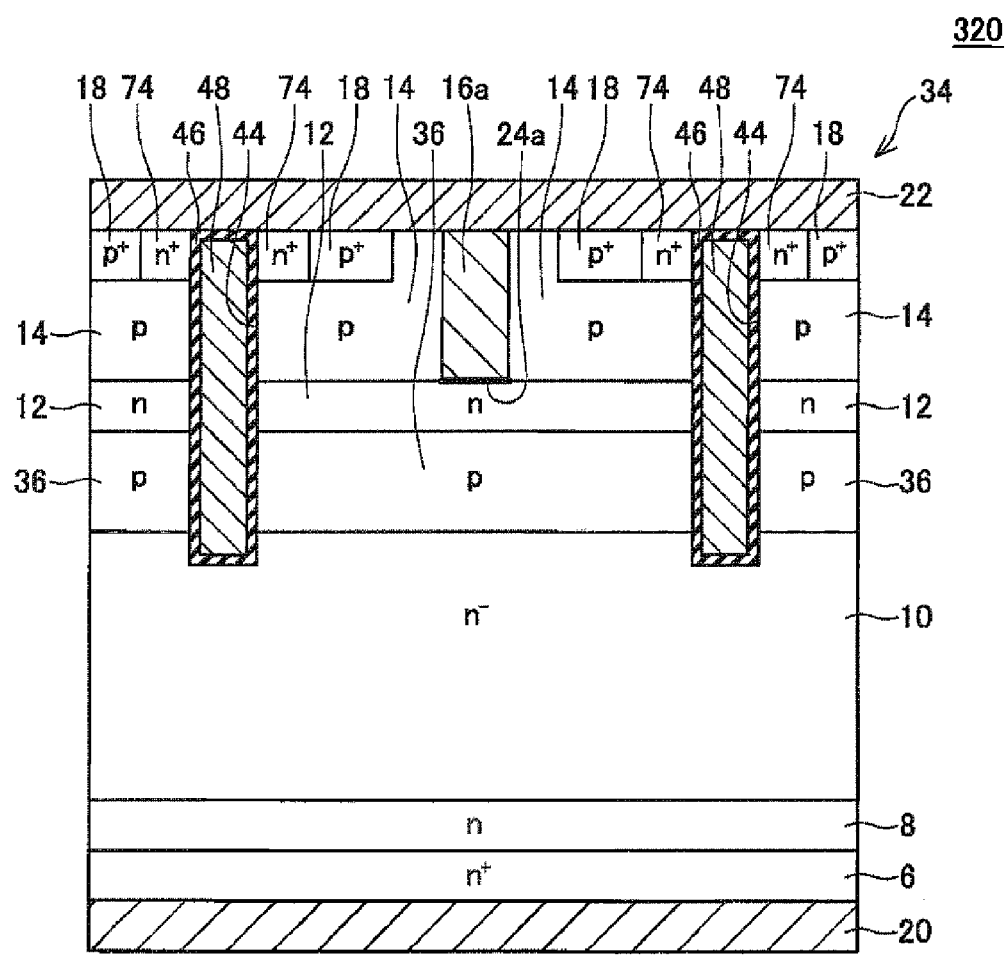
FIG. 34 is a diagram schematically illustrating a configuration of a semiconductor device 320 according to another Embodiment.

In addition, the semiconductor device 72 shown in FIG. 14 and the semiconductor device 82 shown in FIG. 15 may be respectively configured as in a semiconductor device 318 shown in FIG. 33 and a semiconductor device 320 shown in FIG. 34, by replacing the n pillar regions 16 with the pillar electrodes 16a.

Figure 35:
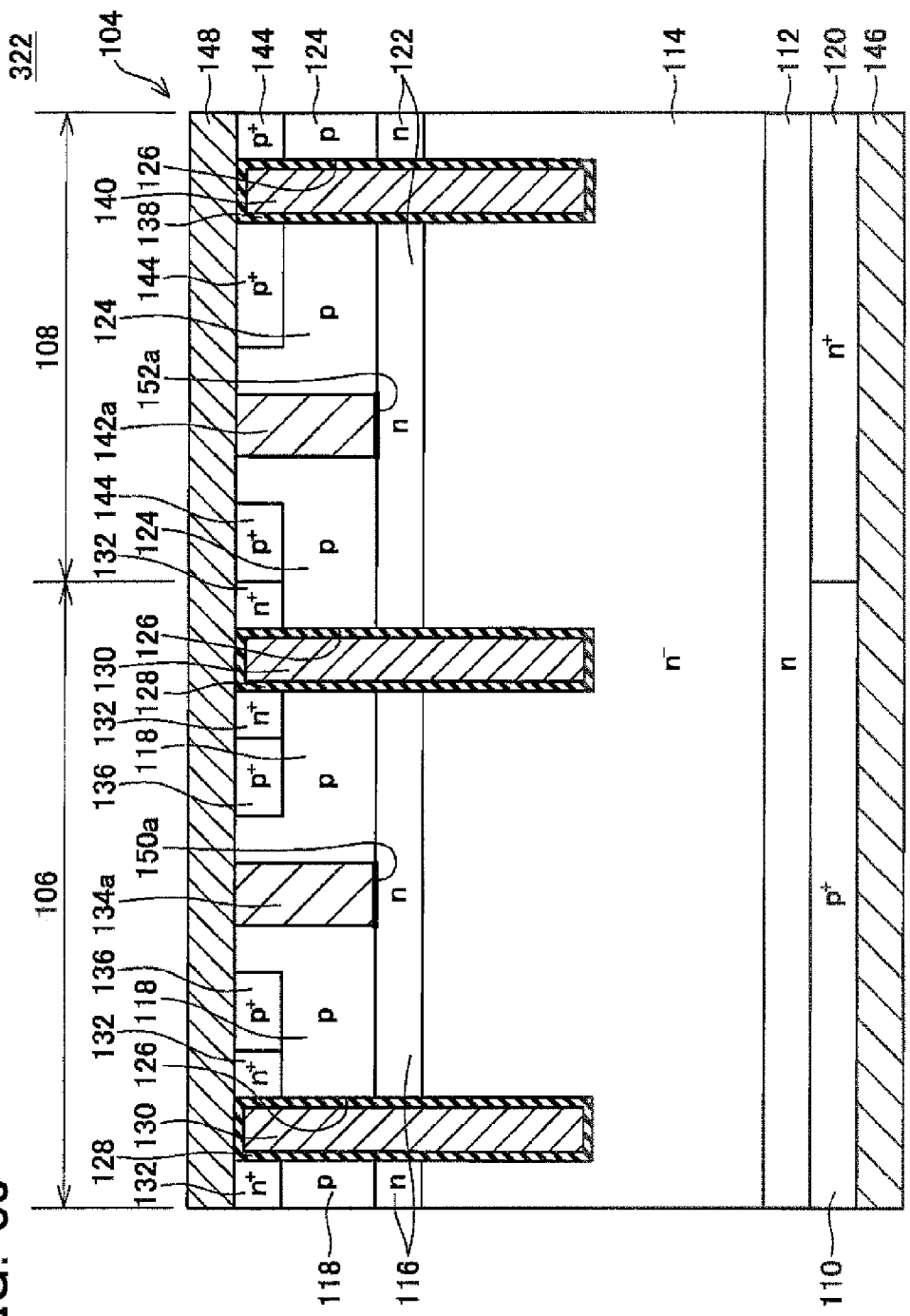
FIG. 35 is a diagram schematically illustrating a configuration of a semiconductor device 322 according to another Embodiment.
Figure 36:
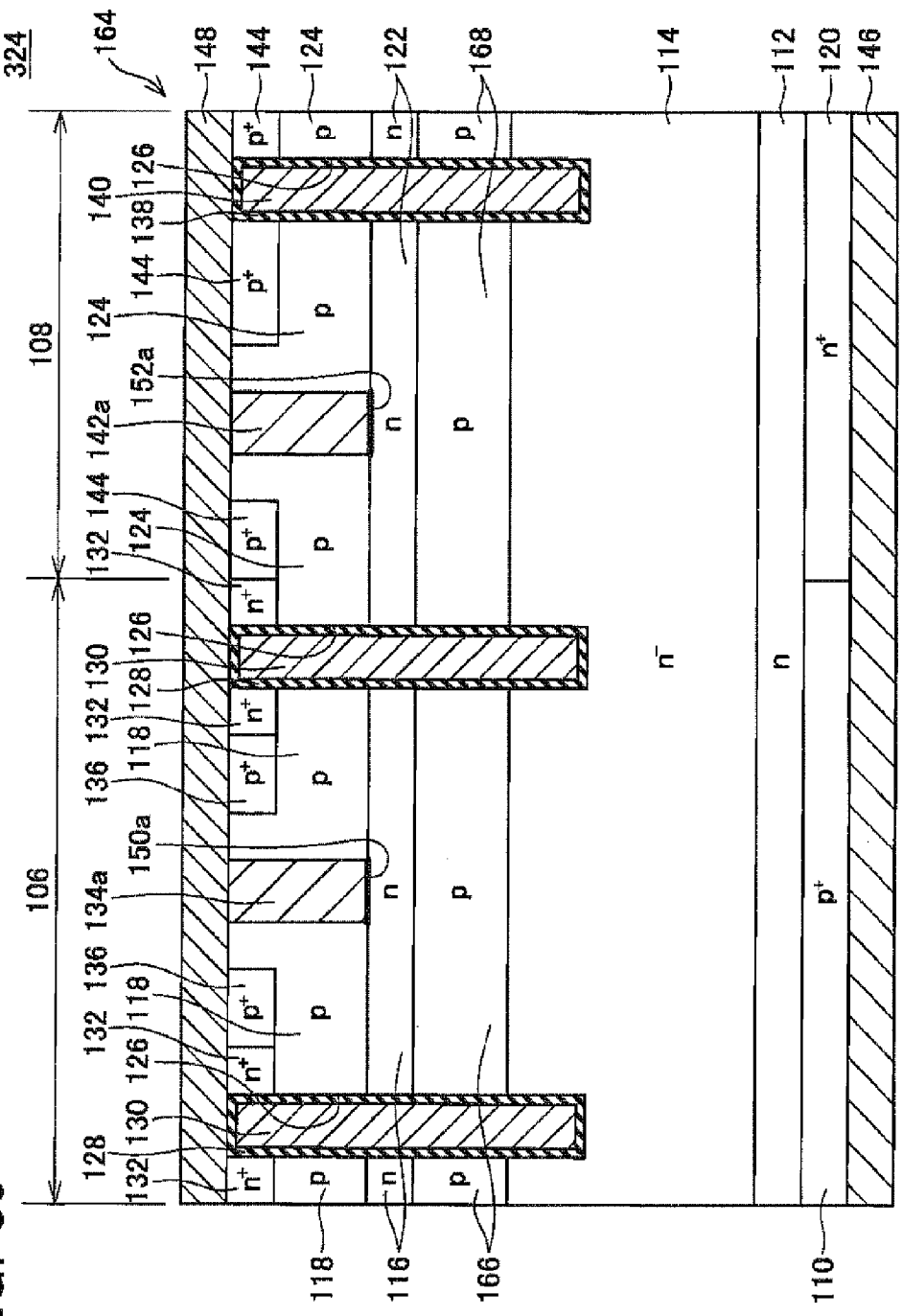
FIG. 36 is a diagram schematically illustrating a configuration of a semiconductor device 324 according to another Embodiment.
Figure 37:
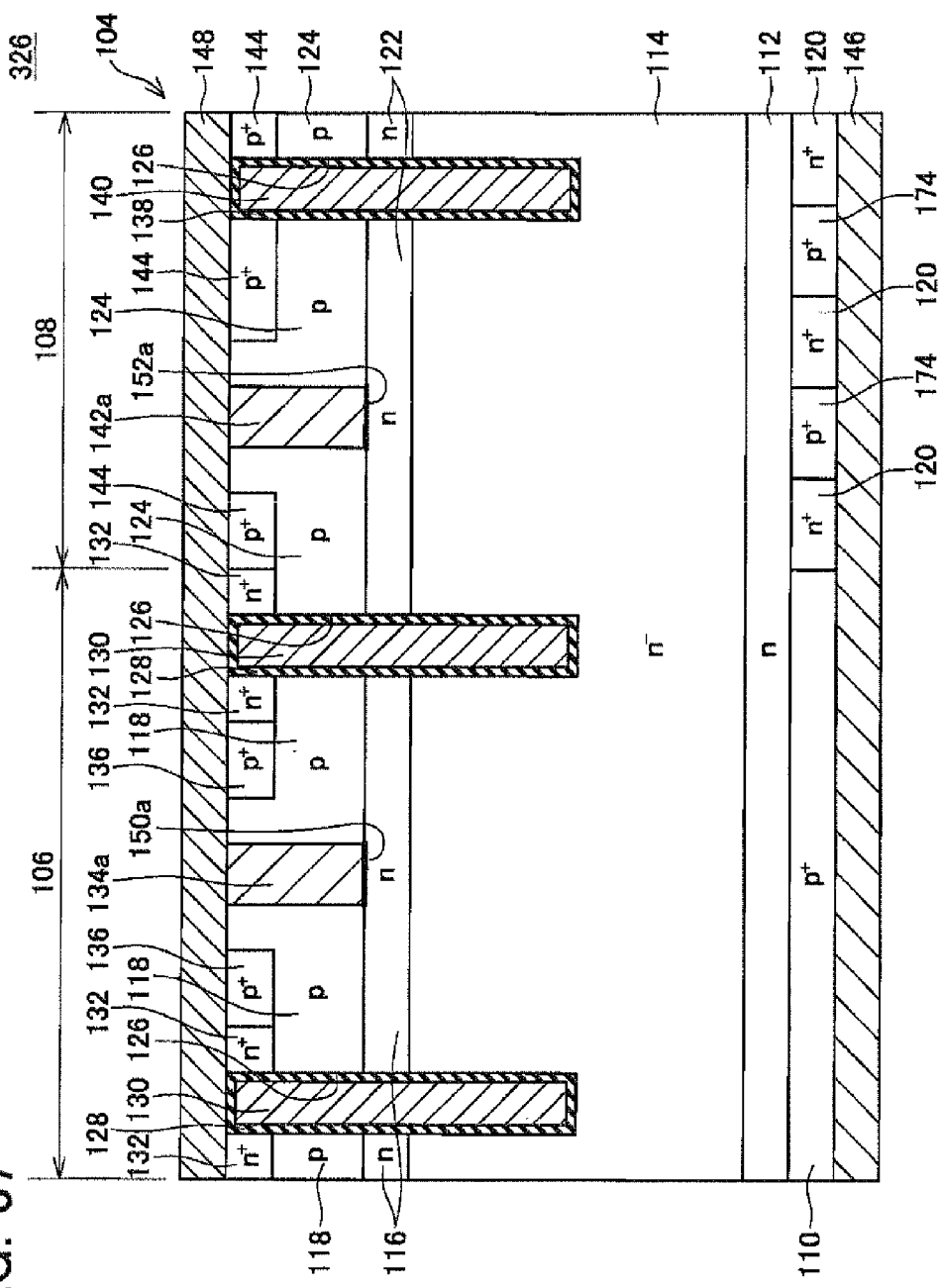
FIG. 37 is a diagram schematically illustrating a configuration of a semiconductor device 326 according to another Embodiment.
Figure 38:
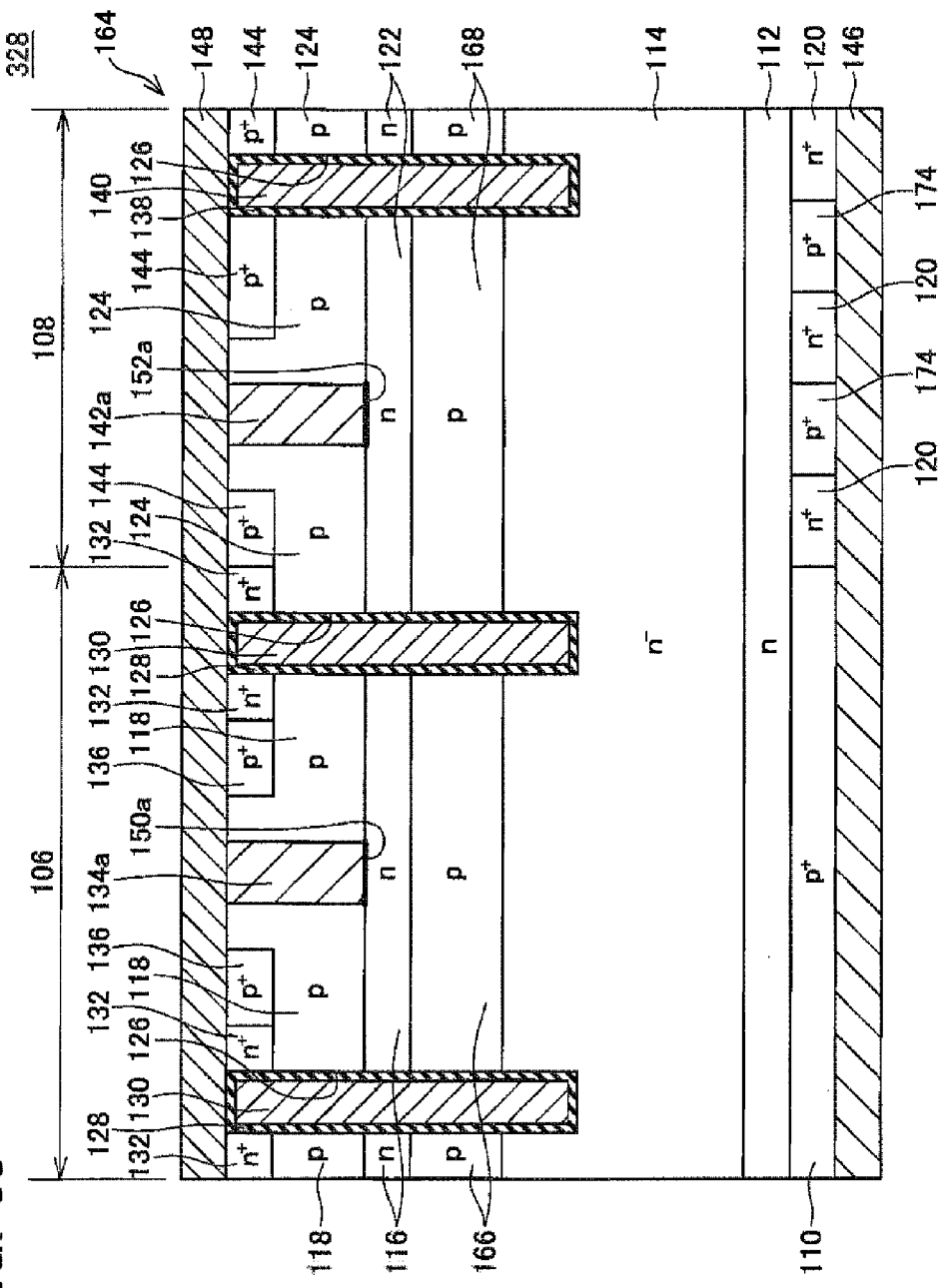
FIG. 38 is a diagram schematically illustrating a configuration of a semiconductor device 328 according to another Embodiment.
Figure 45:
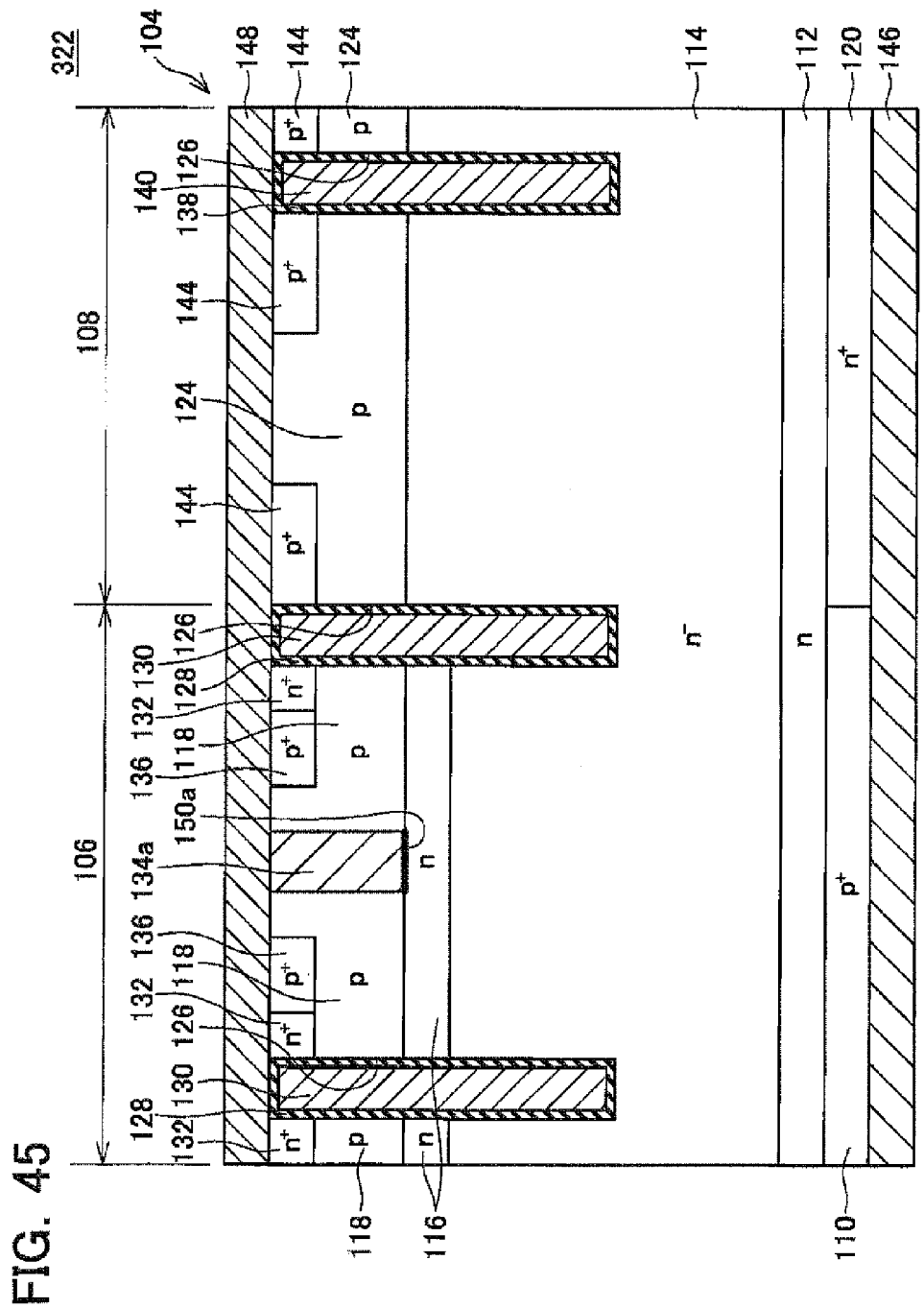
FIG. 45 is a diagram schematically illustrating another configuration of the semiconductor device 322 according to another Embodiment.
Figure 46:
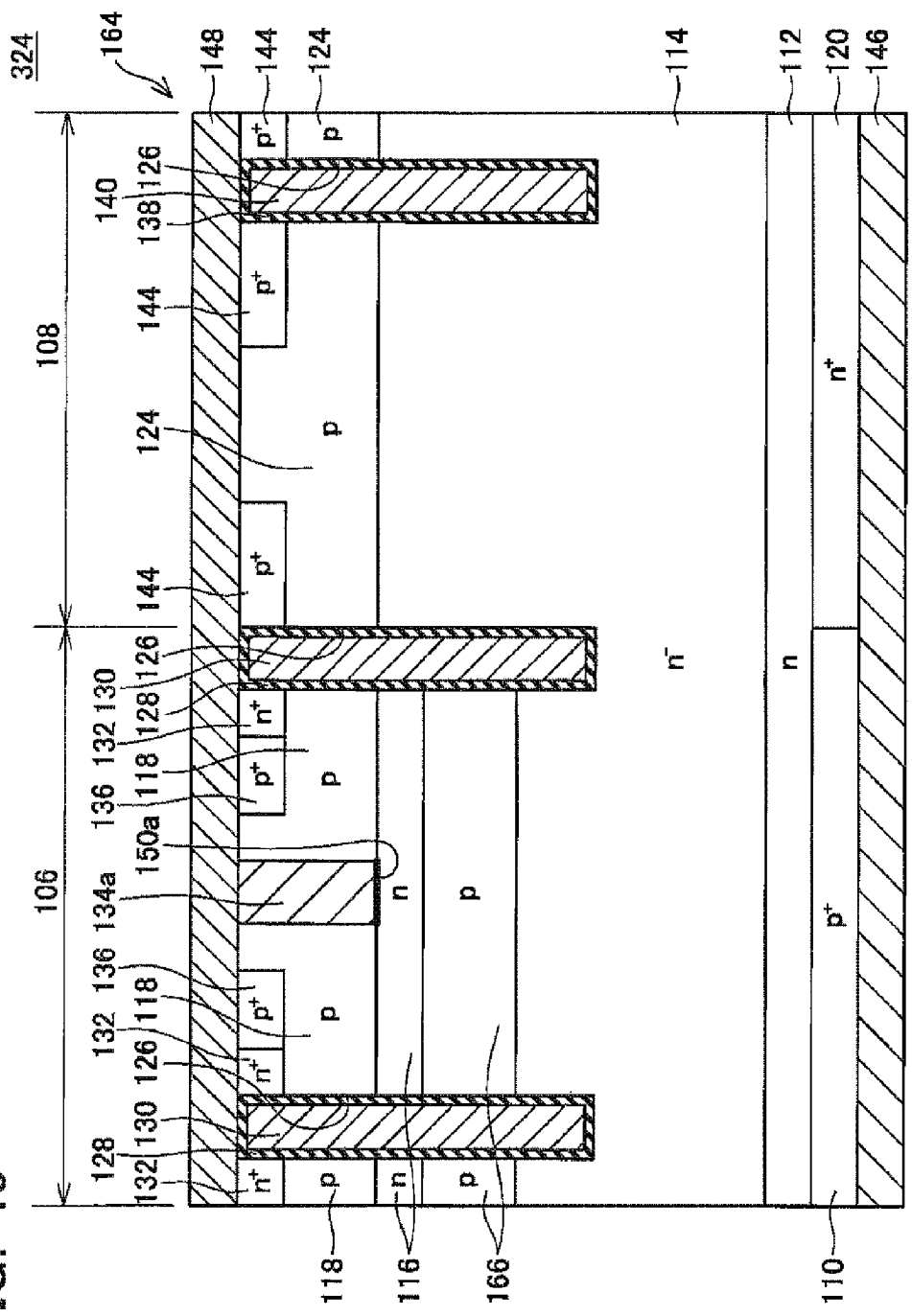
FIG. 46 is a diagram schematically illustrating another configuration of the semiconductor device 324 according to another Embodiment.

Further, the semiconductor device 102 shown in FIGS. 16 and 43, the semiconductor device 162 shown in FIGS. 17 and 44, the semiconductor device 172 shown in FIG. 19, and the semiconductor device 182 shown in FIG. 20 may be respectively configured as in a semiconductor device 322 shown in FIGS. 35 and 45, a semiconductor device 324 shown in FIGS. 36 and 46, a semiconductor device 326 shown in FIG. 37, and a semiconductor device 328 shown in FIG. 38, by replacing the n pillar region 134 and 142 with pillar electrodes 134a and 142a made of metal. The pillar electrodes 134a are electrically connected to the emitter/anode electrode 148, penetrate through the p body regions 118, and are connected to the n barrier regions 116 through Schottky junctions via Schottky interfaces 150a. The pillar electrodes 142a are electrically connected to the emitter/anode electrode 148, penetrate through the p anode regions 124, and are connected to the n barrier regions 122 through Schottky junctions via Schottky interfaces 152a.

Figure 39:
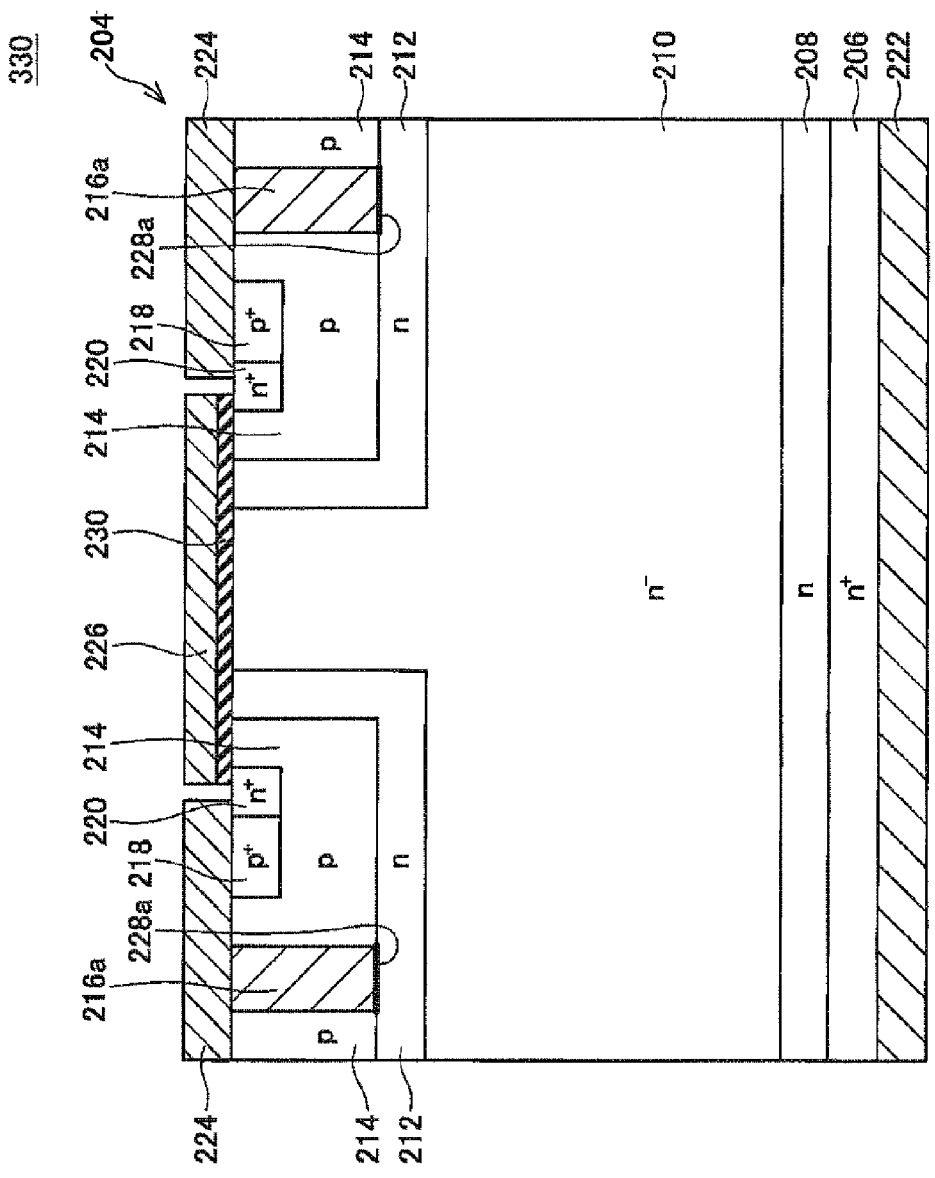
FIG. 39 is a diagram schematically illustrating a configuration of a semiconductor device 330 according to another Embodiment.
Figure 40:
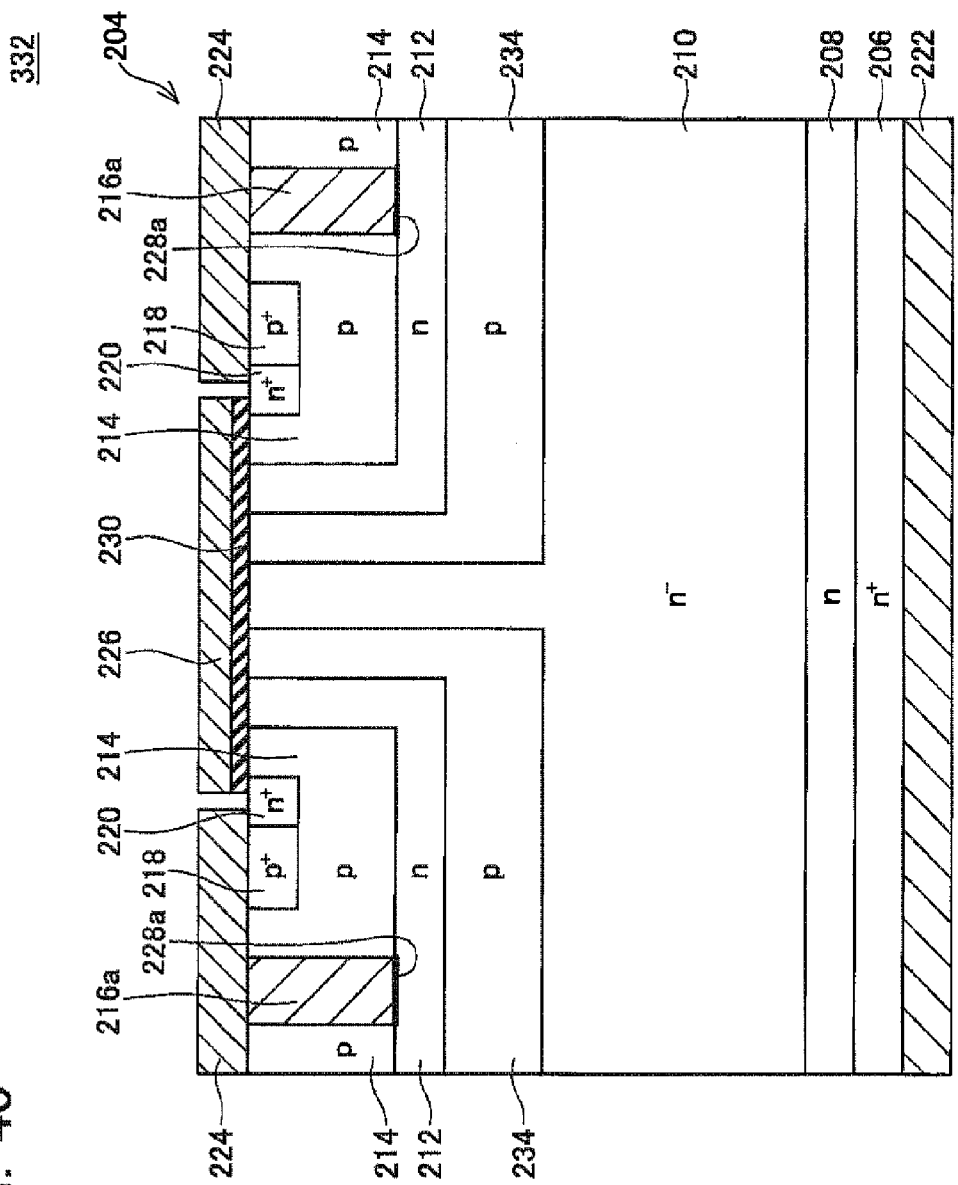
FIG. 40 is a diagram schematically illustrating a configuration of a semiconductor device 332 according to another Embodiment.
Figure 41:
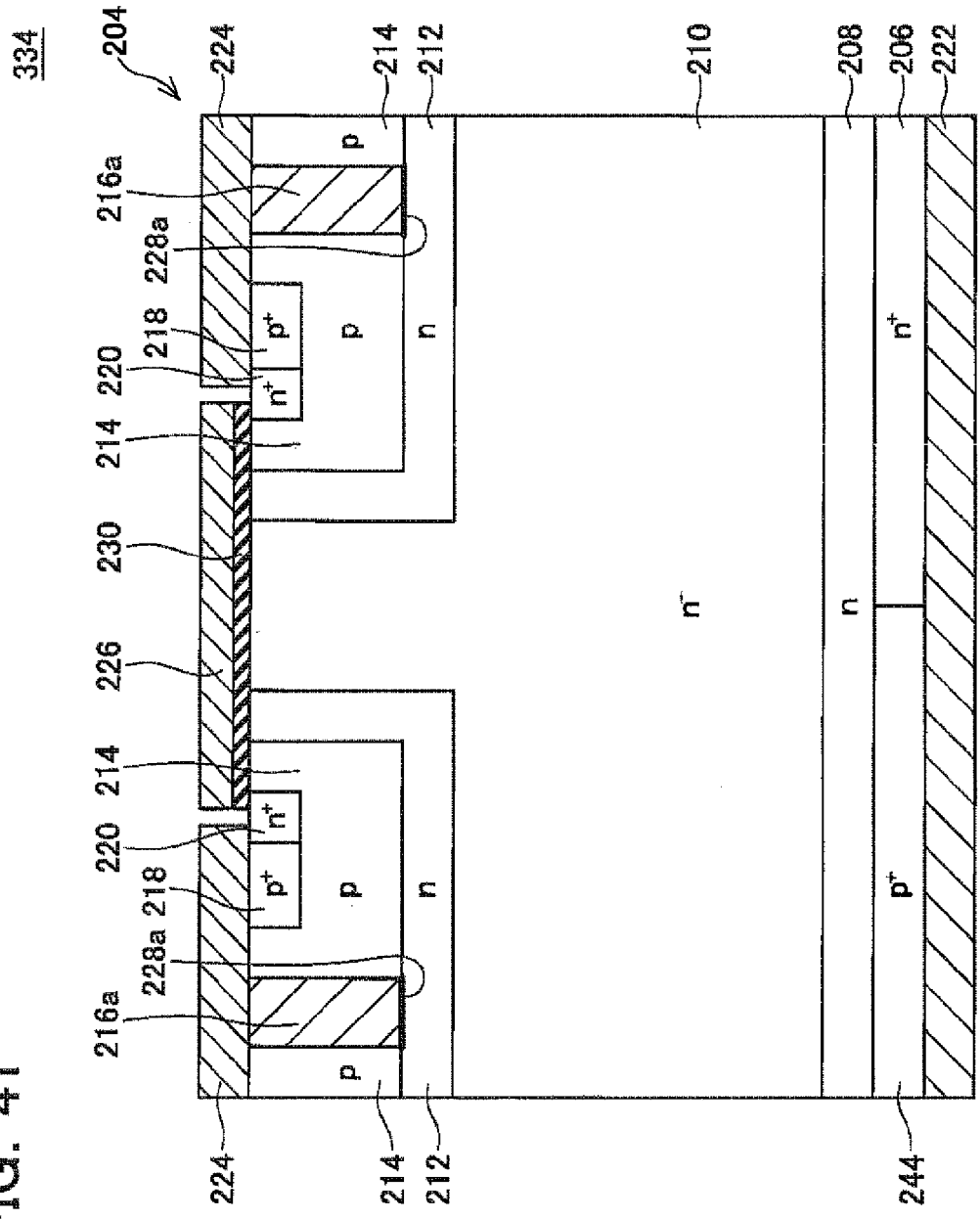
FIG. 41 is a diagram schematically illustrating a configuration of a semiconductor device 334 according to another Embodiment.
Figure 42:
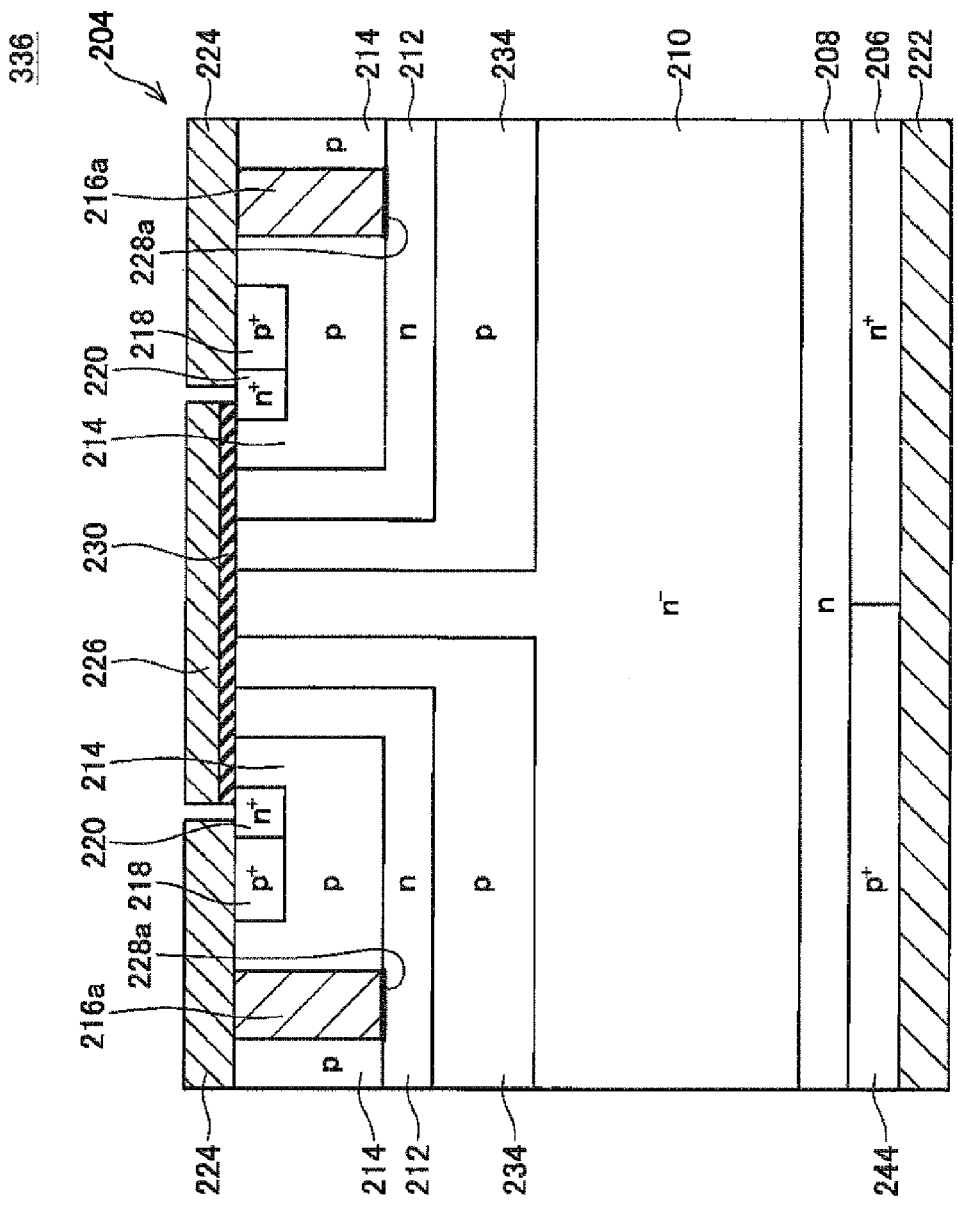
FIG. 42 is a diagram schematically illustrating a configuration of a semiconductor device 336 according to another Embodiment.

In addition, the semiconductor device 202 shown in FIG. 21, the semiconductor device 232 shown in FIG. 22, the semiconductor device 242 shown in FIG. 23, and the semiconductor device 252 shown in FIG. 24 may be respectively configured as in a semiconductor device 330 shown in FIG. 39, a semiconductor device 332 shown in FIG. 40, a semiconductor device 334 shown in FIG. 41, and a semiconductor device 336 shown in FIG. 42, by replacing the n pillar regions 216 with pillar electrodes 216a made of metal. Here, the pillar electrodes 216a are electrically connected to the anode electrodes 224, penetrate through the p anode regions 214, and are connected to the n barrier regions 212 through Schottky junctions via Schottky interfaces 228a.

As above, although Embodiments of the present invention have been described in detail, they are only an example and do not limit the scope of the claims. The techniques recited in the claims include various modifications and changes of the above-described detailed examples.

For example, although, in the above Embodiments, the case of using silicon as a semiconductor material has been described, the present invention may be also applied to cases of using semiconductor materials such as silicon carbide, gallium nitride, and gallium arsenide.

The technical elements described in the specification or the drawings show technical usefulness singly or through a variety of combinations and thus are not limited to the combinations recited in the claims at the time of filing the present application. In addition, the techniques exemplified in the present specification or the drawings can achieve a plurality of objects at a time, and have technical usefulness as long as any one of the objects is achieved.

The invention claimed is:

1. A diode comprising:
   a cathode electrode;
   a cathode region made of first conductivity type semiconductor;
   a drift region made of first conductivity type semiconductor having a concentration lower than that of the cathode region;
   an anode region made of second conductivity type semiconductor;
   an anode electrode made of metal;
   a barrier region formed between the drift region and the anode region and made of first conductivity type semiconductor having a concentration higher than that of the drift region; and
   a pillar region made of first conductivity type semiconductor having a concentration higher than that of the barrier region, the pillar region being formed so as to penetrate through the anode region from an anode electrode side, reach the barrier region, and directly connected the barrier region to the anode electrode,
   wherein the pillar region and the anode electrode are connected through a Schottky junction.

2. The diode according to claim 1, further comprising an electric field progress preventing region formed between the barrier region and the drift region and made of second conductivity type semiconductor.

3. The diode according to claim 1, wherein a trench extending from the anode region to the drift region is formed, and
   a trench electrode which is coated with an insulating film is formed inside the trench.

4. The diode according to claim 1, further comprising a cathode short-circuit region partially formed in the cathode region and made of second conductivity type semiconductor.

5. A semiconductor device comprising the diode according to claim 1 and an IGBT that are integrally formed, the IGBT including:
   a collector electrode;
   a collector region made of second conductivity type semiconductor;
   a second drift region continuously formed from the drift region and made of first conductivity type semiconductor having a concentration lower than that of the cathode region;
   a body region made of second conductivity type semiconductor;
   an emitter region made of first conductivity type semiconductor;
   an emitter electrode made of metal;
   a gate electrode opposite to the body region between the emitter region and the second drift region via an insulating film;
   a second barrier region formed between the second drift region and the body region and made of first conductivity type semiconductor having a concentration higher than that of the second drift region; and
   a second pillar region formed so as to connect the second barrier region to the emitter electrode and made of first conductivity type semiconductor having a concentration higher than that of the second barrier region,
   wherein the second pillar region and the emitter electrode are connected through a Schottky junction.

6. The semiconductor device according to claim 5, further comprising a second electric field progress preventing region formed between the second barrier region and the second drift region and made of second conductivity type semiconductor.

* * * * *